United States Patent [19]
Tanzawa et al.

[11] Patent Number: 5,969,557
[45] Date of Patent: Oct. 19, 1999

[54] DELAY CIRCUIT, OSCILLATION CIRCUIT AND SEMICONDUCTOR MEMORY DEVICE

[75] Inventors: Toru Tanzawa, Ebina; Tomoharu Tanaka; Toshio Yamamura, both of Yokohama; Koji Sakui, Tokyo, all of Japan

[73] Assignee: Kabushiki Kaisha Toshiba, Kawasaki, Japan

[21] Appl. No.: 08/845,836

[22] Filed: Apr. 28, 1997

Related U.S. Application Data

[62] Division of application No. 08/494,010, Jun. 23, 1995, Pat. No. 5,627,488.

[30] Foreign Application Priority Data

| Jun. 23, 1994 | [JP] | Japan | 6-141598 |
| Aug. 19, 1994 | [JP] | Japan | 6-195827 |
| Aug. 22, 1994 | [JP] | Japan | 6-219496 |
| Jan. 5, 1995 | [JP] | Japan | 7-000297 |

[51] Int. Cl.⁶ .................................................. H03B 5/00
[52] U.S. Cl. .......................... 327/291; 327/262; 327/131; 327/74; 331/57
[58] Field of Search .................................... 327/261, 263, 327/262, 266, 274, 280, 287, 269–270, 271, 272, 276–278, 281, 74–79, 291, 87, 89, 101, 182, 131; 331/17, 57, 25

[56] References Cited

U.S. PATENT DOCUMENTS

| 4,404,481 | 9/1983 | Ide et al. ................................. 307/491 |
| 4,746,823 | 5/1988 | Lee . | |
| 5,428,568 | 6/1995 | Kobayashi et al. ................. 365/185.24 |
| 5,469,100 | 11/1995 | Wuidart et al. . | |
| 5,502,419 | 3/1996 | Kawasaki et al. ........................ 327/74 |
| 5,650,739 | 7/1997 | Hui et al. ................................ 327/262 |

FOREIGN PATENT DOCUMENTS

| 3-23709 | 1/1991 | Japan . |
| 4-54974 | 9/1992 | Japan . |
| 5-325578 | 12/1993 | Japan . |

*Primary Examiner*—Timothy P. Callahan
*Assistant Examiner*—Eunja Shin
*Attorney, Agent, or Firm*—Oblon, Spivak, McClelland, Maier & Neustadt, P.C.

[57] ABSTRACT

A delay circuit having standby state and active state and designed to output at least one signal obtained by delaying an input signal. The delay circuit comprises a storage circuit and at least one amplifier circuit. In operation, the storage circuit receives an input signal, generates a first voltage when the input signal is inverted, and generates a second voltage from a difference between the first voltage and a first supply voltage. The amplifier circuit amplifies the difference between the first voltage and the second voltage. The storage circuit includes at lease one constant-voltage generating section for generating the first voltage when the input signal is inverted, at least one constant-current generating section for generating a current proportional to the difference between the first voltage and the first supply voltage, and at least one capacitor having a first terminal set at the first supply voltage or a second supply voltage, and a second terminal charged to the first supply voltage while the delay circuit remains in the standby state and charged or discharged to the second voltage with the current generated by the constant-current generating section while the delay circuit remains in the active state.

42 Claims, 42 Drawing Sheets

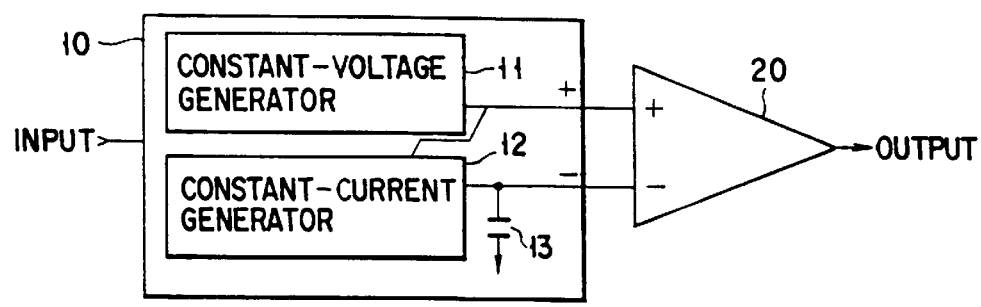
F I G. 7
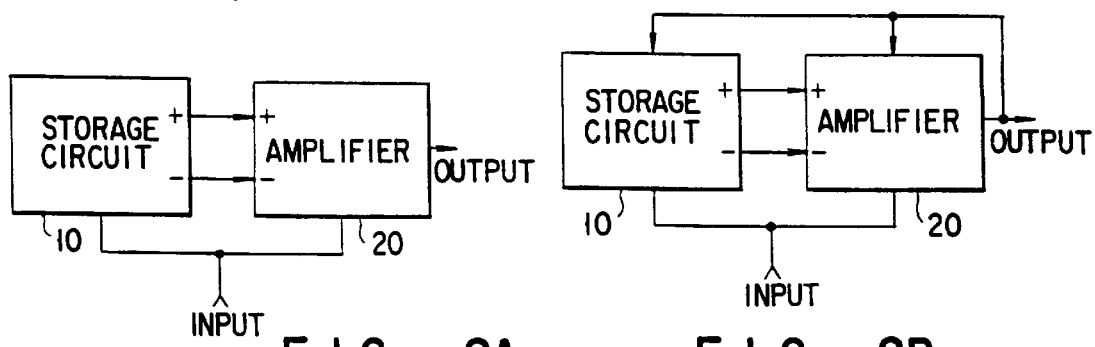
F I G. 8A    F I G. 8B

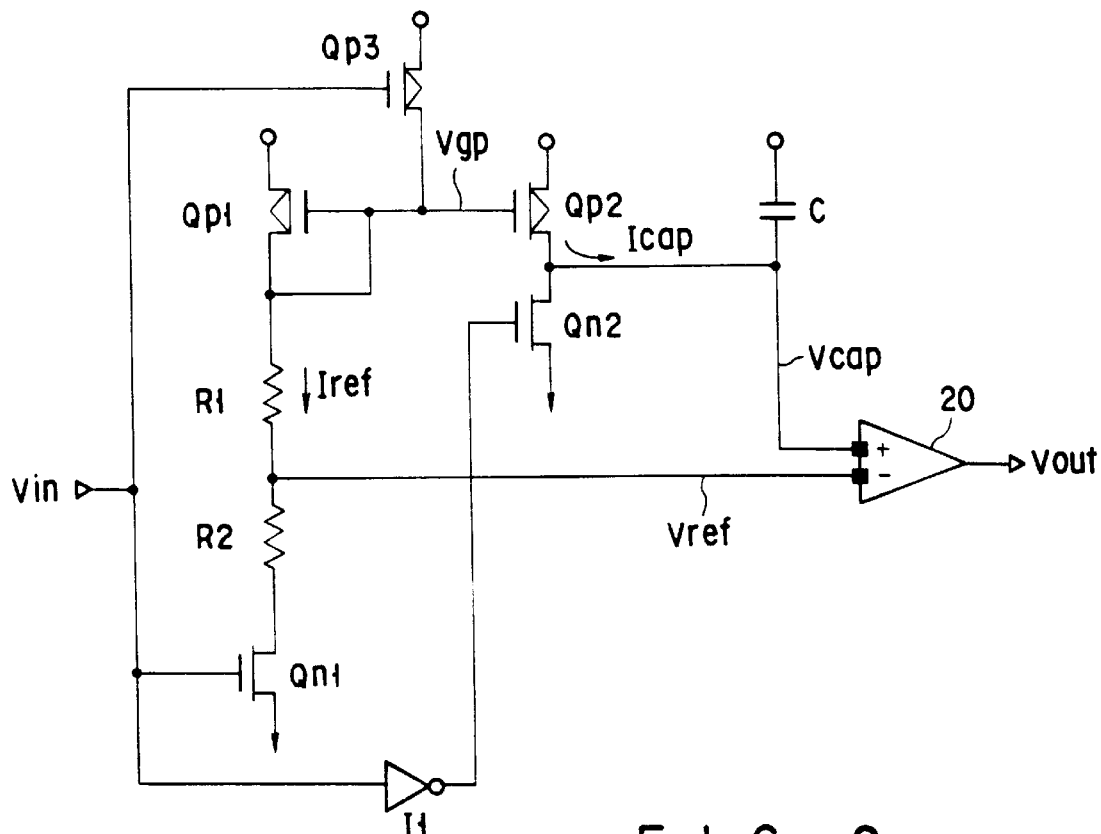
F I G. 9
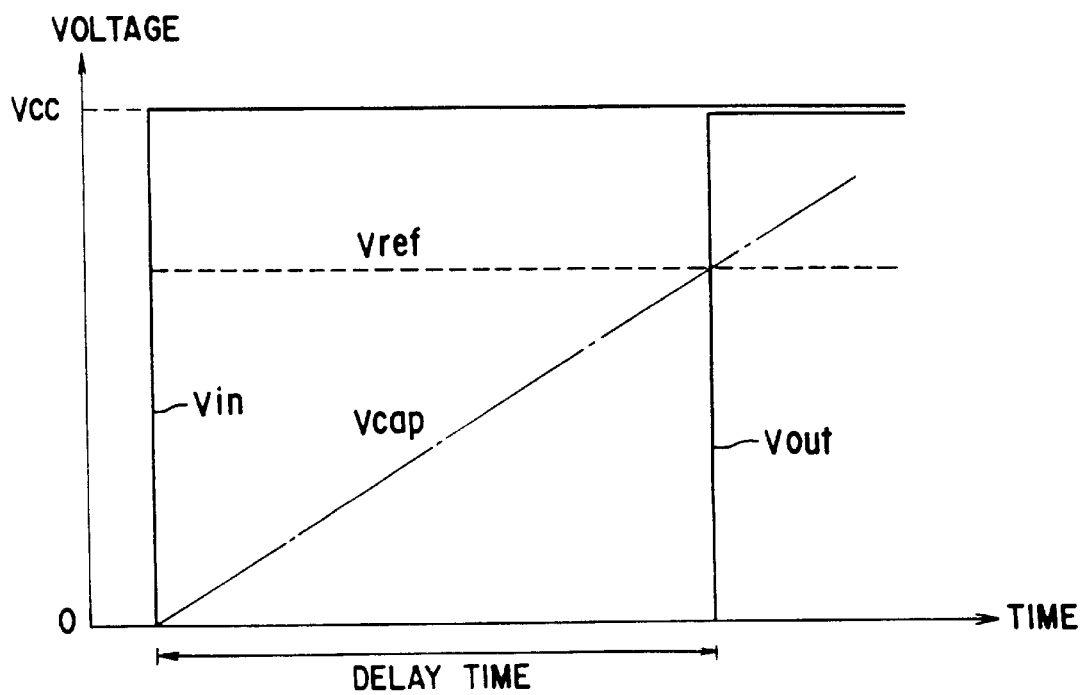
F I G. 10

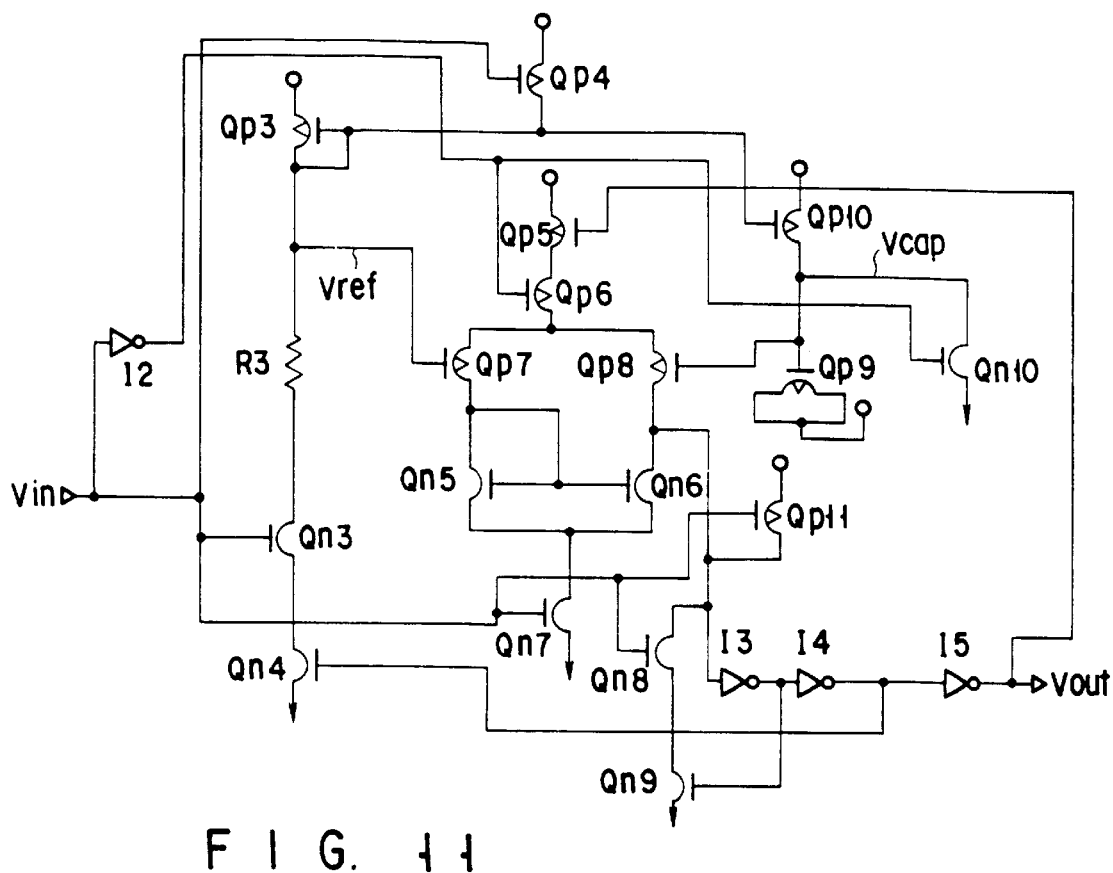
F I G. 11
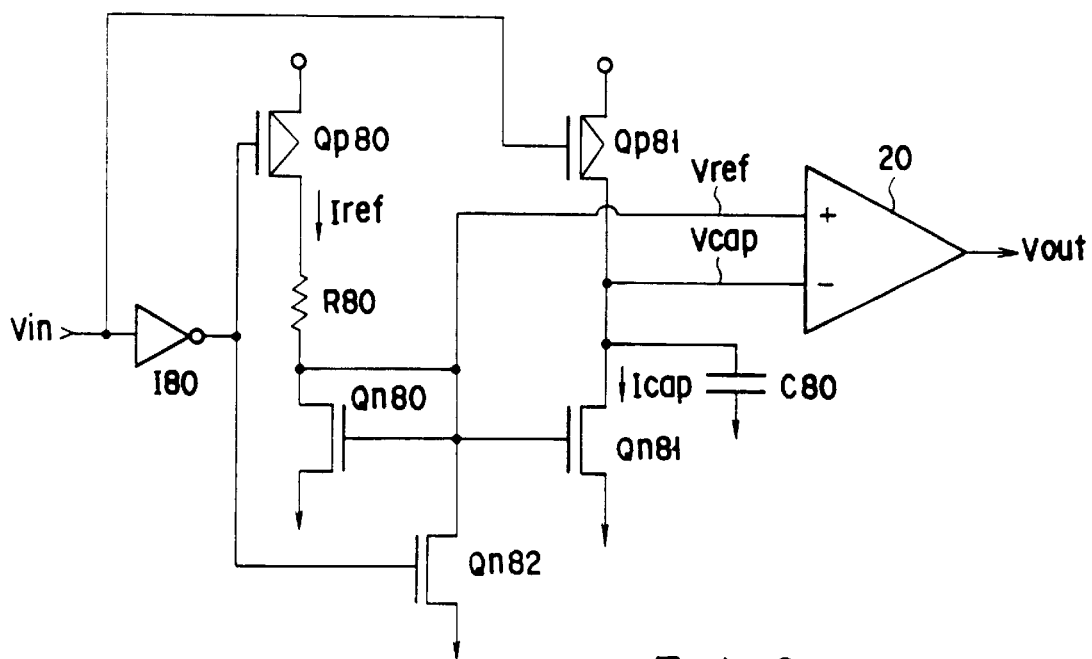
F I G. 12

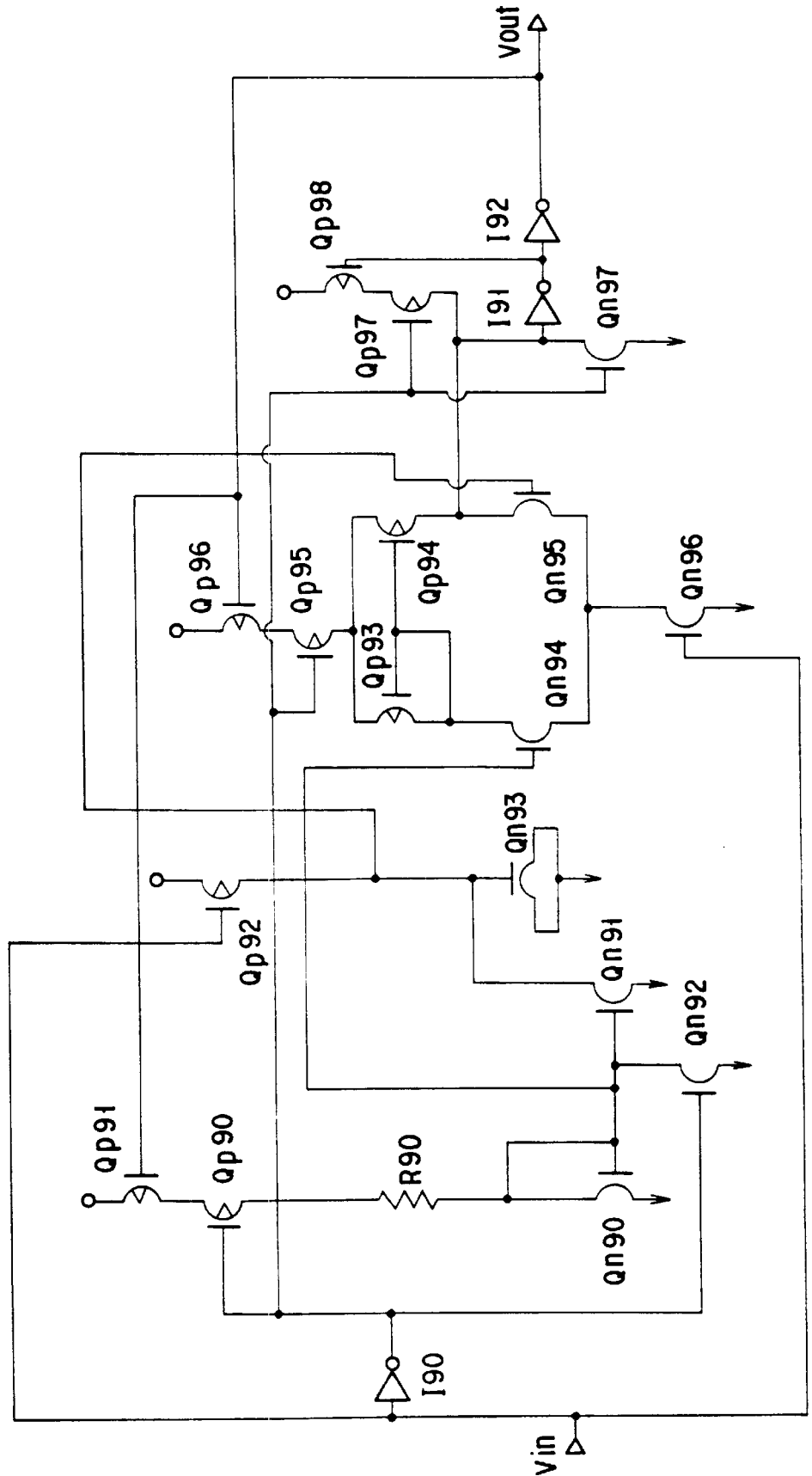
F I G. 14

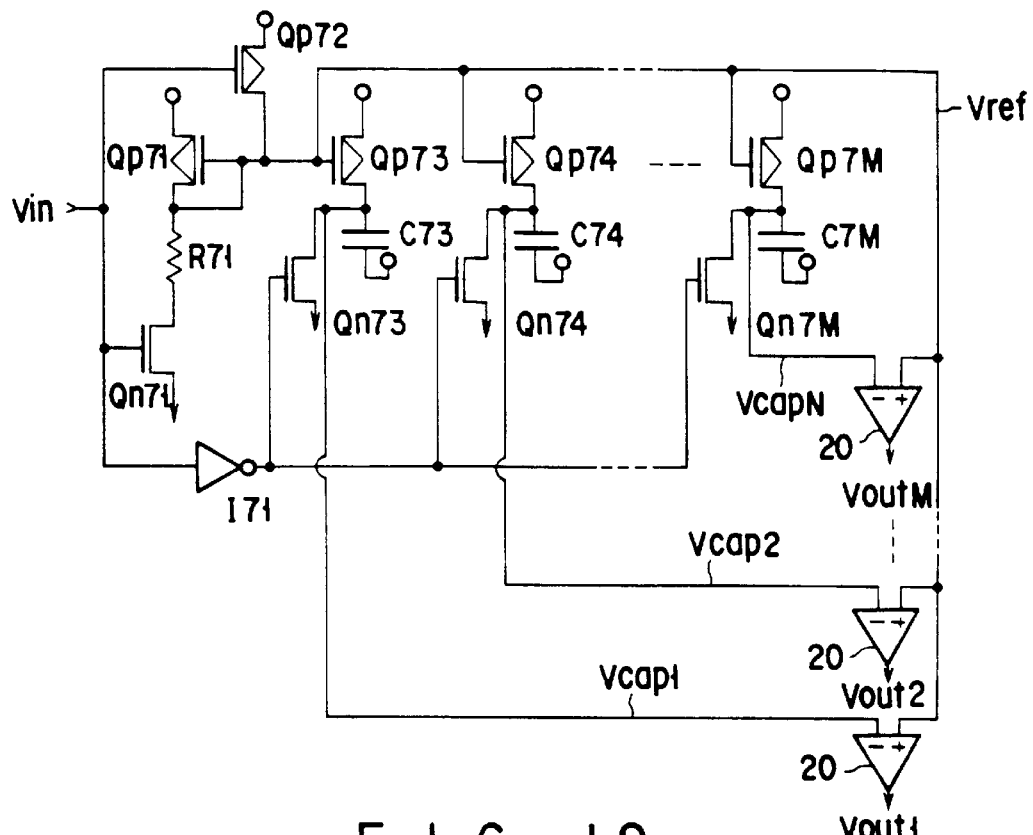
F I G. 19
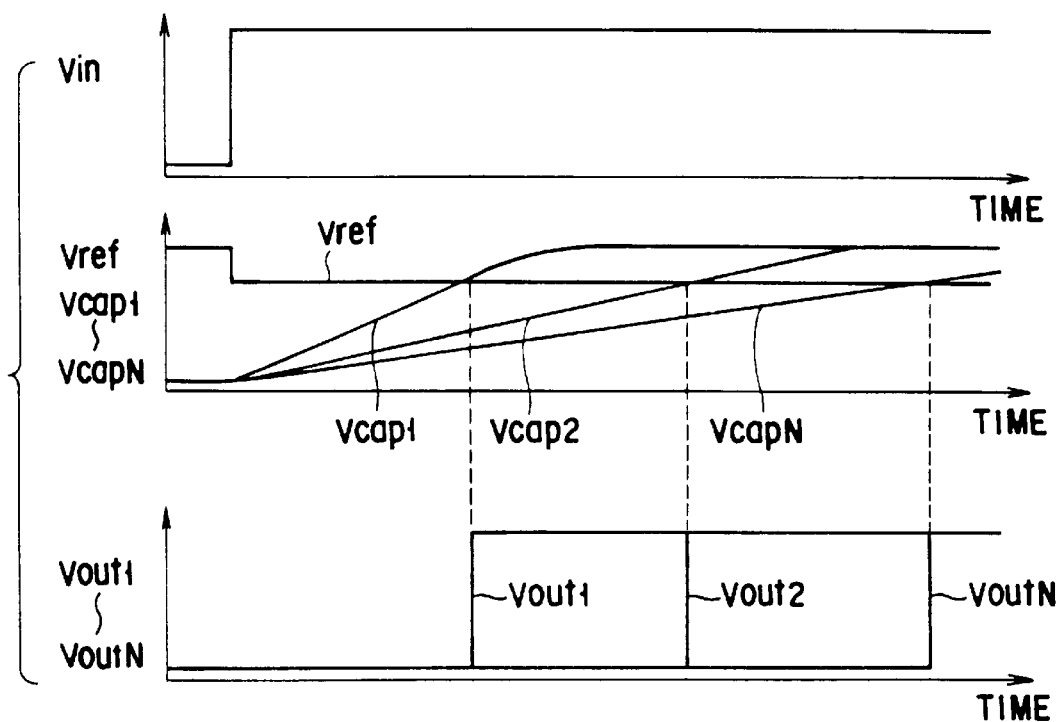
F I G. 20

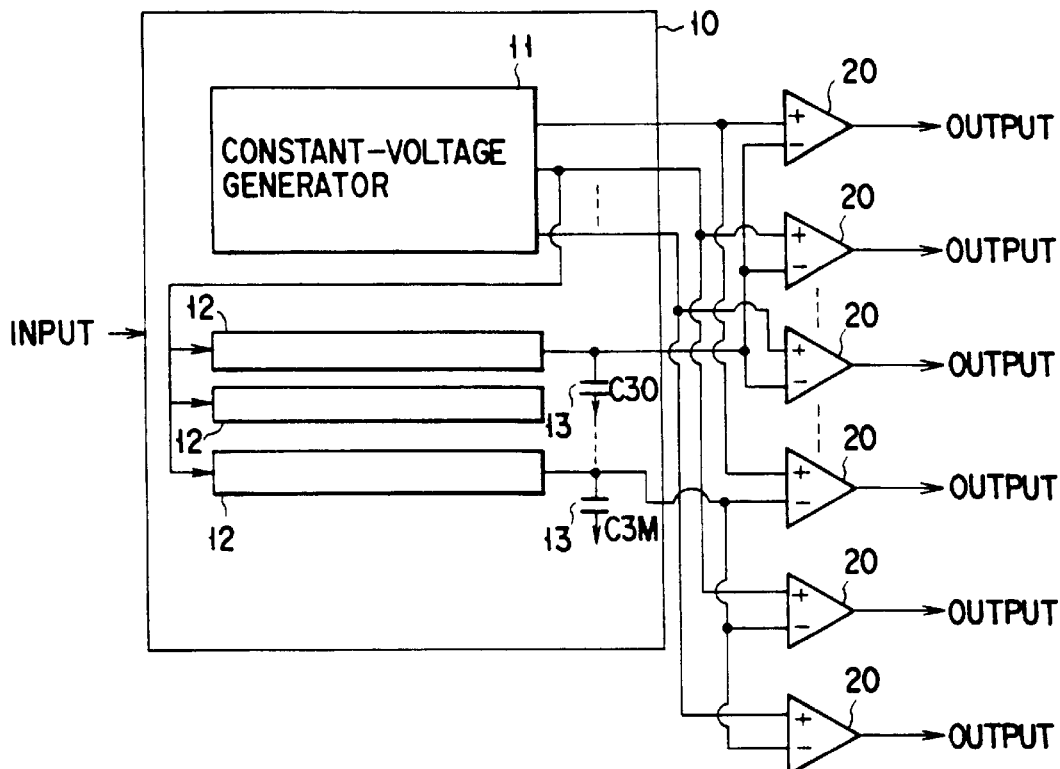
F I G. 21
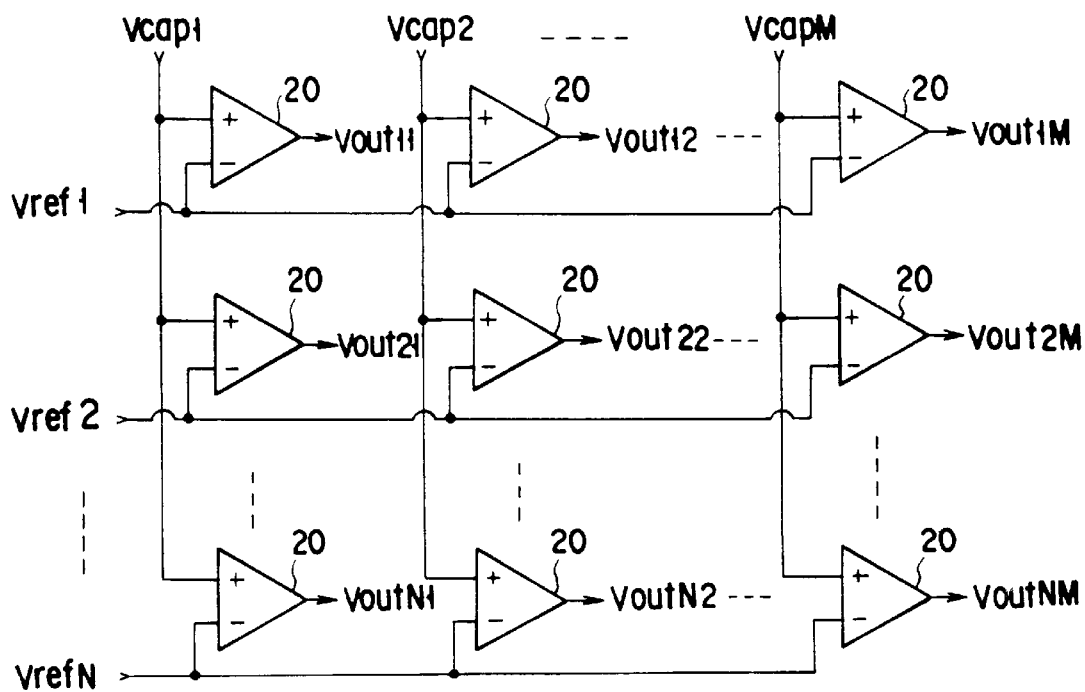
F I G. 23

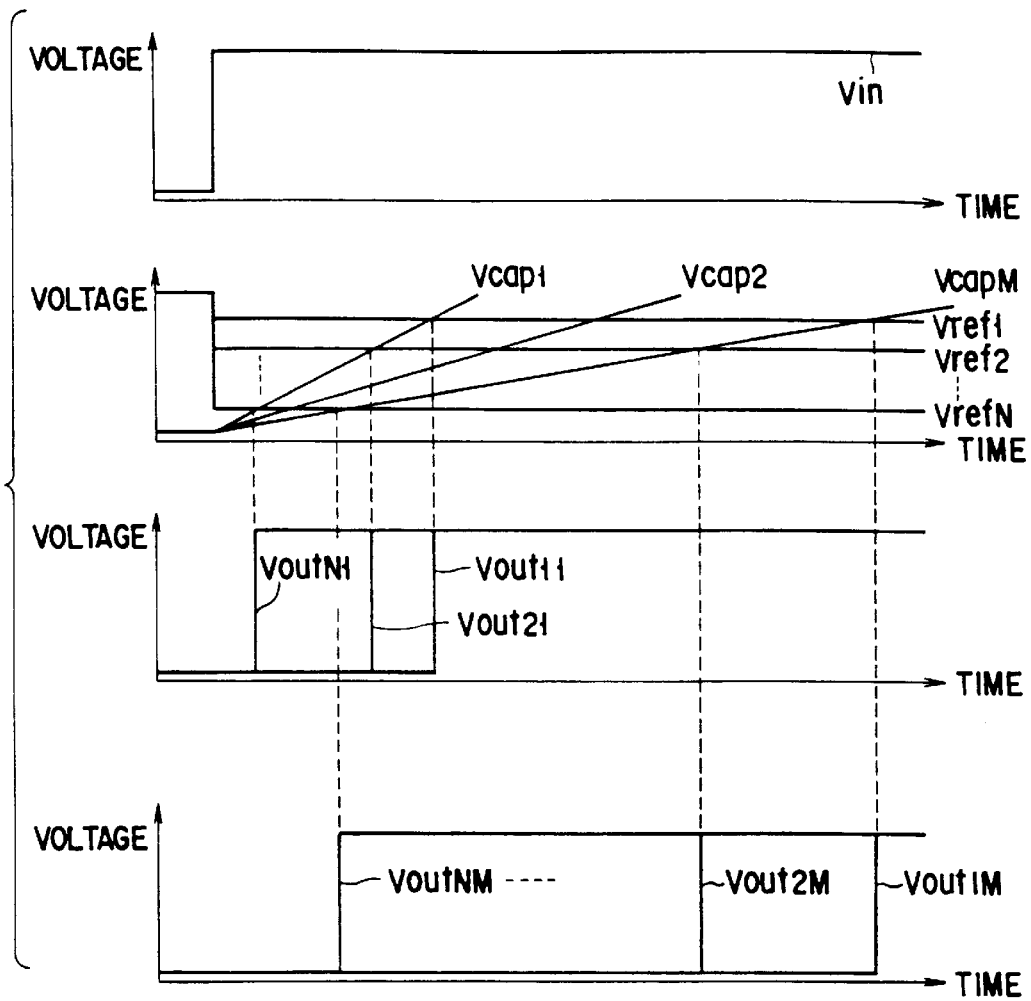
F I G. 24
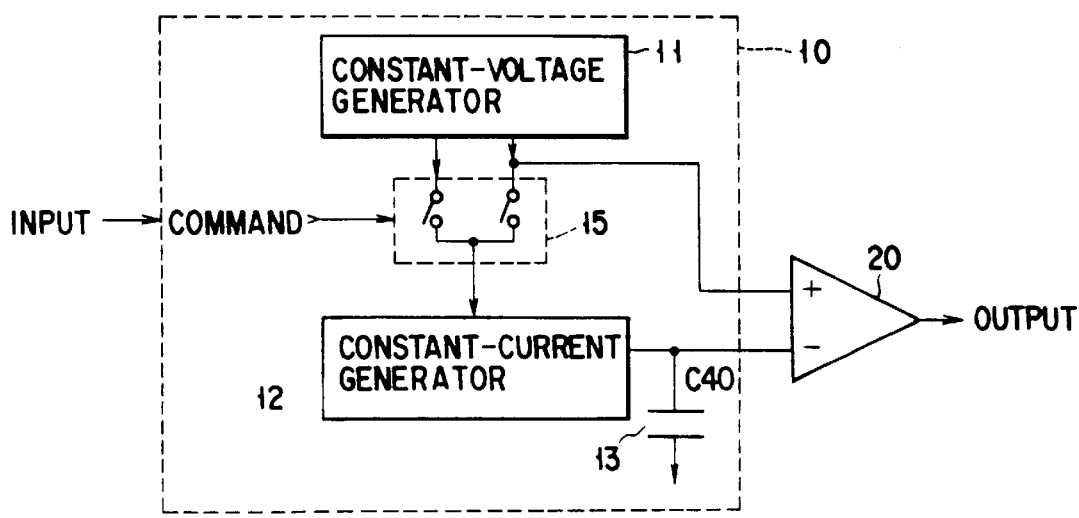
F I G. 25

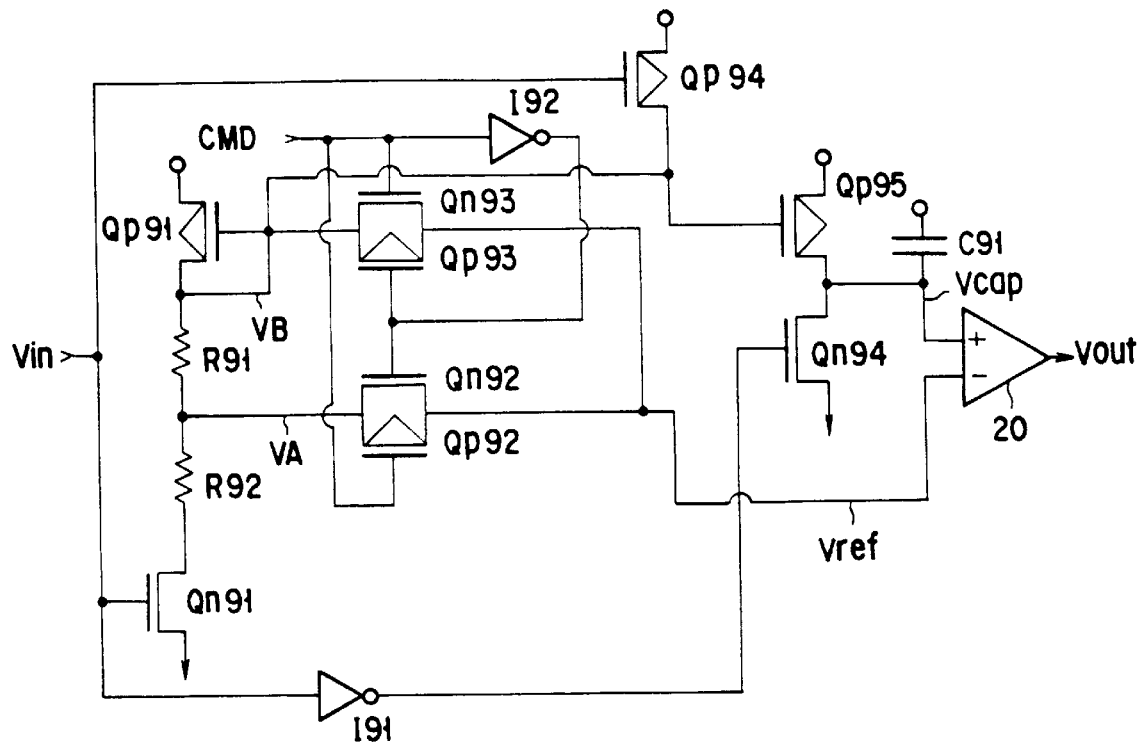
F I G. 26
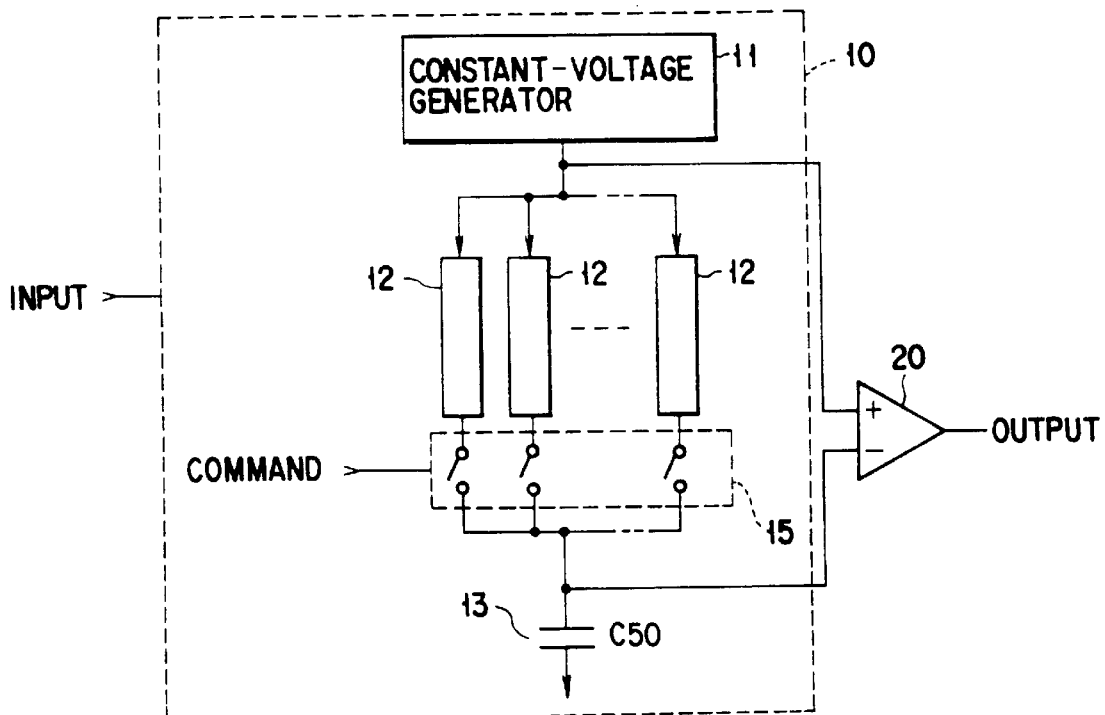
F I G. 28

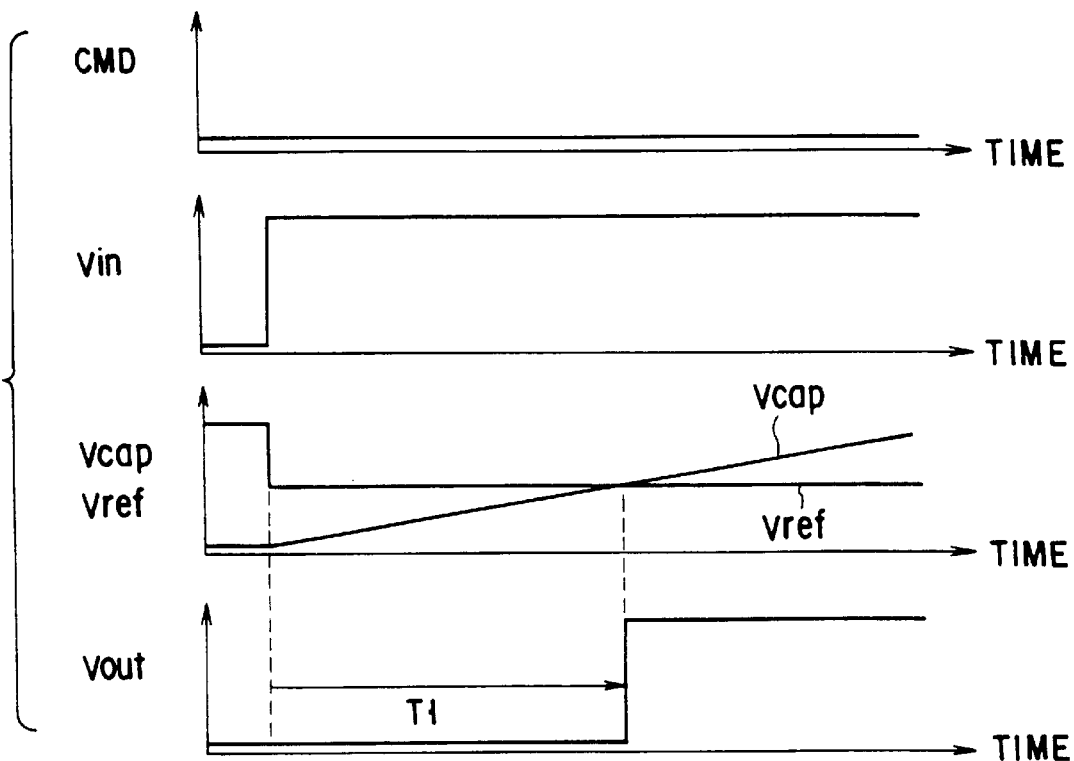
F I G. 27A
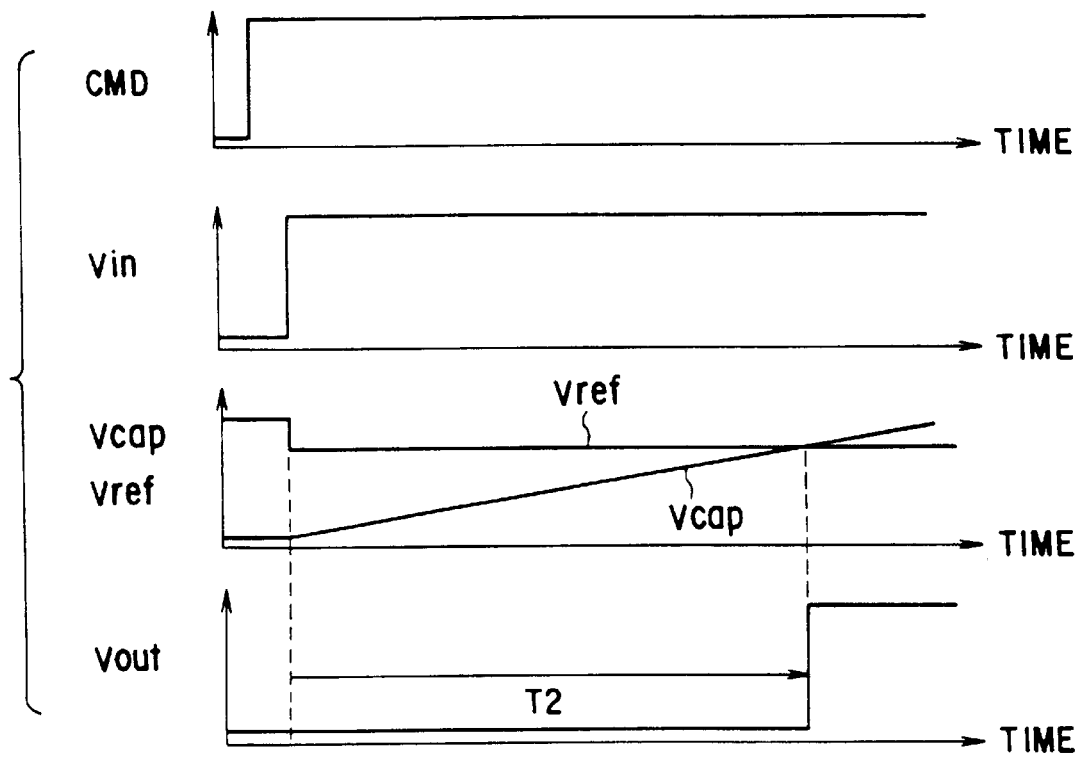
F I G. 27B

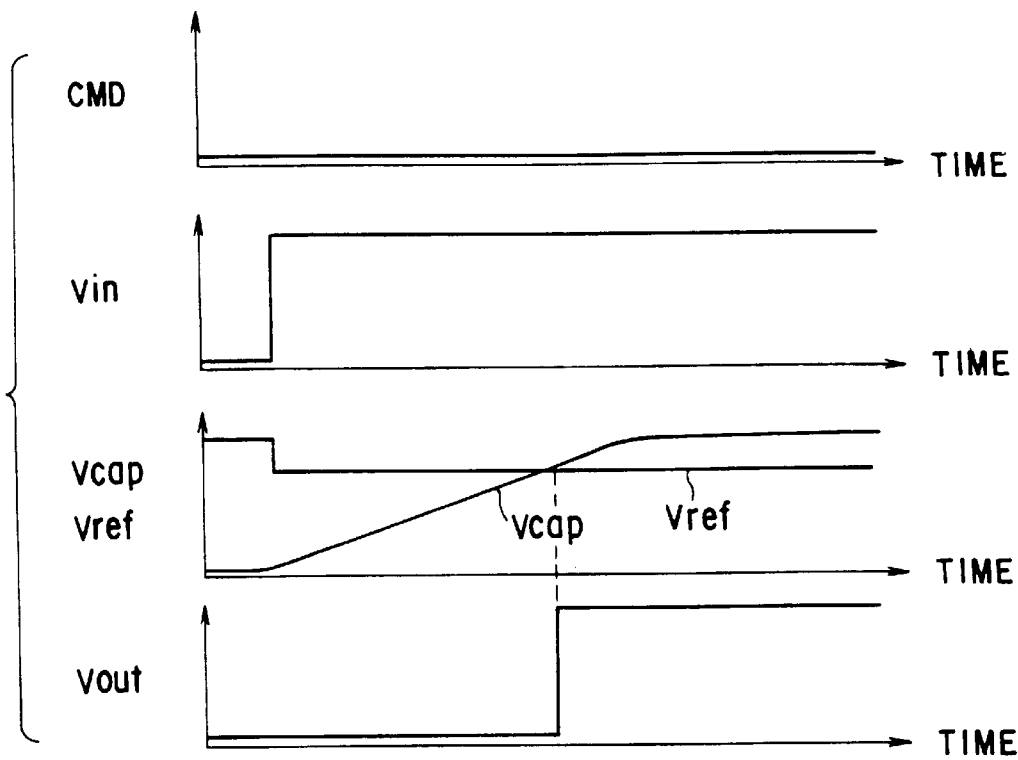
F I G. 30A
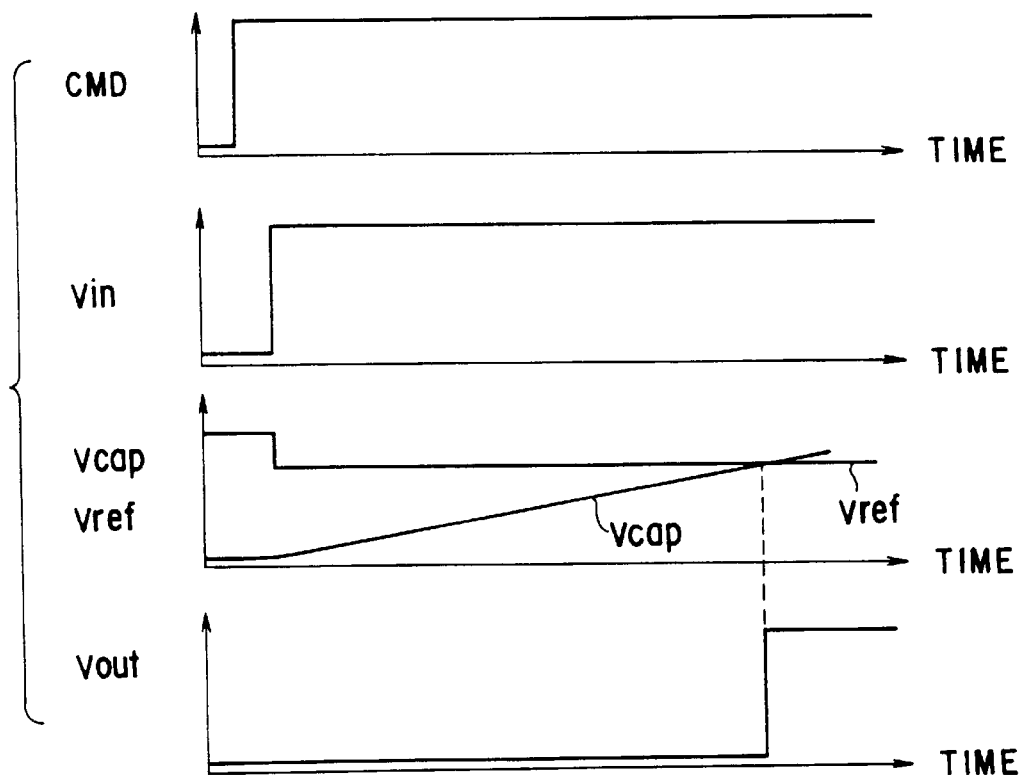
F I G. 30B

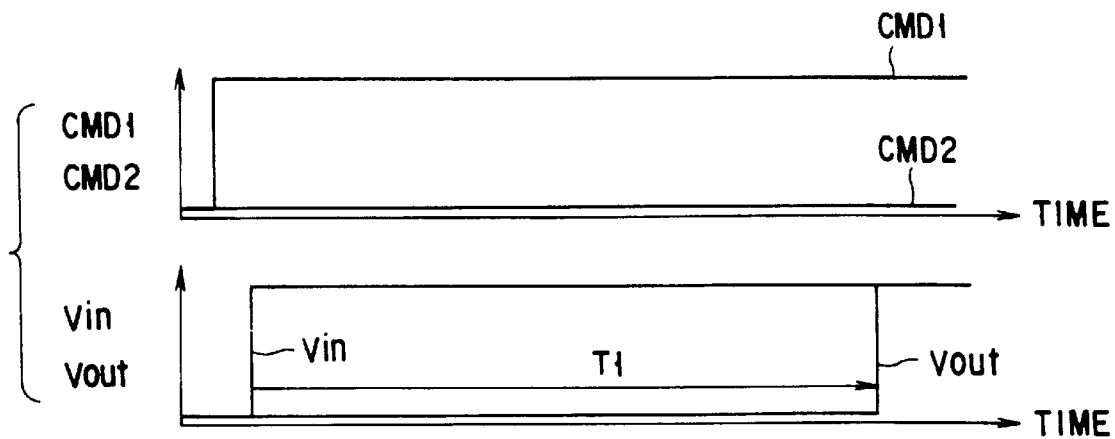
F I G. 33A
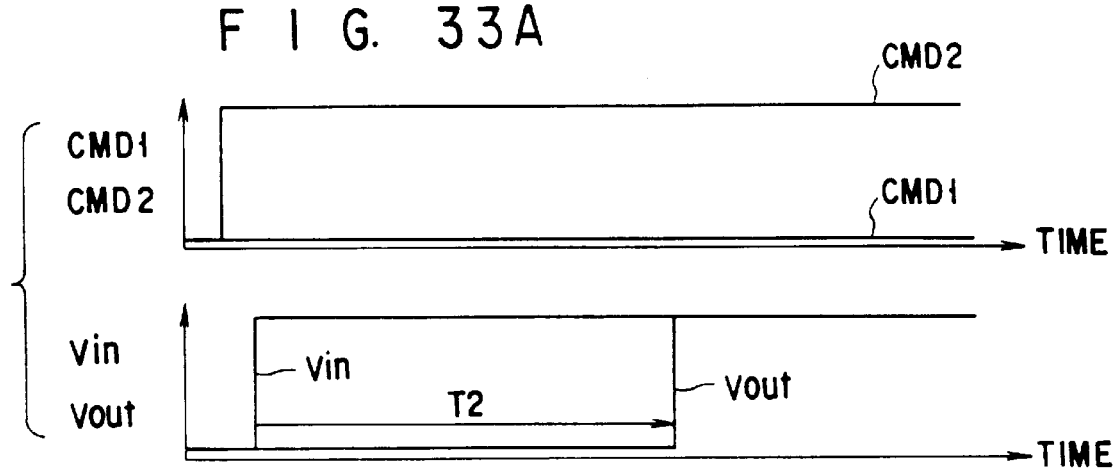
F I G. 33B
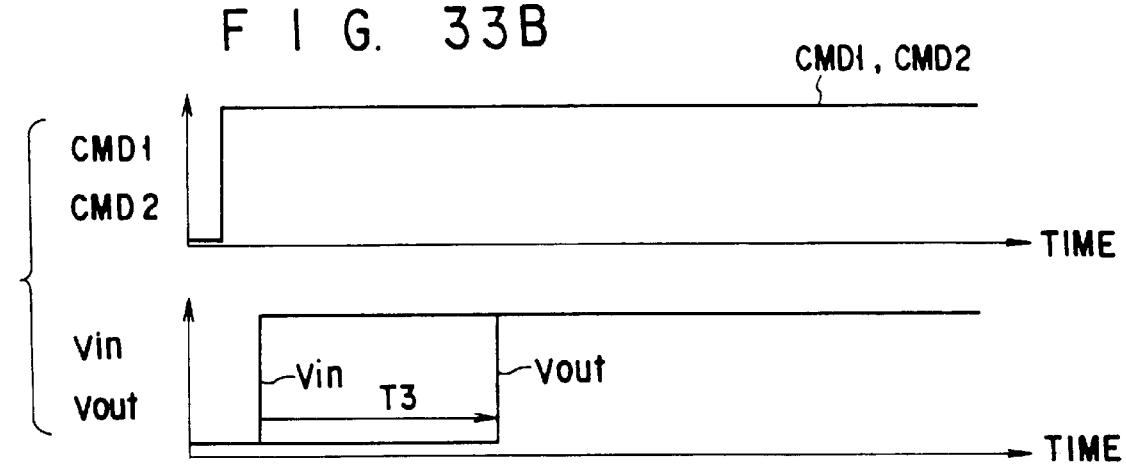
F I G. 33C

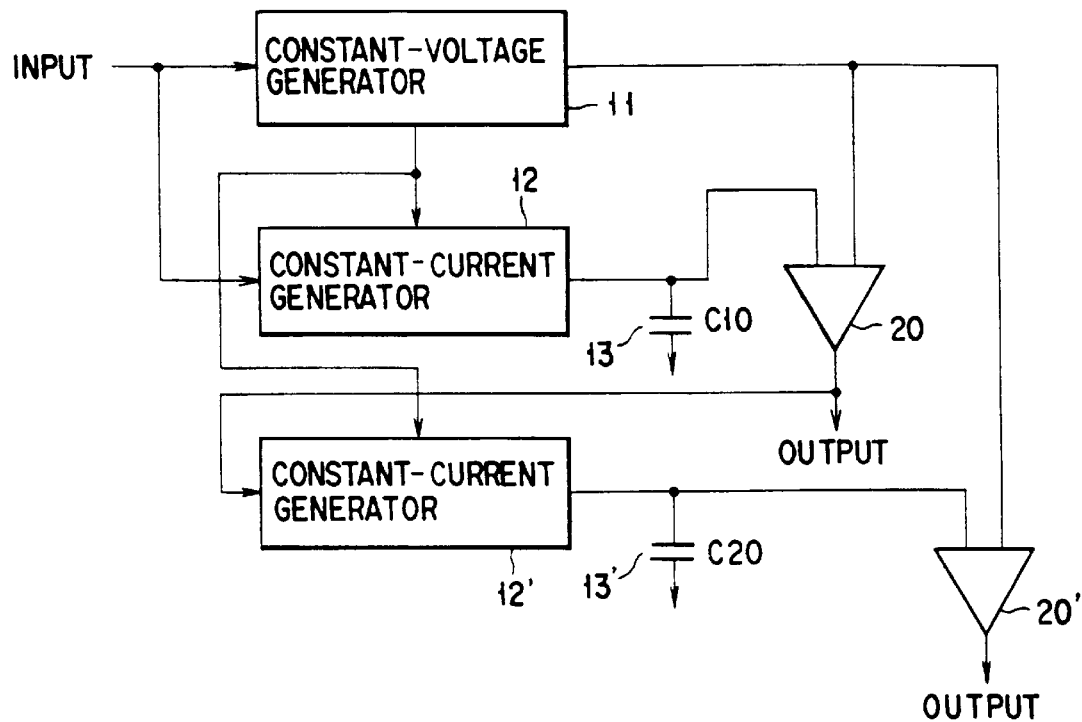
F I G. 34
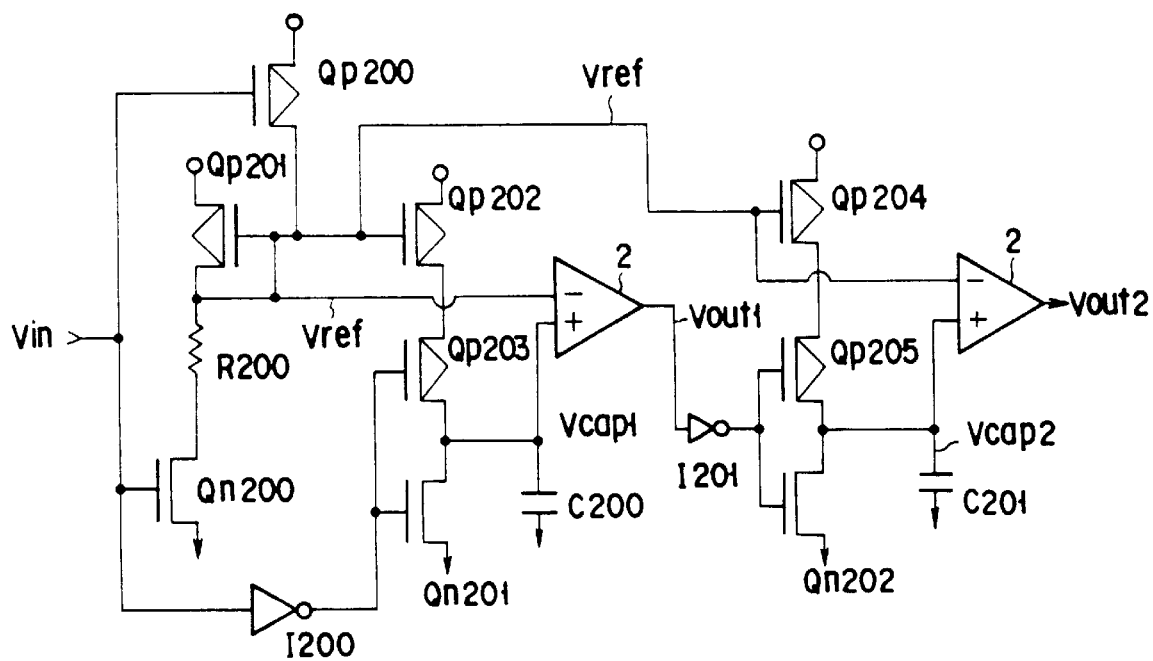
F I G. 35

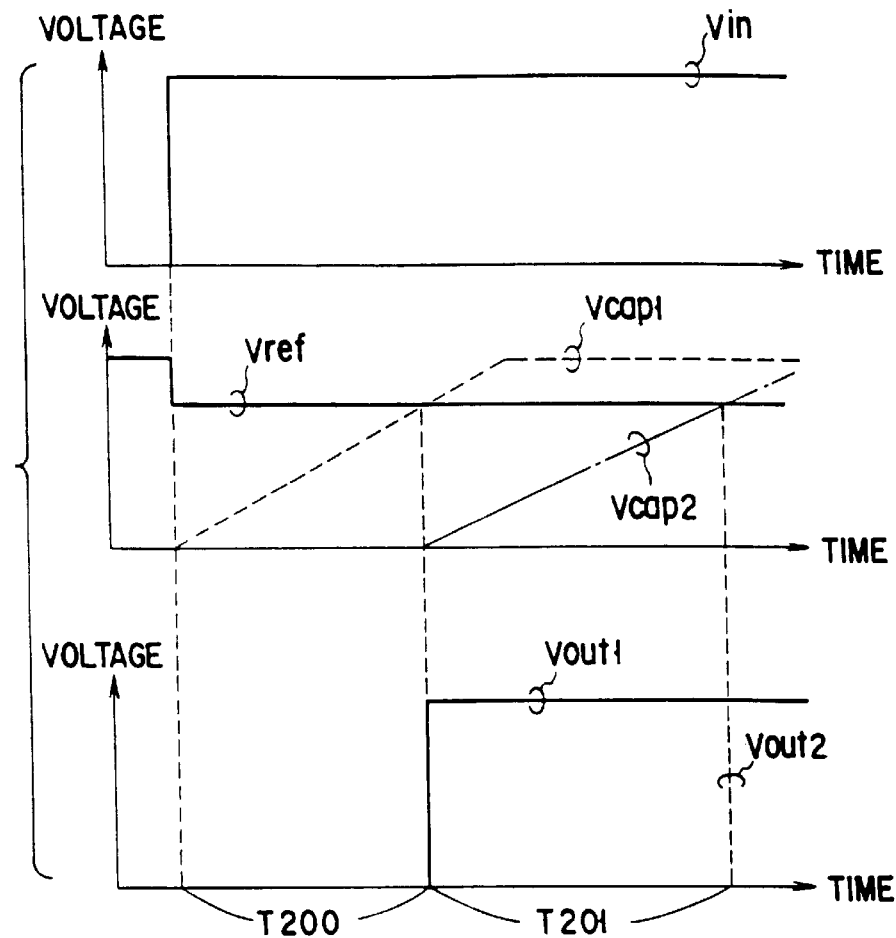
F I G. 36
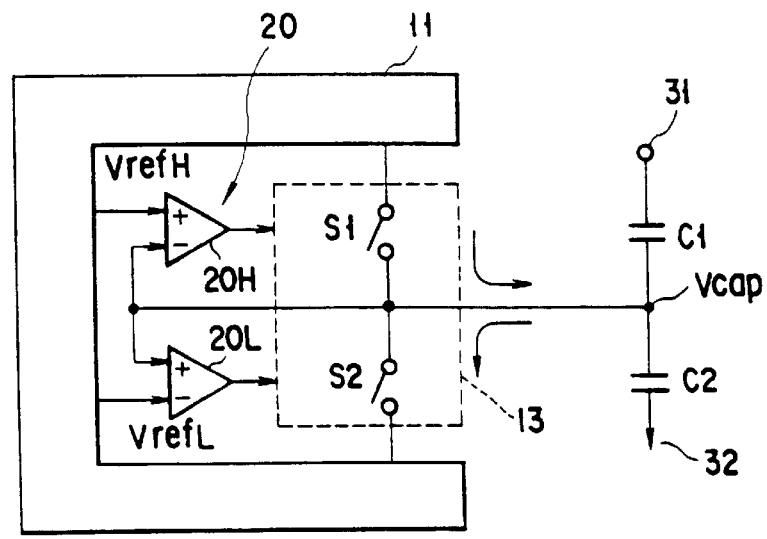
F I G. 37

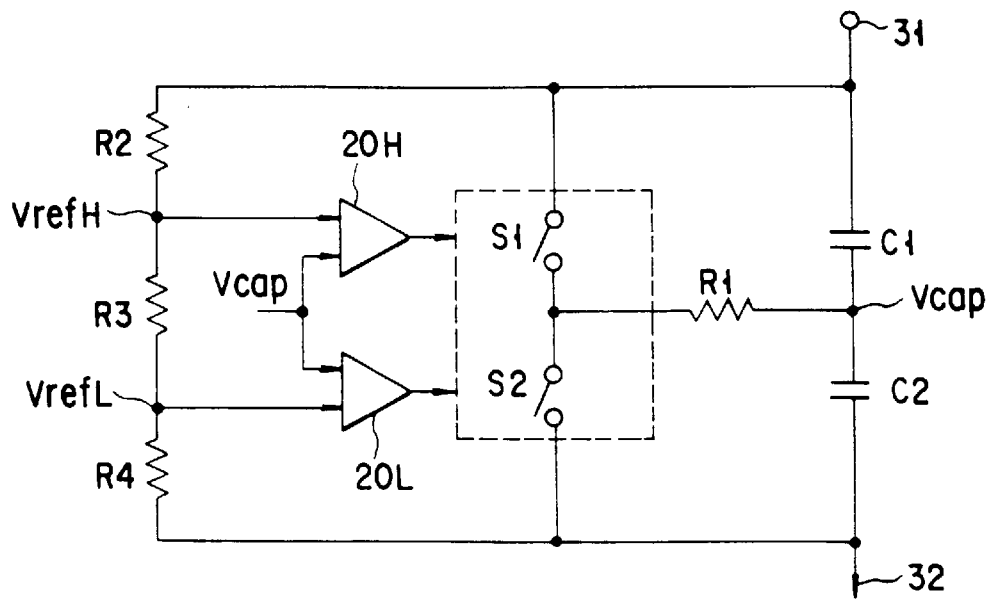
F I G. 38
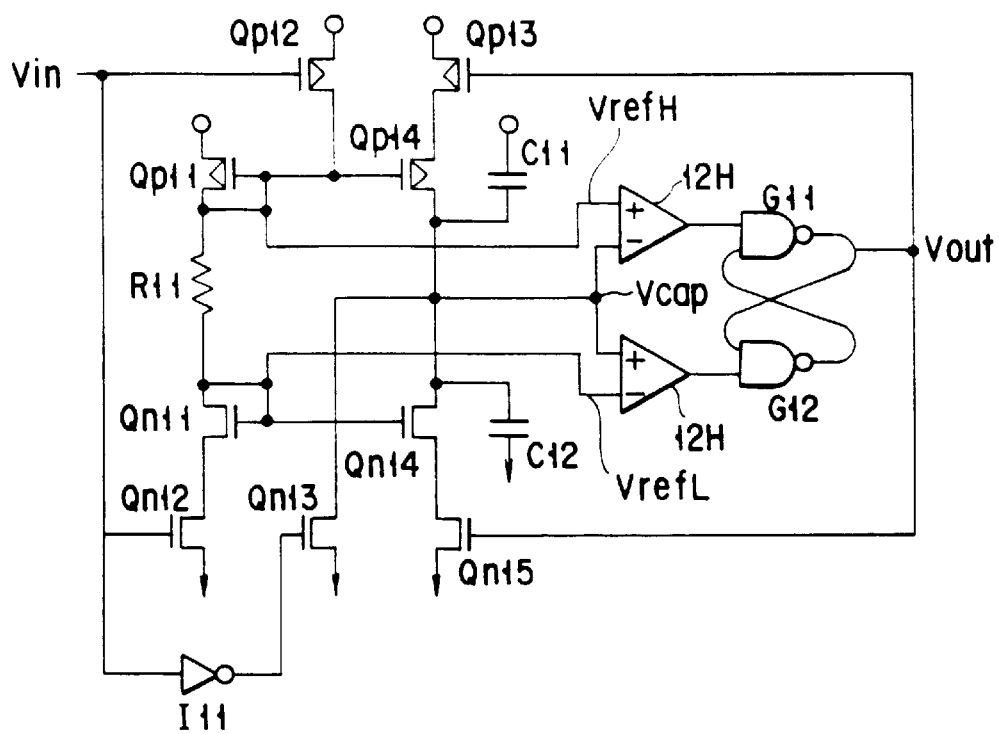
F I G. 39

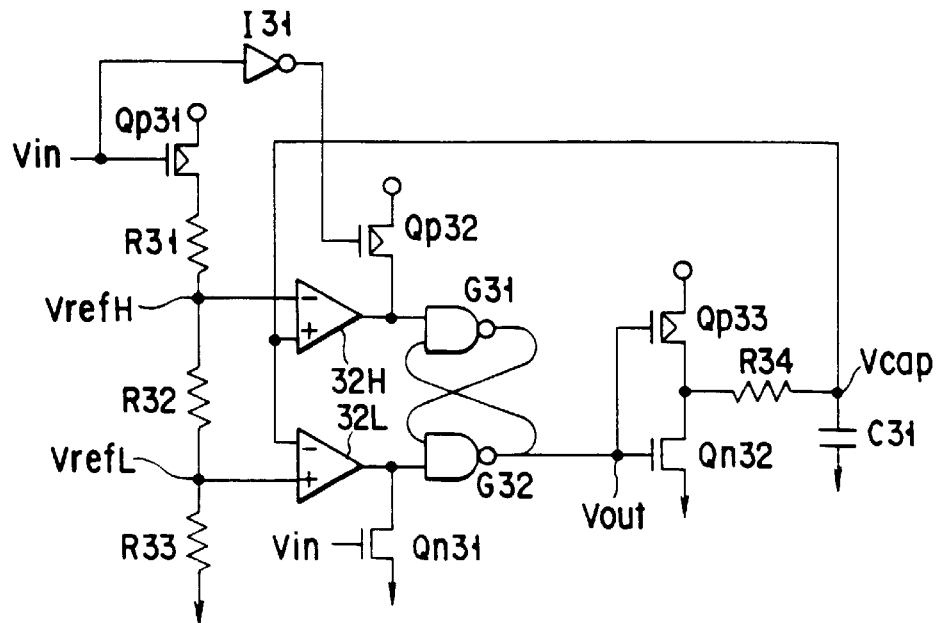
F I G. 41
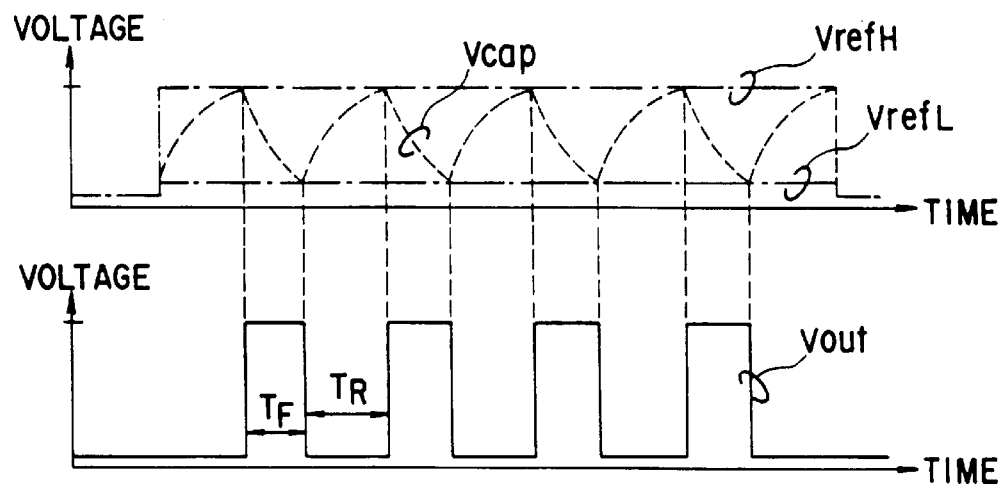
F I G. 42

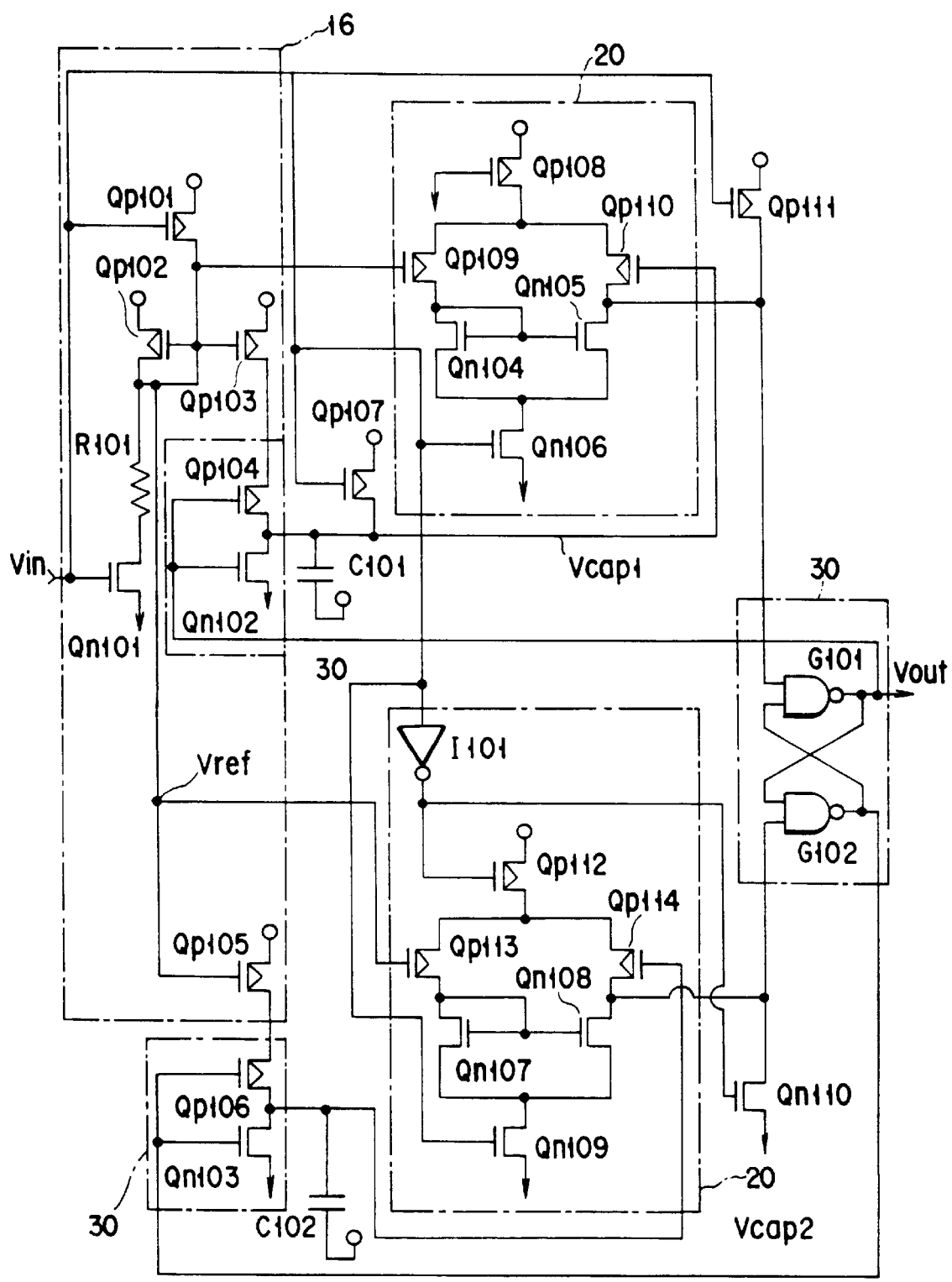
F I G. 43

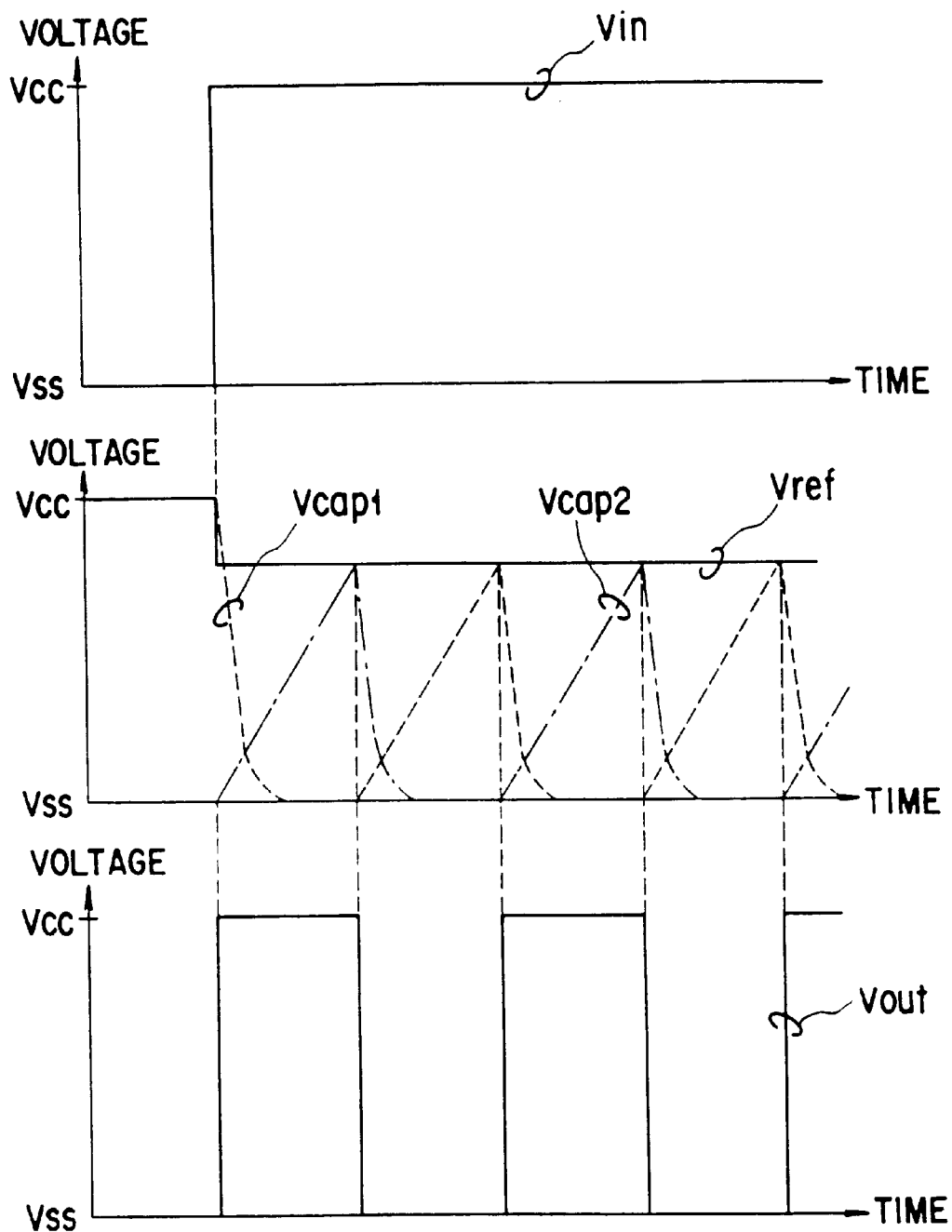
F I G. 44

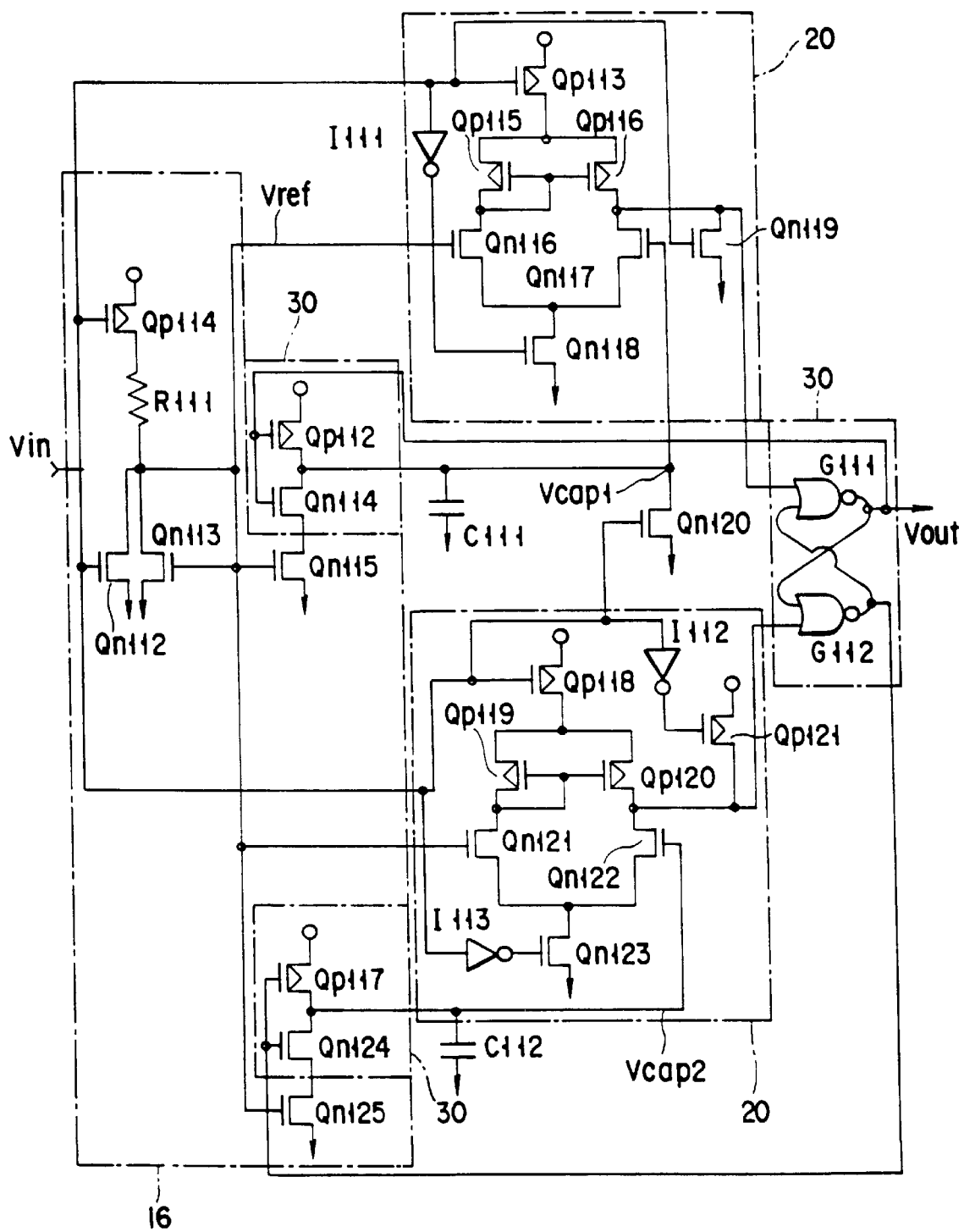
F I G. 4 5

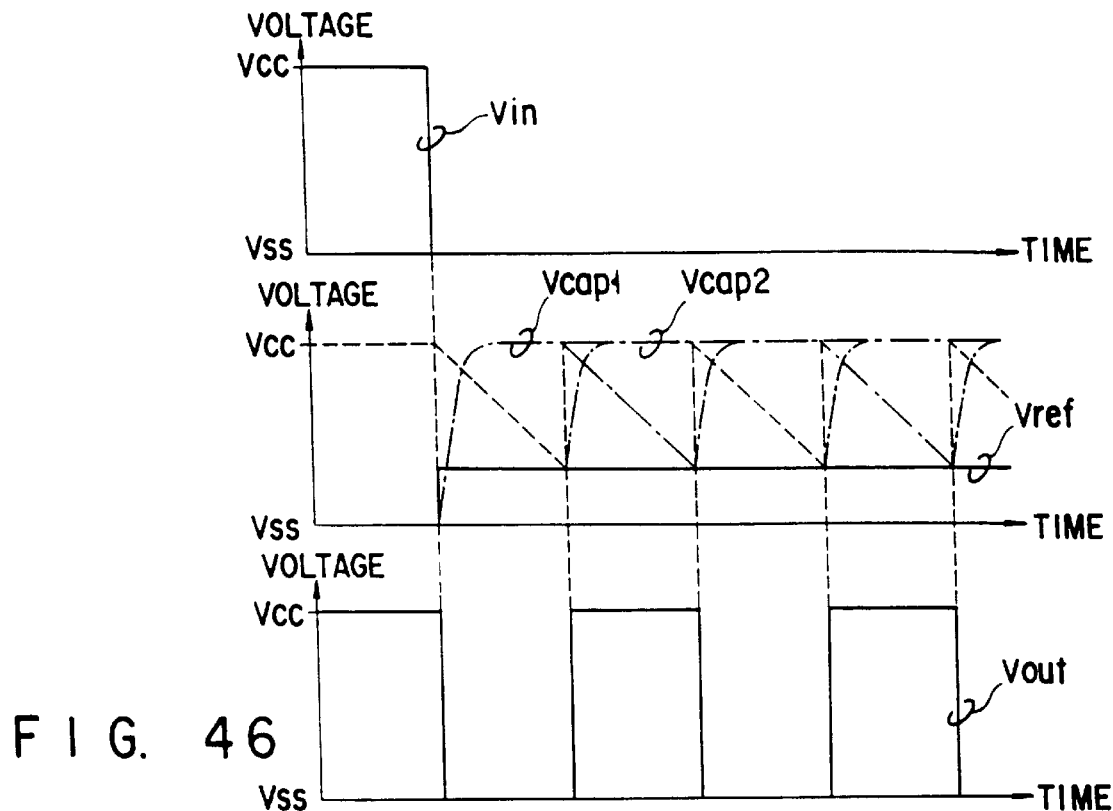
F I G. 46
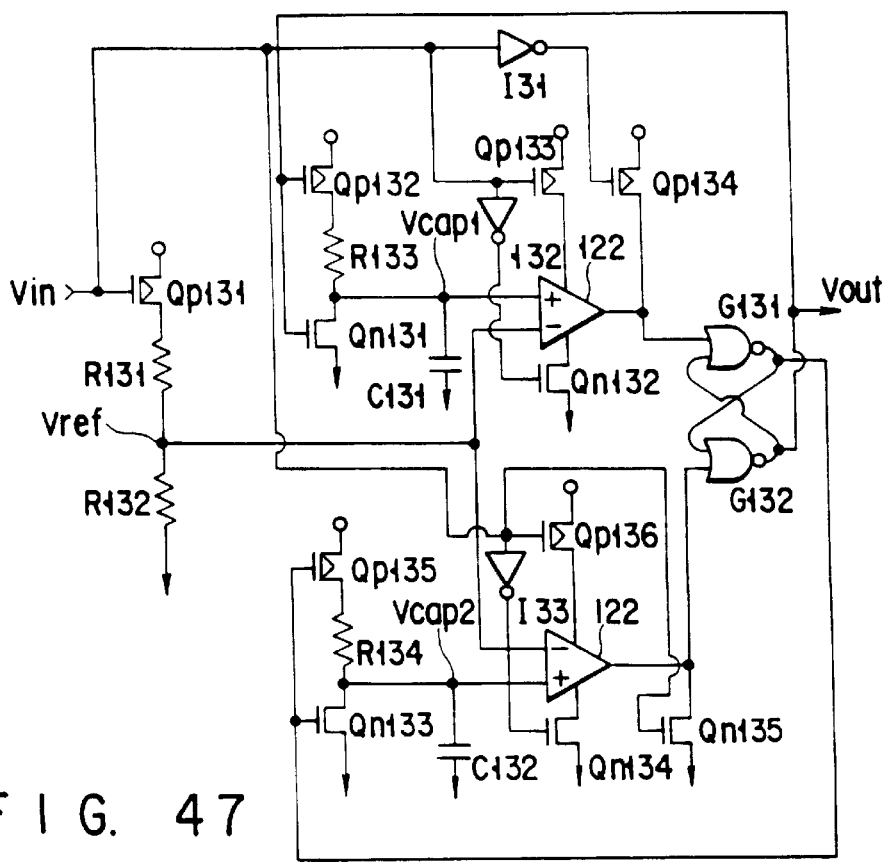
F I G. 47

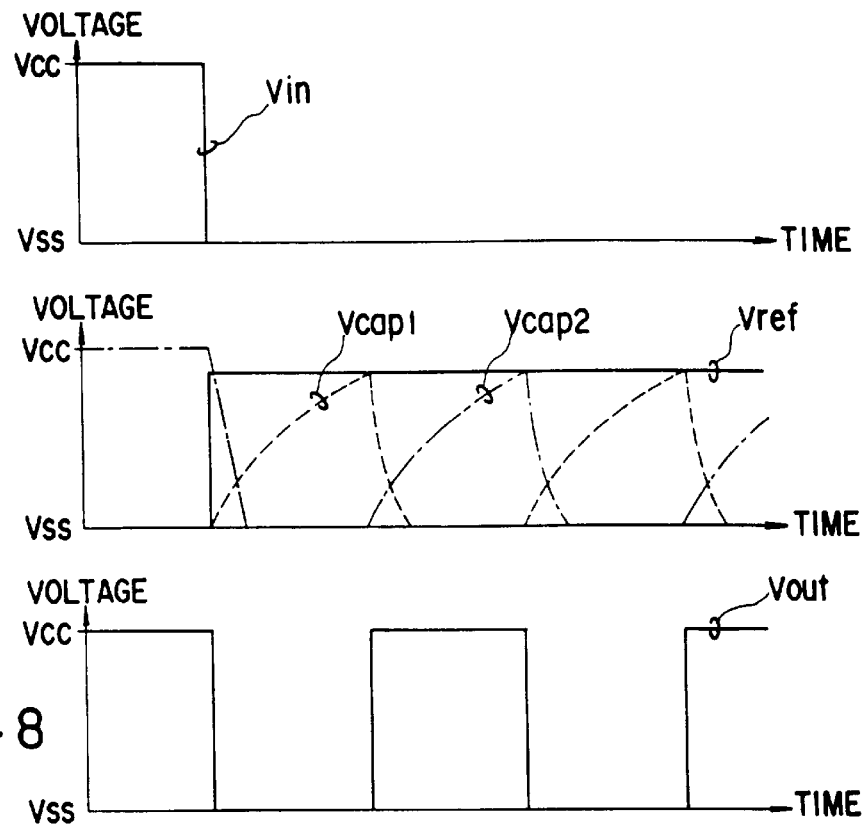
F I G. 48
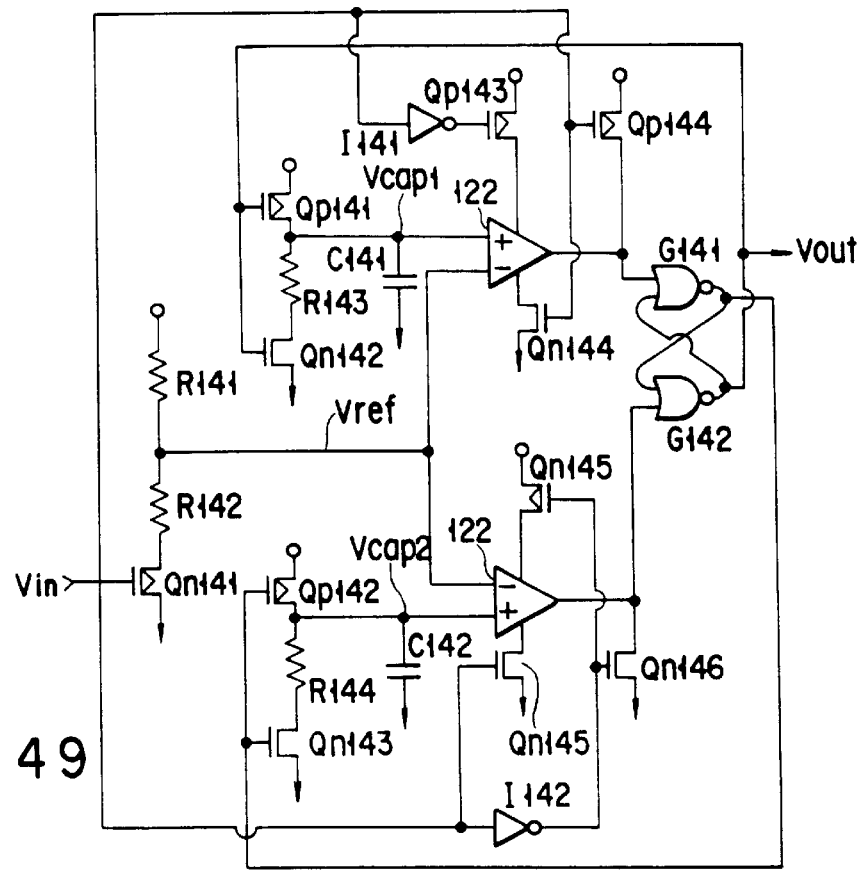
F I G. 49

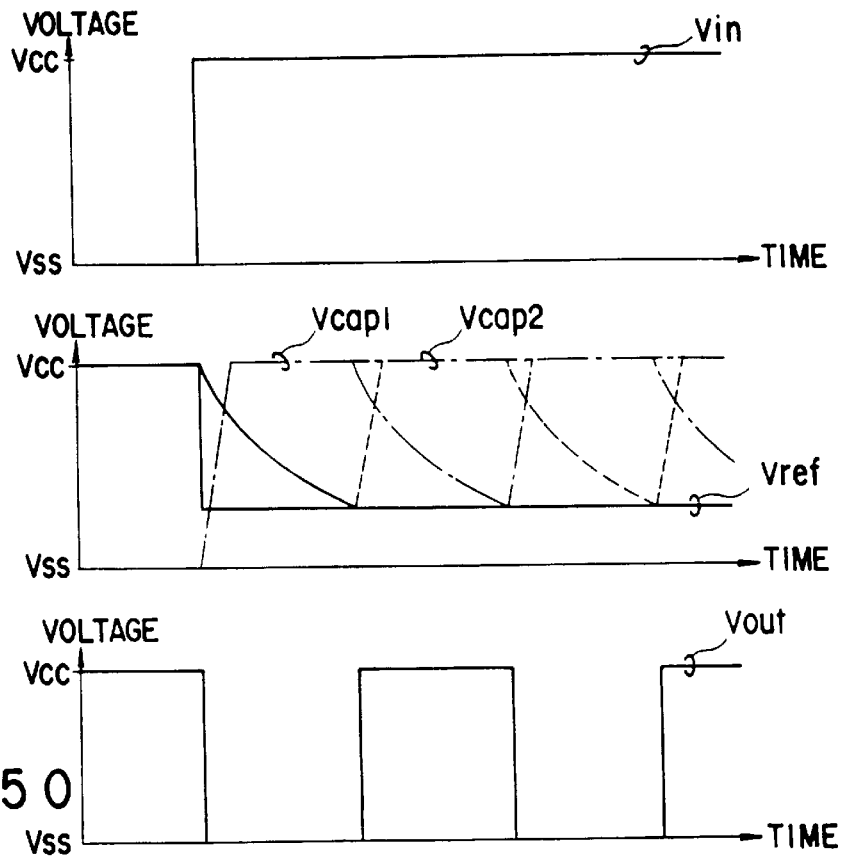
F I G. 50
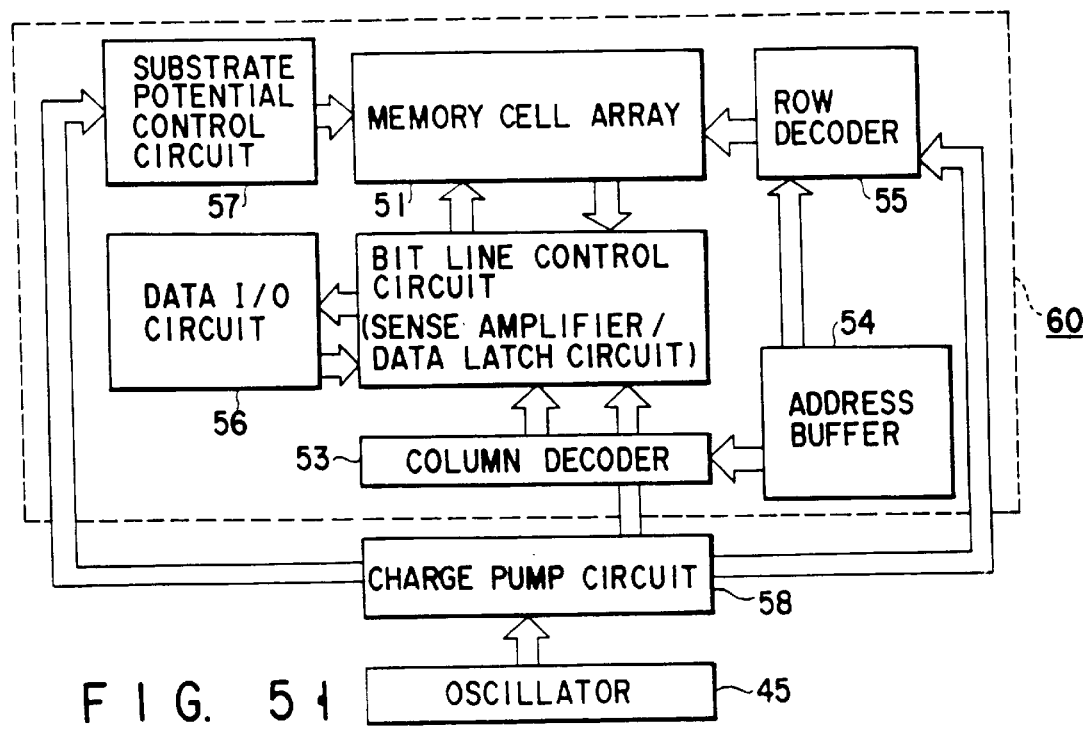
F I G. 51

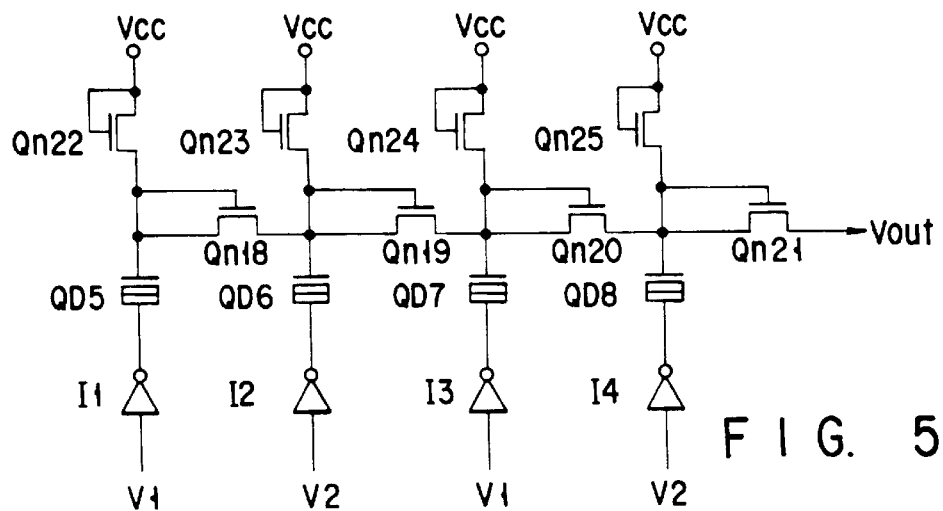
F I G. 57A
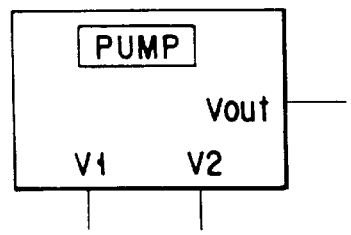
F I G. 57B
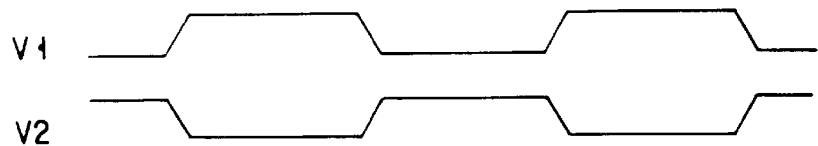
F I G. 58
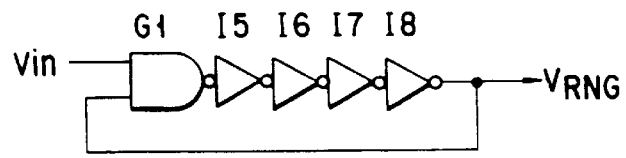
F I G. 59A
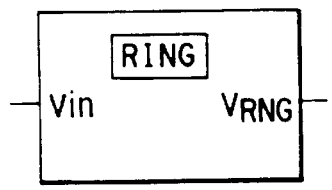
F I G. 59B

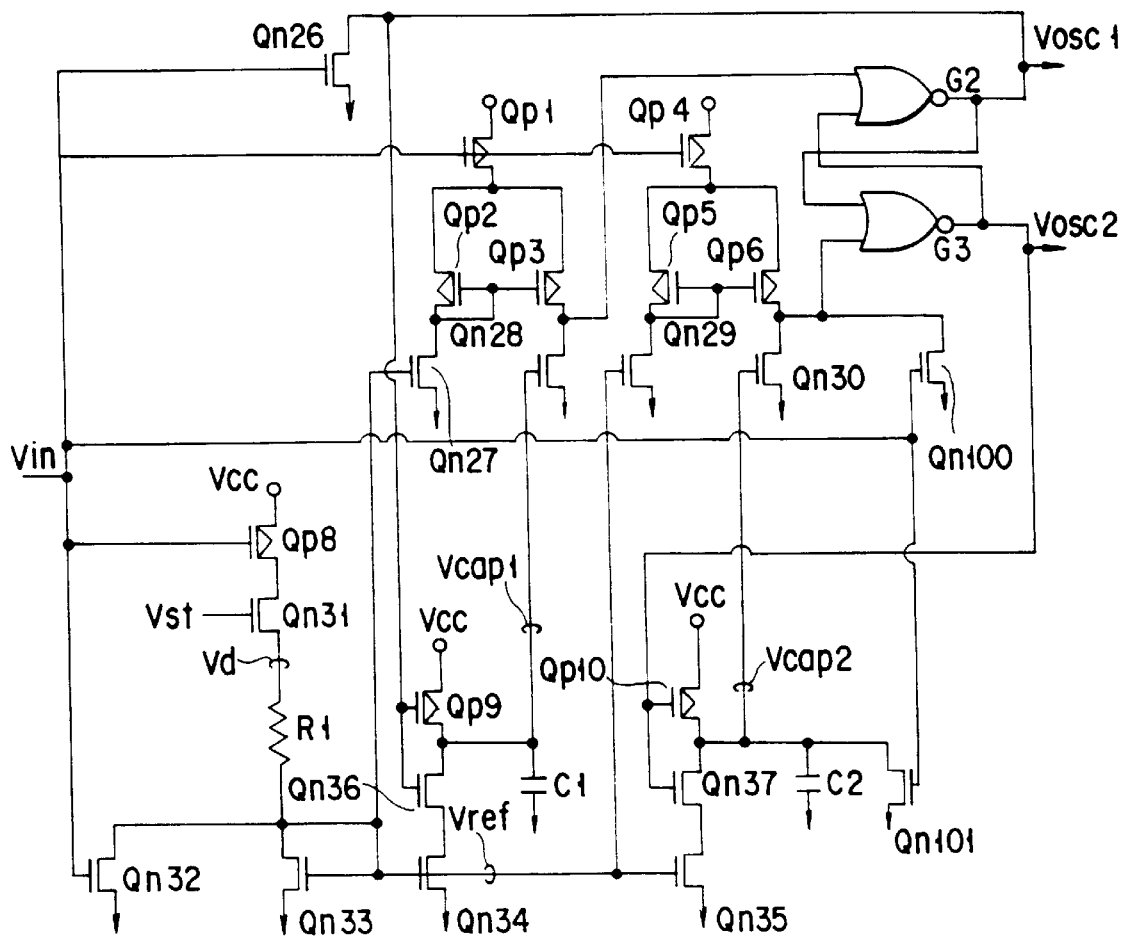
F I G. 60A
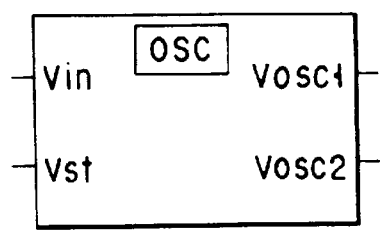
F I G. 60B

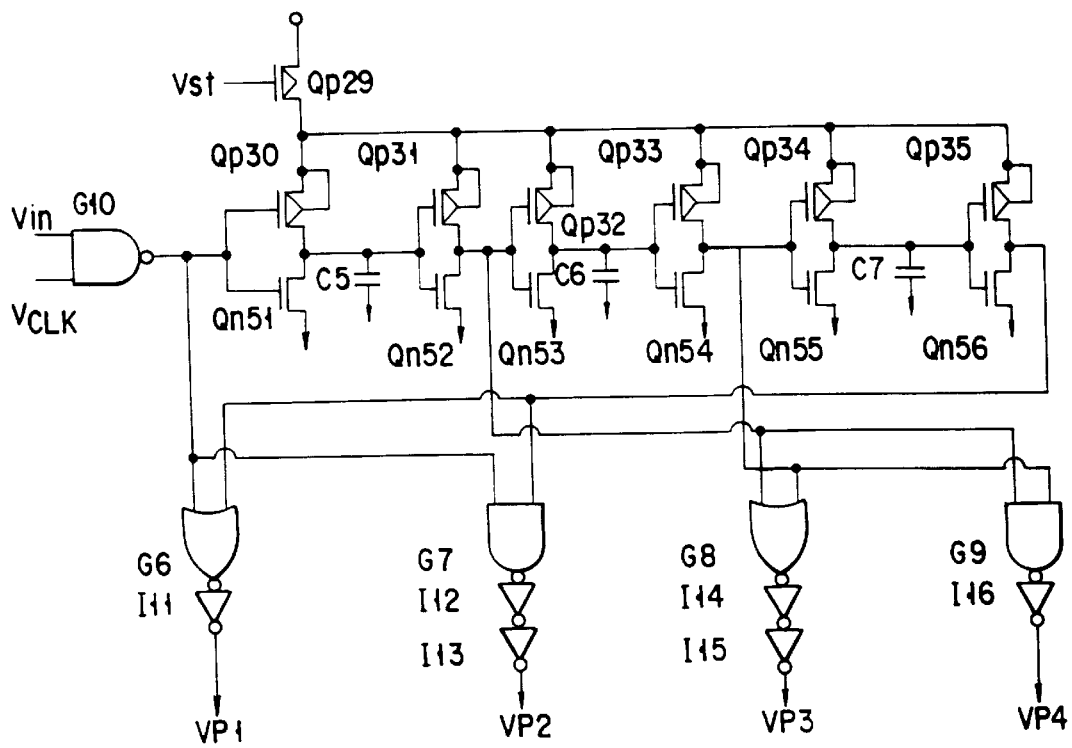
F I G. 62A
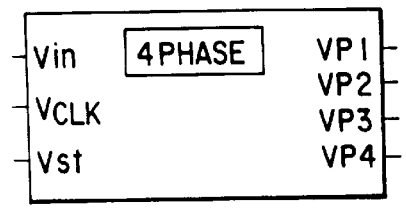
F I G. 62B
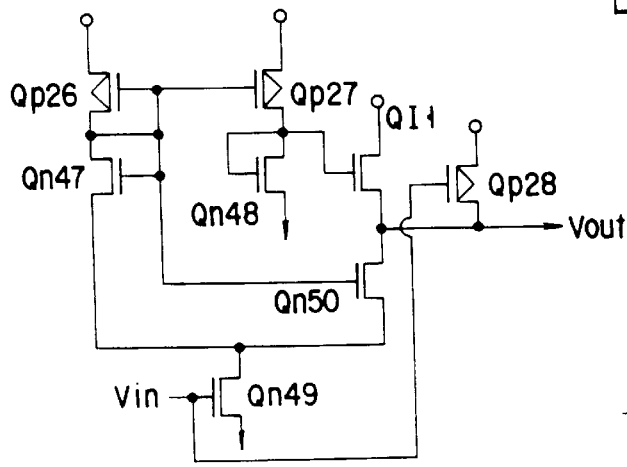
F I G. 63A
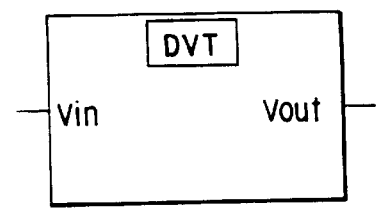
F I G. 63B

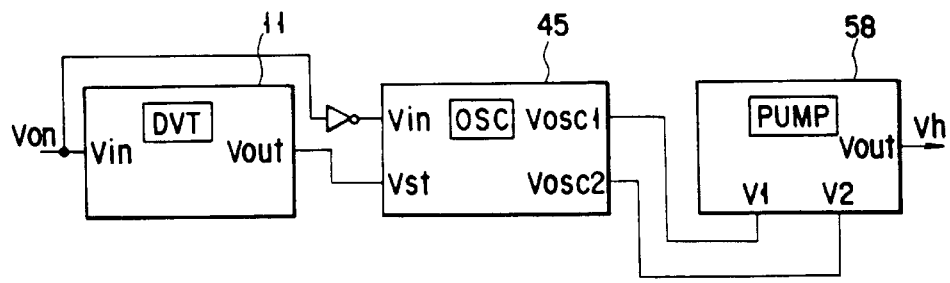
F I G. 64
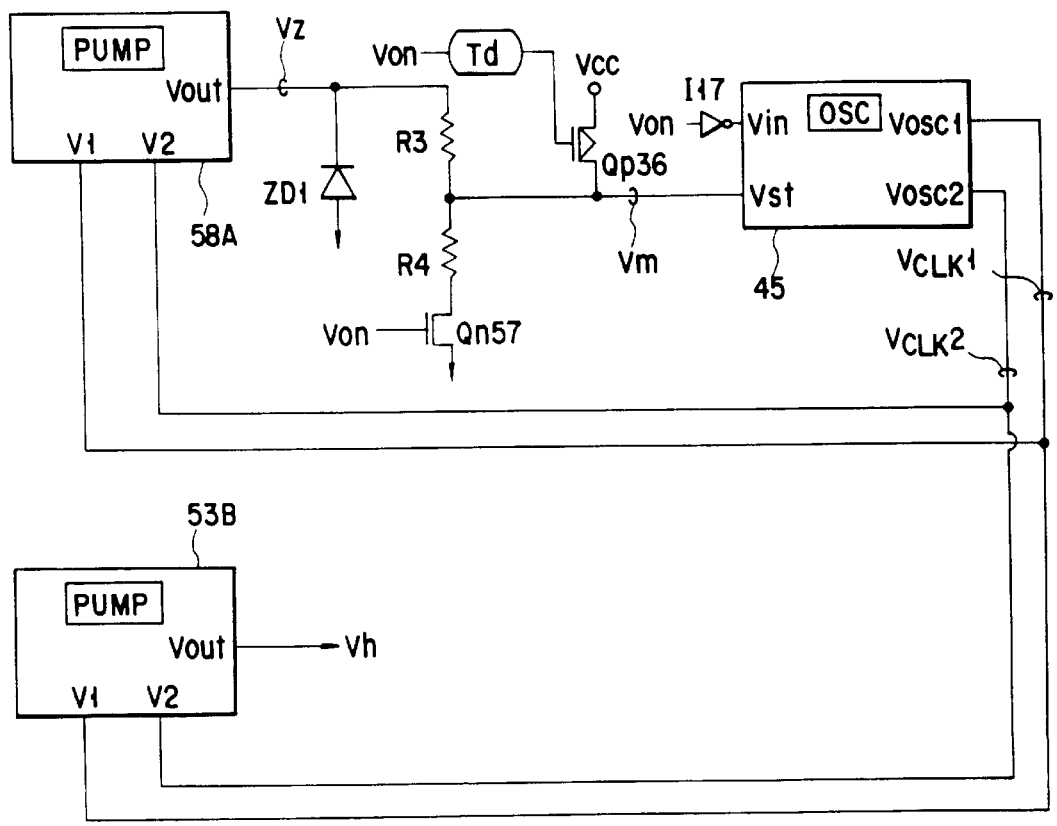
F I G. 65

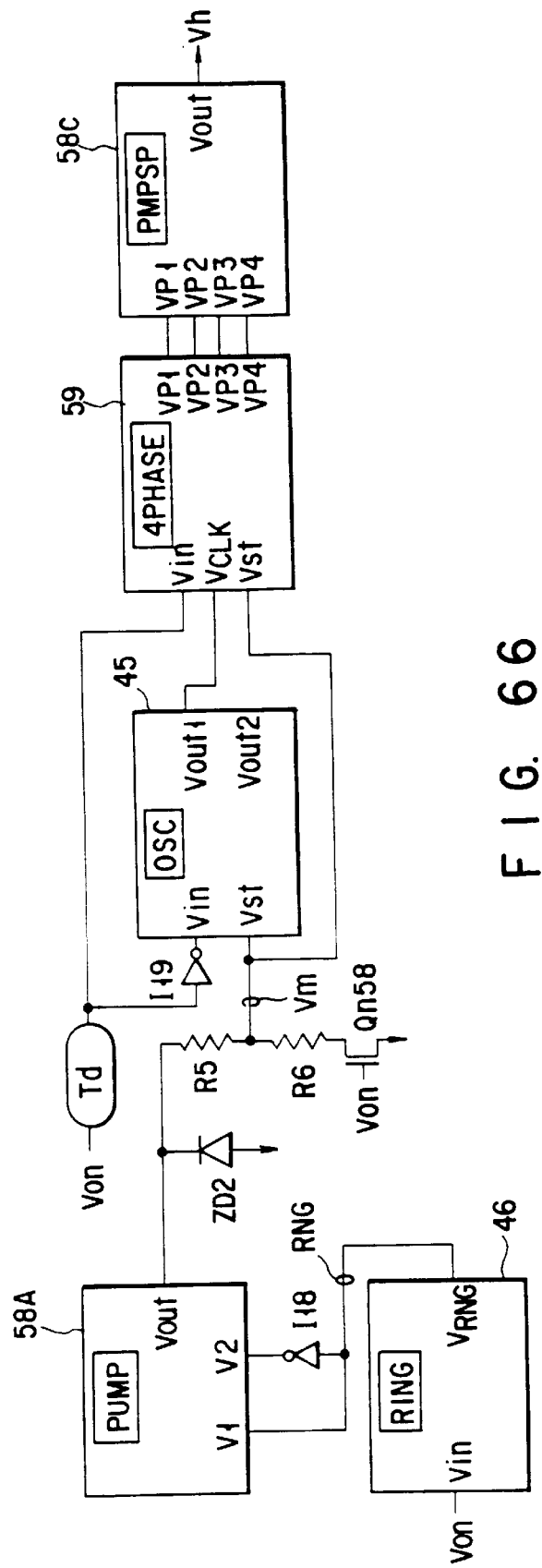
F I G. 66

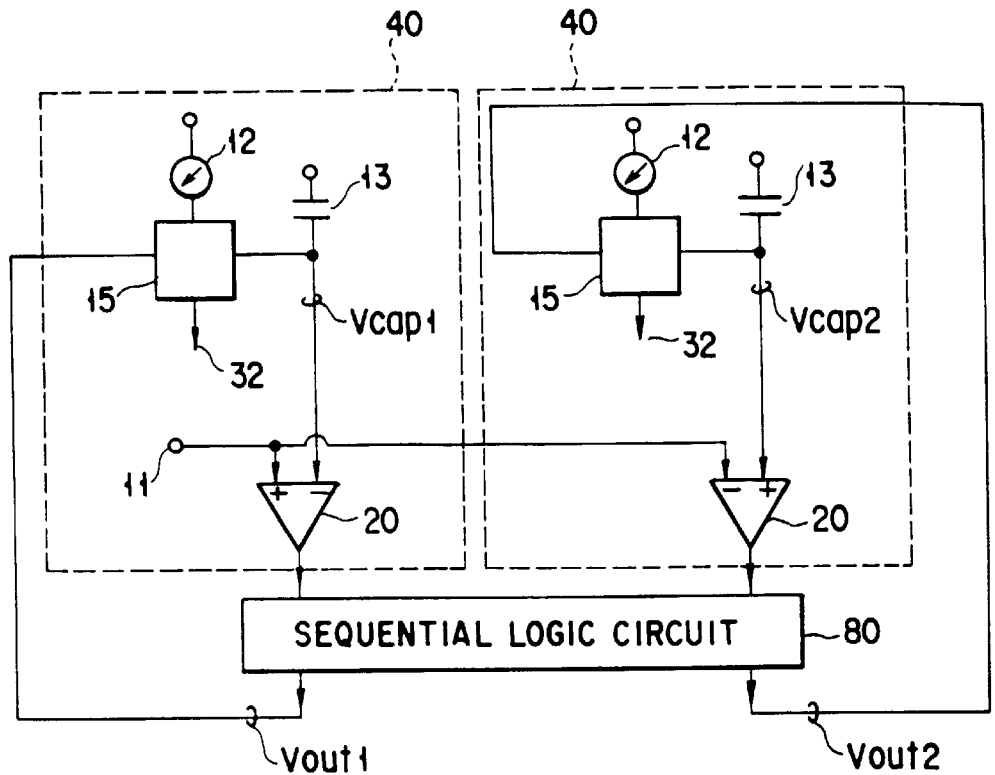
F I G. 69
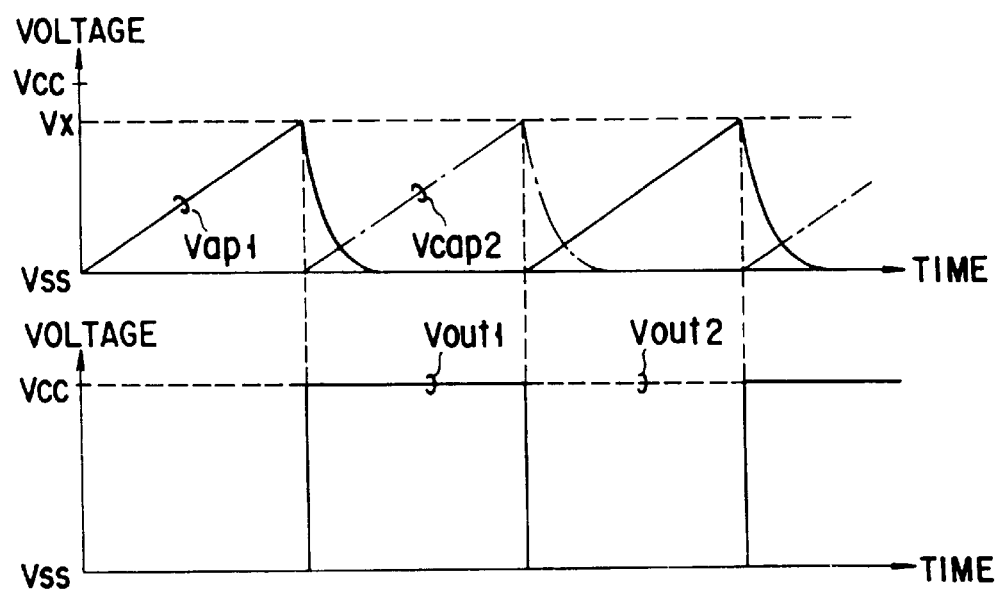
F I G. 70

DELAY CIRCUIT, OSCILLATION CIRCUIT AND SEMICONDUCTOR MEMORY DEVICE

This is a Division, of application Ser. No. 08/494,010 filed on Jun. 23, 1995, now U.S. Pat. No. 5,672,488.

BACKGROUND OF THE INVENTION

1. Field of the Invention

The present invention relates to a delay circuit and an improved oscillation circuit which has the same structure as the delay circuit and which is designed for use in a semiconductor integrated circuit. The invention further relates to a semiconductor memory device which comprises an oscillator having the same structure as the improved oscillator.

2. Description of the Related Art

Delay circuits of various structures have been provided. Among them are delay circuits which incorporate MOS transistors. Delay circuits having the following structure have been known.

FIG. 1 shows a first example of the delay circuit which incorporate MOS transistors.

The delay circuit shown in FIG. 1 is set in standby state while an input signal Vin remains at low level, and in active state while the input signal Vin remains at high level. While the circuit assumes the standby state, the capacitor C4 is charged to the supply voltage Vcc by the p-channel transistor Qp17, and the output signal Vout is therefore at low level. When the input signal Vin rises to high level, the capacitor C4 is discharged through the n-channel transistor Qn20. The input potential of the inverter I8 (i.e., the voltage on the capacitor C4) is thereby lowered from high level to low level. The moment the input potential of the inverter I8 falls below the threshold voltage of the inverter I8, the output signal Vout rises from low level to high level. The time which lapses until the output signal Vout rises to high level after the input signal vin has risen to high level is equal to the time which lapses until the input potential of the inverter I8 falls from the supply voltage Vcc to the threshold voltage of the inverter I8. This time is the delay time.

To prevent the delay time from changing with the fluctuation of the supply voltage Vcc, the inverter I8 comprises an n-channel transistor and a p-channel transistor whose current-drivability is greater than that of the n-channel transistors. The threshold voltage of the inverter I8 is therefore nearly equal to (Vcc−Vt), where Vt is the threshold voltage of the p-channel transistor Qp17. The voltage Vt is constant, not depending upon the supply voltage Vcc. The delay time is given as a time of which the storage node of the capacitor C4 is changed from the initial value Vcc to the threshold voltage (Vcc−Vt) of the inverter I8. As described above, the charge to be discharged is proportional to Vt which does not depend on the Vcc, thereby Vcc dependency of the delay time is reduced.

The voltage applied to the gate of the n-channel transistor Qn20 to discharge the capacitor C4 is the supply voltage Vcc while the delay circuit remains in active state. The discharge ability of the n-channel transistor Qn20 depends on its gate voltage (i.e., the supply voltage Vcc). Hence, the delay time depends upon the supply voltage Vcc.

The above delay circuit has a disadvantage in that its operating characteristic is affected by the characteristic differences which the transistors have inevitably because of the existing manufacturing technology. More specifically, the n-channel transistors have threshold voltages different from the design values and therefore discharging abilities different from the desired values. The p-channel transistor may fail to have the desired threshold voltage. Accordingly, the charge which these transistors discharge from the capacitor C4 and which determines the delay time may change from the design value.

The longer the delay time the delay circuit has, the larger the element area the capacitor C4 and the n-channel transistor Qn20 need to have. Furthermore, the capacitor C4 or the n-channel transistor Qn20, or both must have a large element area. This is because the input potential of the inverter I8 is nothing more than a change in the threshold voltage Vt of the p-channel transistor Qp17.

FIG. 2 shows another known delay circuit having MOS transistors, which is disclosed in Jpn. Pat. Appln. KOKAI Publication No. 3-23709. This delay circuit has a delay time which is relatively constant despite the changes in the supply voltage Vcc and in the threshold voltages of the p-channel transistors.

The output of the delay circuit, however, has sloping trailing edges. The delay time inevitably changes in accordance with the threshold voltage of an inverter circuit which receives the output of the delay circuit. To be more precise, although the delay time is relatively constant, it varies since the threshold voltage of the inverter circuit changes due to the fluctuation of the supply voltage Vcc and/or that of the conductances of the transistors forming the inverter circuit.

FIG. 3 illustrate a known delay circuit which provides two or more delay times. This delay circuit generates output signals Vout1, Vout2, . . . , Voutn, the waveforms of which are shown in FIG. 4.

The delay circuit has delay units 40 as many as the delay times it provides. The number of the elements constituting the delay circuit is the number of delay units 40 multiplied by the number of elements forming each delay unit 40. Obviously, the area occupied by all elements of the delay circuit is enormous.

FIG. 5 shows another known delay circuit which provides two or more delay times. The delay circuit generates output signal Vout, the waveform of which is shown in FIGS. 6A and 6B. The circuit shown in FIG. 5 can change the delay time according to a command signal CMD. When the command signal CMD is at low level, the delay units 60, which have delay times T1 and T2, respectively, are connected in series, and the output signal Vout rises to high level upon lapse of a time (T1+T1) from the time after the input signal Vin has risen to high level, as illustrated in FIG. 6A. When the signal CMD is at high level, the output of only the delay unit T1 is valid, and the output signal Vout rises to high level upon lapse of a time (T1) time after the input signal Vin has risen to high level, as shown in FIG. 6B. The delay circuit may have three or more delay units 60, instead of two delay units 60 as shown in FIG. 5.

The more delay times the circuit needs to provide, more delay units 60 it should have. The more delay units 60, the larger the area the elements of the delay circuit will occupy.

As mentioned above, the delay time of a delay circuit varies if the supply voltage, threshold voltage of the transistors, and/or that of the conductances of the MOS transistors fluctuate. On the other hand, a delay circuit obtaining a large delay time must have a large element area and a large consumption current.

An oscillation circuit for use in semiconductor integrated circuits may comprise a two-input NAND gate the first input of which is connected to receive an input signal (e.g., a signal Vin), and a plurality of inverters the outputs of which are fed back to the second input of the NAND gate. The oscillation remains in standby state as long as the input signal is at low level. It starts performing its function when the input signal rises from low level to high level. The oscillating frequency of the circuit varies not only with the supply voltage but also with the changes in the characteristics of the transistors it incorporates.

Known as one type of an EEPROM into which data can be written and from which data can be erased by using a single power source (e.g., Vcc=5 V) is, for example, a NAND-type EEPROM. A NAND-type EEPROM has a memory cell array ordinarily provided in a p-type well formed in either a p-type substrate or n-type substrate. The memory cell array comprises a plurality of cell units connected to bit lines. Each cell unit consists of a plurality of memory cells which are connected in series, each having its source coupled to the drain of the immediately adjacent memory cell. In most NAND-type EEPROMs, each memory cell is of FETMOS structure. To write/read data into/from any memory cell, a voltage higher than the supply voltage is applied to the memory cell. Data is stored into the memory cell by applying a tunnel current or the like is applied to the cell, thereby controlling the electric charge in the charge-accumulating layer of the cell.

Data is written into, and erased from, the NAND-type EEPROM, in the following way. Data is sequentially written into the memory cells of each unit, first into the cell remotest from the bit line (i.e., the cell nearest the source line). A high voltage Vpp (=about 20 V) is applied to the control gate of a selected memory cell. At the same time, an intermediate voltage VppM (=about 10 V) is applied to the control gate and selection gate of the adjacent memory cell located closer to the bit line than the selected memory cell. Simultaneously, 0 V or the intermediate voltage VppM is applied to the bit line, depending on the value of the data to be written into the memory cell.

When 0 V is applied to the bit line, the potential of the bit line is applied to the drain of the memory cell. Electrons are injected from the drain into the floating gate of the memory cell, thereby the threshold voltage of the memory cell shifts to the positive direction. As a result, a "1" bit is written into the memory cell. When the intermediate voltage is applied to the bit line, the potential of the bit line is not applied to the drain of the memory cell. In this case, no electrons are injected from the drain into the floating gate of the memory cell, the threshold voltage of the memory cell does not change, and the memory cell keeps a "0" bit.

Data erase operation is performed, simultaneously from all memory cells. More precisely, all control gates and all selection gates are set at 0 V, and all bit lines and all source lines are set into floating state. Then, the high voltage of 20 V is applied to the p-type well and the n-type substrate. Electrons are thereby injected into the p-type well from the floating gate of every memory cell. The threshold voltage of every memory cell shifts to the negative direction, whereby data is erased.

As can be understood from the above, with an EEPROM driven by a single source supply it is necessary to generate a voltage higher than the supply voltage. To generate this high voltage, a charge pump circuit is incorporated in the EEPROM. To drive the charge pump circuit, a ring oscillator is incorporated in the EEPROM. Generally, the current-drivability of the charge pump circuit decreases as the supply voltage falls. The oscillating frequency of the ring oscillator decreases as the as the supply voltage falls. If designed to operate with a minimal supply voltage, the charge pump circuit will have an excessive current-drivability when applied with a maximal supply voltage. The charge pump circuit would therefore waste power in the NAND-type EEPROM.

In order to solve the above-mentioned problems, the inventors hereof have invented a novel EEPROM. The EEPROM comprises an oscillation circuit and a charge pump circuit. The oscillation circuit has an oscillating frequency which increases as the supply voltage falls. The charge pump circuit has current-applying ability which depends on the oscillating frequency and can increase the supply voltage to generate a voltage high enough to write data into and erase data from the memory cells. The voltage of the charge pump circuit does not influenced by the fluctuation of the supply voltage, and power is not wasted as the supply voltage varies when data is written into/erased from the memory cells.

The transistors used in the oscillation circuit have each a conductance and a threshold voltage which differ from the design values due to the level of the existing manufacturing technology. Inevitably, the oscillating frequency of the oscillation circuit is likely to fluctuate. Furthermore, the oscillating frequency changes with the temperature since the conductance and threshold voltage of each transistor depend upon temperature. The fluctuation of the oscillating frequency results in wasting of power also in the EEPROM invented by the inventors.

SUMMARY OF THE INVENTION

The object of the present invention is to provide improved delay circuits, an improved oscillator and an improved semiconductor memory device. More specifically, the object is to provide the following:

(1) A delay circuit which has a stable delay time even if the supply voltage, and the threshold voltage and the conductances of the transistors used change and which occupies but a small area and consumes a small amount of current.

(2) A delay circuit which provides a plurality of delay times and whose components occupy a small area.

(3) An oscillator whose oscillating frequency remains unchanged even if the supply voltage or the characteristics of the transistors vary.

(4) A semiconductor memory device which has a charge pump circuit not influenced by the fluctuation of the supply voltage, by the changes in the characteristics of the transistors used or by the temperature, and which wastes no power in data write/read operation.

To solve the above subject, the present invention employ the following structures.

According to the present invention, there is provided a first delay circuit incorporating MOS integrated circuit and having standby state and active state and designed to output at least one signal obtained by delaying an input signal, comprising: a storage circuit for receiving an input signal, generating at least one first voltage when the input signal is inverted, and generating at least one second voltage from a difference between the first voltage and a first supply voltage; and at least one amplifier circuit for amplifying the difference between the first voltage and the second voltage. The storage circuit includes: a constant-current generating section for generating at lease one the first voltage when the input signal is inverted; at least one constant-current generating section for generating a current proportional to the difference between the first voltage and the first supply voltage; and at least one capacitor having a first terminal set at the first supply voltage or a second supply voltage, and a second terminal charged to the first supply voltage while the delay circuit remains in the standby state and charged or discharged to the second voltage with the current generated by the constant-current generating section while the delay circuit remains in the active state.

The following are preferred embodiments of the delay circuit:

(1) A delay circuit, in which the storage circuit includes: a first MOS transistor having a source connected to the first supply voltage, a gate and a drain connected to the gate; a resistor element connected between the drain of the first MOS transistor and a second supply voltage; and a second MOS transistor having a source connected to the first supply voltage, a gate connected to the gate of the first MOS transistor and a drain connected to one end of the capacitor, and one of a voltage at the drain of the first MOS transistor and a voltage at a divided point at which the resistor element is divided is output as the first voltage, and a voltage at a storage node of the capacitor is output as the second voltage.

(2) A delay circuit, wherein a delay time is provided which is given as:

$$R \times (g1/g2) \times C$$

where R is a resistance of the resistor element, g1 is a conductance of the first MOS transistor, g2 is a conductance of the second MOS transistor, and C is a capacitance of the capacitor.

(3) A delay circuit similar to the delay circuits described in the paragraphs (1) and (2), and characterized in that the first supply voltage is positive with respect to the second voltage when the first and second MOS transistors are p-channel MOS transistors, and the second supply voltage is positive with respect to the first supply voltage when the first and second MOS transistors are n-channel MOS transistors.

(4) A delay circuit further comprises means for operating only in the active state.

(5) A delay circuit in which the constant-voltage generating section includes means for generating a plurality of different voltages, any one of which is used as the first voltage, and which further comprises switching means for receiving the different voltages applied from the constant-voltage generating section and a command signal, for selecting and at least one of the different voltages and for applying the voltage selected to the constant-current generating section.

(6) A delay circuit, in which the constant-current generating section includes first to Nth constant-current generators (N≧2), and which further comprises switching means for receiving N voltages generated by the first to Nth constant-voltage generators, any one of which is used as the second voltage, and for selecting at least one of the N voltages and applying the voltage selected to the capacitor.

(7) A delay circuit similar to the delay circuits described in the paragraphs (5) and (6), and characterized in that the constant-voltage generating section a first MOS transistor having a source connected to the second supply voltage, a gate connected to a first node, and a drain, and a divisional-connected resistor element connected in series between the first node and the first supply voltage; the constant-current generating section has at least one second MOS transistor having a source connected to the first supply voltage, a gate connected to the division point of the resistor element and a drain connected to one end of the capacitor; and the amplifier circuit amplifies a different between a voltage at the first node or the division point of the resistor element and the second voltage applied to the capacitor.

According to the present invention, there is provided a second delay circuit characterized in that the constant-voltage generating section includes means for generating a plurality of different voltages, any one of which is used as the first voltage; and the amplifier circuit includes first to Nth amplifiers (N≧2), thereby a plurality of delay signals are output for the input signal.

The following are preferred embodiments of the second delay circuit according to the present invention:

(1) A delay circuit, wherein the constant-voltage generating section outputs a plurality of the first voltage by means of resistance division.

(2) A circuit, wherein the capacitor and the constant-current generating section include first to Nth capacitors and first to Nth constant-current generators (N≧2). In addition, the first capacitor supplies the second voltage to the first amplifier in accordance with the input signal, and the (n+1)th capacitor (1≦n≦N−1) applies the second voltage to the (n+1)th amplifier in accordance with the output of the nth amplifier.

(3) A delay circuit, wherein the constant-voltage generating section a first MOS transistor having a source connected to the first supply voltage, a gate connected to a first node, and a drain, and a divisional-connected resistor element connected in series between the first node and the second supply voltage; the constant-current generating section has at least one second MOS transistor having a source connected to the first supply voltage, a gate connected to the division point of the resistor element and a drain connected to one end of the capacitor; and the amplifier circuit amplifies a different between a voltage at the first node or the division point of the resistor element and the second voltage applied to the capacitor.

(4) A delay circuit similar to the delay circuit described in the paragraph (3), and characterized in that the first supply voltage is positive with respect to the second voltage when the first and second MOS transistors are p-channel MOS transistors, and the second supply voltage is positive with respect to the first supply voltage when the first and second MOS transistors are n-channel MOS transistors.

In the first delay circuit according to the present invention, the second voltage generated by the constant-current generator and the capacitor changes in proportion to the change in the difference between the first voltage generated by the constant-voltage generator and the supply voltage. The delay time is, therefore, determined by the constant R specific to the constant-current generator and the capacitance C of the capacitor, and is not influenced by changes in the supply voltage. The delay time remains unchanged even if the supply voltage fluctuates.

The delay time T of the first delay circuit is determined by the resistance r, the capacitance c and the ratio α between the conductances of two p-channel transistors. Alternatively, the delay time T is determined by the resistance r, the capacitance c and the ratio β between the conductances of two n-channel transistors. Hence, the delay circuit not only has a delay time stable despite the changes in the supply voltage, the threshold voltage or the conductances of the transistors, but also occupies only a small area and consumes a small amount of power.

In the second delay circuit according to the present invention, the constant-voltage generator generates a plurality of constant voltages, and there are provided a plurality of constant-current generators, a plurality of capacitors, and a plurality of amplifiers. The second delay circuit can therefore provide a plurality of different delay times. The second delay circuit need not have as many delay units as the delay times it provides. Rather, it can provide different delay times by using a relatively small number of additional circuit elements, and it occupies but a small element area.

As described above, the first delay circuit according to the invention comprises a current-accumulating and an amplifier circuit. The storage circuit includes a constant-current generating section for generating the first voltage; a constant-current generating section for generating a current proportional to the difference between the first voltage and the first supply voltage; and a capacitor for accumulating the constant current to generated a second voltage. The amplifier circuit amplifies the difference between the first voltage and the second voltage. Therefore, the delay circuit not only has a delay time stable despite the changes in the supply voltage, the ground voltage or the conductances of the transistors, but also occupies only a small area and consumes a small amount of current.

As described above, the second delay circuit according to the invention comprises a constant-current generating section capable of generating a plurality of voltages, a plurality of constant-current generating circuits of the type used in the first delay circuit, a plurality of capacitors of the type used in the first delay circuit, and a plurality of amplifier circuits. Although comprising a small number of circuit components, the delay circuit can provide a plurality of delay times. Because of the small number of components, the delay circuit can have a relatively small element area.

The oscillator circuit according to the present invention may have a structure which is similar to the delay circuits described above.

To be more specific, a first oscillator circuit according to the invention comprises: a voltage-generating circuit for generating a first voltage and a second voltage; a capacitor having one end connected to one of a first power source and a second power source; a first amplifier for receiving the first voltage and a output voltage of another end of the capacitor and for amplifying and outputting a first difference voltage which is a difference between the first voltage and the output voltage of another end of the capacitor; a second amplifier for receiving the second voltage and the voltage of another end of the capacitor and for amplifying and outputting a second difference voltage which is a difference between the second voltage and the voltage of another end of the capacitor; and a selection circuit for alternately charging and discharging the capacitor in accordance with the first and second difference voltages.

Another oscillator circuit similar to the first described above, in which the voltage-generating circuit includes a circuit for generating first and second currents proportional to the difference between the first and second voltages, respectively, and the selection circuit outputs the first and second currents alternately to the capacitor, in accordance with outputs of the first and second amplifiers.

A oscillating circuit according to the invention further comprises: a voltage-dividing circuit connected between first and second power supply terminals, for generating first and second divided voltages corresponding to first and second supply voltages, respectively; a capacitor having a first terminal connected to the first supply voltage and a second terminal; a resistor having first terminal connected to the second terminal of the capacitor; and first and second amplifier circuits for comparing a voltage at the second terminal of the capacitor with the first divided voltage and with the second divided voltage, thereby to amplifying and outputting first and second difference voltages, in which the selection circuit includes means for alternatively connecting a second end of the resistor with the first power source and the second power source in accordance with the first and second amplifier circuits.

A second oscillator circuit according to the invention comprises: a voltage-generating circuit for generating a constant voltage; first and second capacitors to be charged and discharged; and a selection circuit for comparing the constant voltage with a voltage at a storage node of the first capacitor and with a voltage at a storage node of the second capacitor, thereby to charge and discharge the first capacitor and the second capacitor alternately, in accordance with a difference between the constant voltage and the voltage at a storage node of the first capacitor and a difference between the constant voltage and the voltage at a storage node of the second capacitor.

An oscillator circuit similar to the second oscillator circuit, in which the voltage-generating circuit includes a circuit for generating first and second constant currents in accordance with the constant voltage, and the selection circuit selects the first and second constant currents alternately through the first and second capacitors, in accordance with the first and second difference voltages.

An oscillator circuit similar to the second oscillator circuit, in which the constant voltage is a divided voltage of the supply voltage, and one end of the first and second capacitors are connected to one end of the first and second registers, respectively.

In the oscillator circuit according to the invention, the voltage across capacitor is compared with each of two different voltages, and the capacitor is alternately charged and discharged in accordance with the difference between the capacitor voltage and either different voltage, whereby the oscillator circuit performs its function. Further, the voltage of each of two capacitors is compared with one reference voltage, and the capacitors are alternately charged and discharged in accordance with the reference voltage, whereby the oscillator circuit performs its function.

The oscillator circuit is influenced by neither the changes in the supply voltage nor the changes in the characteristics of the transistors used, and can have a stable oscillating frequency.

The semiconductor device according to the present invention comprises: a memory unit for storing data; an oscillator circuit having an oscillating frequency which depends on a supply voltage; and a charge pump circuit having a charge pumping ability which depends on a driving frequency, for raising the supply voltage when driven by the oscillator circuit, thereby to generate a voltage required to write into the memory unit and erase data from the memory unit, wherein the oscillator circuit includes a delay circuit comprising a constant-current generating circuit for generating a constant current, a capacitor connected at one end to the constant-current generating circuit when an input signal is inverted, a reference-voltage generating circuit for generating a reference voltage, a difference between the reference voltage and a voltage at one end of the capacitor until the input signal is inverted increasing with the supply voltage, and an amplifier circuit for amplifying and outputting a difference between the voltage at the one end of the capacitor and the reference voltage.

The following are preferred embodiments of the semiconductor memory device:

(1) A semiconductor memory device in which the memory unit has a plurality of FETMOS nonvolatile memory cells. In addition, the memory unit has an EEPROM which comprises a plurality of NAND-type cells each having the plurality of memory cells connected in series.

(2) A semiconductor memory device in which the oscillator circuit includes: a first delay circuit comprising a first constant-current generating circuit for generating a constant current, a first capacitor which is connected at one end to the first constant-current generating circuit when an input signal is inverted, and a first amplifier circuit for amplifying and outputting a difference between a voltage at one end of the first capacitor and a reference voltage, a difference between the reference voltage and a voltage at one end of the capacitor until the input signal is inverted increasing with the supply voltage; a second delay circuit comprising a second constant-current generating circuit for generating a constant current, a second capacitor which is connected at one end to the second constant-current generating circuit when the input signal is inverted, and a first amplifier circuit for amplifying and outputting a difference between a voltage at one end of the second capacitor and the reference voltage; and a sequential logic circuit for outputting data representing an order in which the outputs of the first and second amplifier circuits are to be output, to the first and second delay circuits.

(3) A semiconductor memory device which the constant-current generating circuit comprises a first MOS transistor having a gate, a source and a drain connected to the gate, a resistor element connected in series to the first MOS transistor, and a second MOS transistor having a gate connected to an output of the reference-voltage generating circuit which outputs a voltage at the gate of the first MOS transistor, a drain selectively connected to one end of the capacitor, together with a first power-source terminal.

In the semiconductor device, the current-drivability of the charge pump circuit decreases as the supply voltage falls. Nonetheless, the decrease of the current-drivability is compensated by the oscillating frequency of the oscillator circuit, which increases as the supply voltage falls. As a result, the charge pump circuit has current-drivability which is independent of the supply voltage. The memory device does not waste power in writing and erasing data, even if the supply voltage fluctuates.

Having a constant-current generating circuit, the oscillator circuit has an oscillating frequency which is influenced neither by changes in the conductances or threshold voltages of the transistors used nor by changes in temperature. This also serves to reduce waste of power.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 7 is a block diagram showing the basic structure of a delay circuit according first embodiment of the present invention;

FIGS. 8A and 8B are block diagrams illustrating the basic structure of a delay circuit according to a second embodiment of the invention;

FIG. 9 is a circuit diagram of a delay circuit which is a third embodiment of the invention;

FIG. 10 is a timing chart showing the waveforms of the input voltage Vin and output voltage Vout of the circuit shown in FIG. 9, and also the waveforms of the voltage Vcap and constant voltage Vref applied to the inverting and non-inverting input terminals of the amplifier incorporated in the circuit;

FIG. 11 is a circuit diagram of a delay circuit according to a fourth embodiment of this invention;

FIG. 12 is a circuit diagram of a delay circuit according to a fifth embodiment of the invention;

FIG. 14 is a circuit diagram showing a delay circuit which is a sixth embodiment of the present invention;

FIG. 19 is a circuit diagram of the delay circuit shown in FIG. 18;

FIG. 20 is a timing chart explaining how the delay circuit of FIG. 18 performs its function;

FIG. 21 is block diagram of a delay circuit which is a ninth embodiment of the present invention;

FIG. 23 is a circuit diagram showing in detail the delay circuit of FIG. 21;

FIG. 24 is a timing chart explaining the operation of the delay circuit of FIG. 21;

FIG. 25 is a block diagram depicting the basic structure of a delay circuit according to a tenth embodiment of the invention;

FIG. 26 is a circuit diagram of the delay circuit shown in FIG. 25;

FIGS. 27A and 27B are timing charts explaining the operation of the delay circuit of FIG. 25;

FIG. 28 is a block diagram depicting the basic structure of a delay circuit according to an eleventh embodiment of the present invention;

FIGS. 30A and 30B are timing charts explaining the operation of the delay circuit of FIG. 29;

FIGS. 33A, 33B and 33C are timing charts explaining the operation of the delay circuit of FIG. 31;

FIG. 34 is a block diagram depicting the basic structure of a delay circuit which is a thirteenth embodiment of the present invention;

FIG. 35 is a circuit diagram of the delay circuit shown in FIG. 34;

FIG. 36 is a timing chart for explaining how the delay circuit of FIG. 34 operates ;

FIG. 37 is a circuit diagram of an oscillator which is a fourteenth embodiment of the invention;

FIG. 38 is a circuit diagram of an oscillator which is a fifteenth embodiment of the invention;

FIG. 39 is a circuit diagram showing an oscillator which is a sixteenth embodiment of the present invention;

FIG. 41 a circuit diagram of an oscillator which is a seventeenth embodiment of the invention;

FIG. 42 is a timing explaining the operation of the oscillator shown in FIG. 41;

FIG. 43 is a circuit diagram showing an oscillator which is an eighteenth embodiment of this invention;

FIG. 44 is a timing explaining the operation of the oscillator shown in FIG. 43;

FIG. 45 is a circuit diagram of an oscillator which is a nineteenth embodiment of the present invention;

FIG. 46 is a timing explaining the operation of the oscillator shown in FIG. 45;

FIG. 47 is a circuit diagram of an oscillator which is a twentieth embodiment of the present invention;

FIG. 48 is a timing explaining the operation of the oscillator shown in FIG. 47;

FIG. 49 is a circuit diagram of an oscillator which is a twenty-first embodiment of the present invention;

FIG. 50 is a timing explaining the operation of the oscillator shown in FIG. 49;

FIG. 51 is a block diagram of a nonvolatile semiconductor memory according to the present invention;

FIGS. 57A and 57B are circuit diagrams showing a charge pump circuit according to a twenty-third embodiment of the invention;

FIG. 58 is a timing chart illustrating signals for driving the charge pump circuit of FIGS. 57A and 57B;

FIGS. 59A and 59B are circuit diagram illustrating an oscillator according to the invention;

FIGS. 60A and 60B are circuit diagrams showing a first example of the oscillator;

FIGS. 62A and 62B are circuit diagram illustrating the circuit for generating signals for driving the charge pump circuit of FIGS. 55A and 55B;

FIGS. 63A and 63B are circuit diagram showing a constant voltage generating section of a first type;

FIG. 64 is a block diagram of a charge pump circuit incorporating a constant-voltage generator of the first type;

FIG. 65 is a block diagram of a charge pump circuit incorporating a constant-voltage generator of the second type;

FIG. 66 is a block diagram of a charge pump circuit incorporating a constant-voltage generator of the third type;

FIG. 69 is a circuit diagram depicting a fourth example of the oscillator;

FIG. 70 is a timing chart representing the waveforms of the voltages at the major nodes in the oscillator of FIG. 69;

DETAILED DESCRIPTION OF THE PREFERRED EMBODIMENTS

Figure 1:
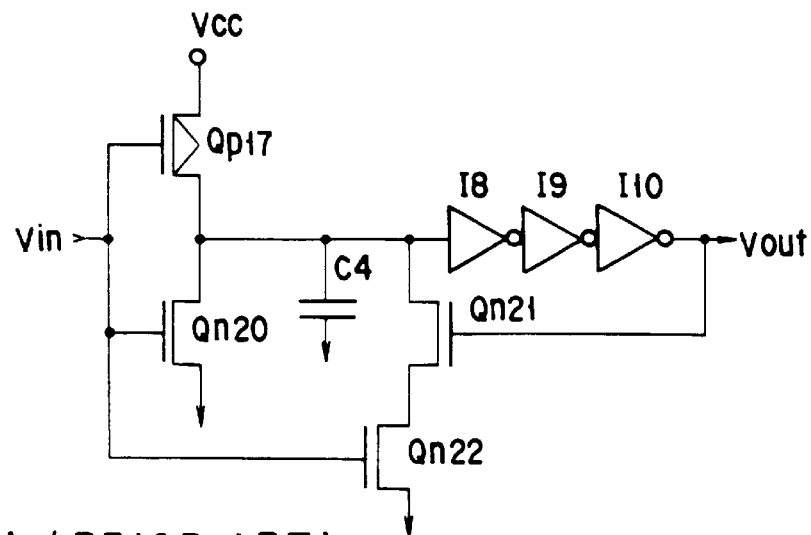
FIG. 1 is a circuit diagram showing a delay circuit.

Embodiments of the present invention will now be described, with reference to the accompanying drawings.

FIG. 7 shows the basic structure of a delay circuit according the first embodiment of the invention.

The delay circuit comprises a storage circuit 10 and an amplifier 20. An output of the storage circuit 10 is supplied to the amplifier 20.

The storage circuit 10 has a constant-voltage generator 11, a constant constant-current generator 12 and a capacitor 13. The constant-voltage generator 11 is rendered active by an inverted input signal, generating a constant voltage. The constant-current generator 12 generates a current which is proportional to the difference between the constant voltage and the supply voltage. The capacitor 13 accumulates the current the generator 12 has generated. The capacitor 13 has its first node connected to the ground (or the power source and its second node connected to the constant-current generator section 12. The capacitor 13 is charged to the ground voltage or supply voltage while the storage circuit 10 remains in standby state.

The output (first potential) of the constant-voltage generator section 11 is supplied, as a positive output, to the non-inverting input terminal of the amplifier 20. The voltage (second potential) at the second node of the capacitor 13 is applied, as a negative output, to the inverting input terminal of the amplifier 20.

When the signal supplied to the storage circuit 10 is inverted in its logic value, the constant voltage, i.e., the output of the constant-voltage generator section 11, is applied to the positive output terminal of the storage circuit 10. The potential at the second node of the capacitor 13, which is charged by the current proportional to the difference between the constant voltage and the supply voltage, is applied to the negative output terminal of the storage circuit 10. The positive and negative outputs of the circuit 10 are supplied to the non-inverting and inverting input terminals of the amplifier 20, respectively. The amplifier 20 amplifies the voltage which is the potential difference between the non-inverting and inverting input terminals of the amplifier 20.

The current proportional to the difference between the constant voltage and the supply voltage is represented as |Vref−Vs|/R, where Vref is the constant voltage output from the circuit 10, Vs is the supply voltage, and R is the constant specific to the constant-current generator 12. The delay time T of the delay circuit is given as RC, since the potential of the storage node of the capacitor varies from an initial value Vs to terminal value Vref, where C is the capacitance of the capacitor 13. The constant R is not influenced by the supply voltage or the threshold voltage of the transistors provided in the generator 12. Hence, the delay time T changes only with the fluctuation of R and C, not depending on the supply voltage Vs.

In the first embodiment described above, since the second potential obtained by the generator 12 and the capacitor 13 varies in proportion to the change in the difference between the supply voltage Vs and the first potential generated by the generator 11, the constant R specific to the generator 12 and not depending on the voltage Vs and the capacitance C of the capacitor 13 determines the delay time T. The delay time T remains unchanged should the supply voltage Vs vary.

FIGS. 8A and 8B respectively illustrate the basic structures of a delay circuit according to a second embodiment of the present invention. The components similar or identical to those of the first embodiment are designated at the same numerals in FIG. 8 and will not be described in detail.

As is seen from FIGS. 8A and 8B, the input signal is supplied to both the storage circuit 10 and the amplifier 20, whereas an input signal is supplied to only the circuit 10 in the first embodiment. In FIG. 8B, the output signal is supplied to both the storage circuit 10 and the amplifier 20 to constitute the feedback loop.

By the above structure, the amplifier 20 need not be activated all the time the delay circuit operates and thus is one example of a means for operating only in the active state. Rather, the circuit 20 needs to be activated only when the input signal is inverted in its logic value in the case of FIG. 8A. Furthermore, in case of FIG. 8B, both the circuit 20 and circuit 10 are activated only in the period since the input signal is inverted in its logic value until the output signal is inverted in its logic value. This reduces the power consumption of the delay circuit.

FIG. 9 illustrates a delay circuit which is the third embodiment of the invention. As can be seen from FIG. 9, the delay circuit comprises a storage circuit 10, shown in detail, and an amplifier 20.

An input signal Vin is supplied to the gate of a p-channel transistor Qp3, the gate of an n-channel transistor Qn1 and an inverter I1. The source of the transistor Qp3 is connected to the power source Vcc. The source of the transistor Qn1 is connected to the ground. The drain of the p-channel transistor Qp3 is connected to the gates of two p-channel transistors Qp1 and Qp2 both having their sources connected to the power source Vcc. The gate and drain of the p-channel transistor Qp1 are connected together. Resistors R1 and R2 are connected in series between the drain of the n-channel transistor Qp1 and the drain of the n-channel transistor Qn1. The node of the resistors is connected to the non-inverting input terminal of the amplifier 20.

The output of the inverter I1 is supplied to the gate of an n-channel transistor Qn2 which is connected between the ground and the drain of the p-channel transistor Qp2. The drain of the transistor Qn2 is connected to the second node of a capacitor C and to the non-inverting input terminal of the amplifier 20. The first node of the capacitor C is connected to the power source Vcc.

The delay circuit remains in standby state while the input signal Vin is at low level. The signals supplied to the inverting and non-inverting input terminals of the amplifier 20 are at high level and low level, respectively. As a result, the output of the amplifier 20, i.e., the output signal Vout of the delay circuit, is at low level. When the input signal Vin changes from low level to high level, the delay circuit is set into active state. Then, a constant voltage Vref is applied to the inverting input terminal of the amplifier 20. The voltage Vref is determined by the current-drivability of the p-channel transistor Qp1 and the resistances of the resistors R1 and R2.

The current-drivability of the n-channel transistor Qn1 has been set at a sufficient great value. The p-channel transistor Qp2 keeps operating in saturated region until its drain voltage, i.e., the voltage Vcap applied to the non-inverting input terminal of the amplifier 20, becomes equal to its the gate voltage. The current flowing through the transistor Qp2 becomes constant since the constant voltage Vref is lower than the gate voltage of the p-channel transistor Qp2. The voltage Vcap applied to the non-inverting input terminal of the amplifier 20, therefore, increases with time. When the voltage Vcap increases above the constant voltage Vref, the output of the amplifier 20 rises from low level to high level.

The constant voltage Vref, the current Iref flowing through the p-channel transistor Qp1, and the current Icap flowing through the p-channel transistor Qp2 are given as follows:

$$Vref = Vgp \times r2/(r1+r2) \qquad (1)$$

$$Iref = Vgp/(r1+r2) \qquad (2)$$

$$Icap = Iref \times gm2/gm1 \qquad (3)$$

where Vgp is the gate voltage of the transistor Qp1, r1 is the resistance of the resistor R1, r2 is the resistance of the resistor R2, gm1 is the conductance of the transistor Qp1, and gm2 is the conductance of the transistor Qp2.

The delay time T, namely the period between the time the input signal Vin rises to high level and the time the output signal Vout falls to low level, is:

$$T = c \times Vref/Icap \qquad (4)$$

$$= \alpha \times r2 \times c$$

$$\alpha = gm1/gm2 \qquad (5)$$

where c is the capacitance of the capacitor C.

Hence, the delay time T depends on neither the supply voltage nor the threshold voltages of the p-channel transistors. Generally, the longer the delay time of a delay circuit, the larger the area which the delay circuit occupies. In Equation (4), $$\alpha > 1 \qquad (6)$$

Figure 2:
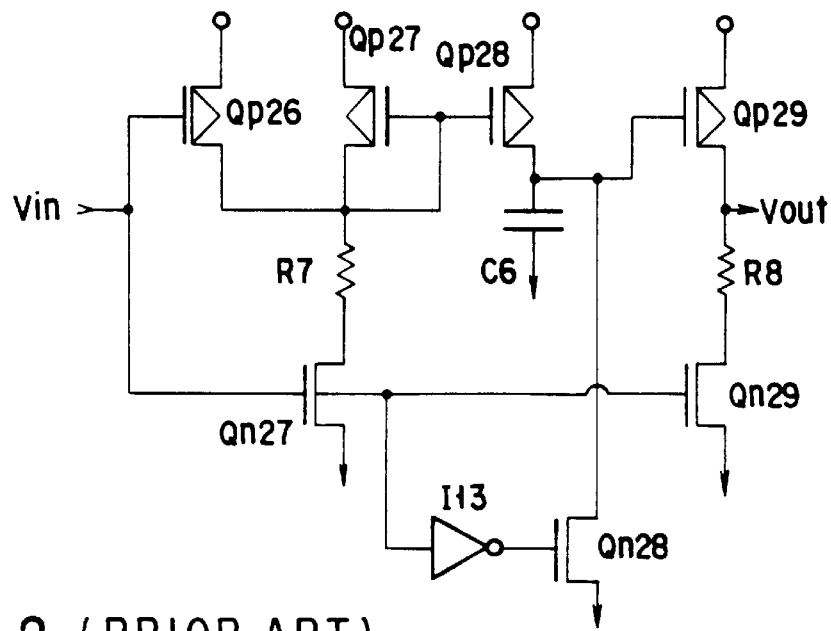
FIG. 2 is a circuit diagram illustrating another delay circuit.
Figure 3:
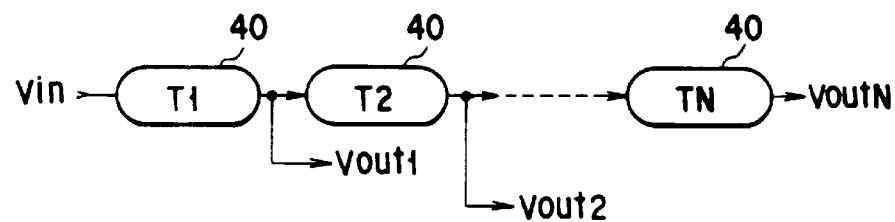
FIG. 3 is a circuit diagram of a delay circuit which provides a plurality of delay times.
Figure 4:
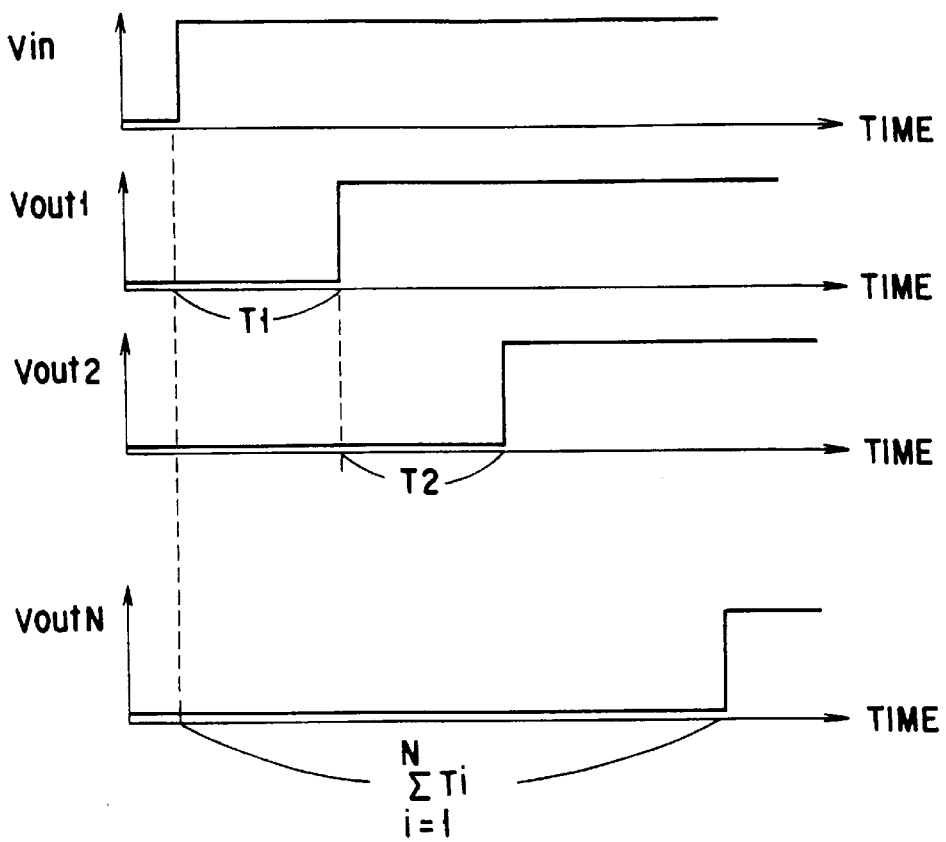
FIG. 4 is a timing chart illustrating the waveforms of the input voltage and output voltages of the delay circuit shown in FIG. 3.
Figure 5:
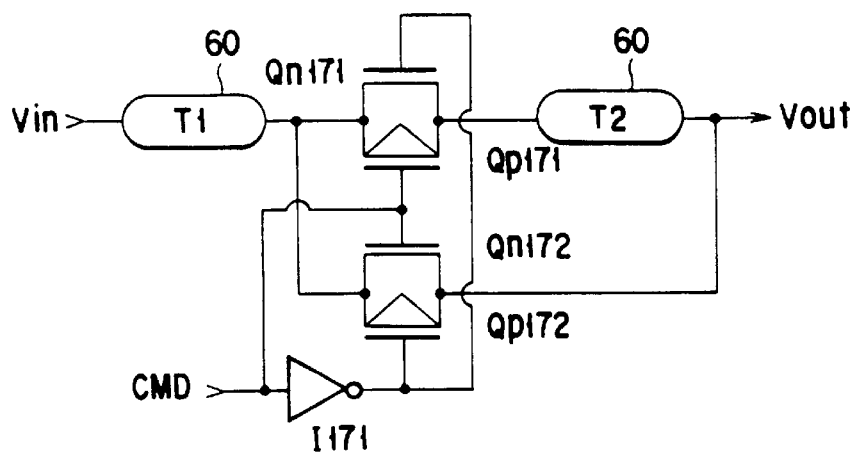
FIG. 5 is a circuit diagram of a another delay circuit which provides a plurality of delay times.
Figure 6A:
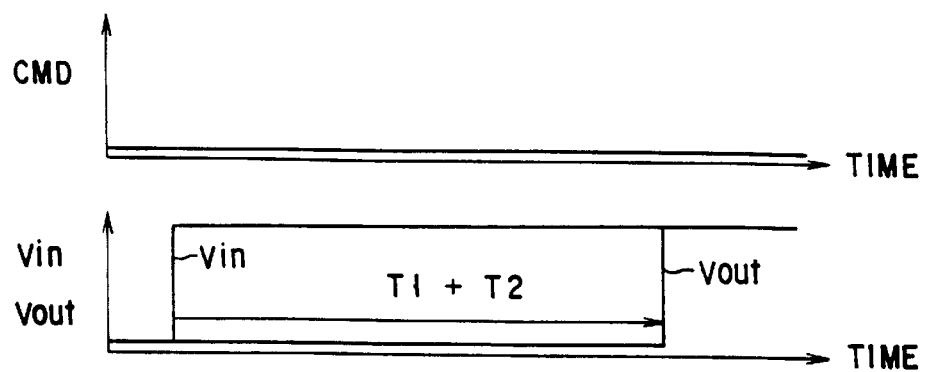
FIGS. 6A and 6B are timing charts illustrating the waveforms of the input and output voltage of the delay circuit shown in FIG. 5.
Figure 6B:
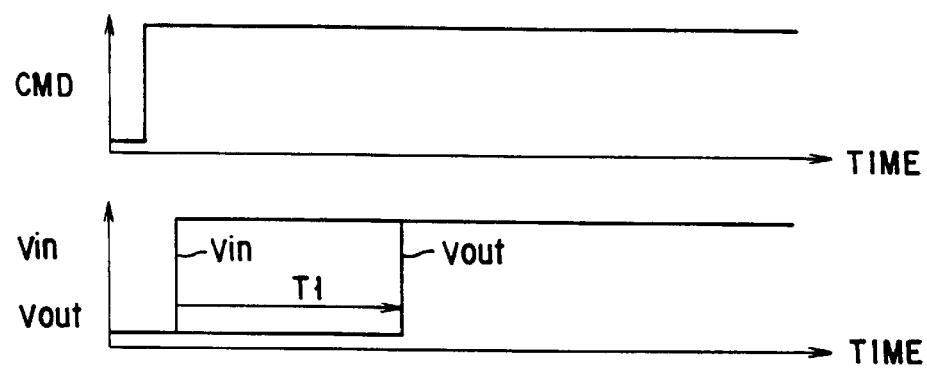

Therefore, the area the delay circuit of the present invention occupies is smaller than the area occupied by the delay circuit which comprises a resistor and a capacitor and whose delay time is the product of the resistance of the resistance and the capacitance of the capacitor. Furthermore, the delay circuit of the invention has but a smaller through current than the delay circuit shown in FIG. 2, assuming that it has occupies the same area as does the circuit. FIG. 10 shows the waveform of the input voltage Vin, the waveform of the output voltage Vout, the waveform of the voltage Vcap, and the waveform of the constant voltage Vref.

FIG. 11 illustrates a delay circuit according to the fourth embodiment of this invention. As shown in FIG. 11, this delay circuit comprises a storage circuit 10, shown in detail, and an amplifier 20.

The storage circuit 10 comprises p-channel transistors Qp3, Qp4, Qp9 and Qp10, a resistor R3, and n-channel transistors Qn3, Qn4 and Qn10. The amplifier 20 comprises p-channel transistors Qp5, Qp6, Qp7, Qp8 and Qp11, n-channel transistors Qn5, Qn6, Qn7, Qn8 and Qn9, and inverters I3, I4 and I5.

The delay circuit remains in standby state while the input signal Vin is at low level. The p-channel transistor Qp4 is therefore in on state, whereas the p-channel transistors Qp3 and Qp10 are in off state. Since the p-channel transistor Qp3 is in off state, no through current flows in the storage circuit 10. Since the n-channel transistors Qn7 and Qn8 are in off state and the p-channel transistor Qp11 fixes the input voltage of the inverter I3 at the supply voltage, no through current flows in the amplifier 20.

The n-channel transistor Qn4 and the p-channel transistor Qp5 are in on state, while the n-channel transistor Qn9 and the p-channel transistor Qp6 are in off state. The p-channel transistor Qp9 functions as a capacitor while the delay circuit stays in standby state. The n-channel transistor Qn10 is used to set the gate of the p-channel transistor Qp9 at the ground potential.

When the input signal Vin rises from low level to high level, the p-channel transistors Qp4 and Qp11 and the n-channel transistors Qn10 are turned off, whereas the p-channel transistor Qp6 and the n-channel transistors Qn3, Qn7 and Qn8 are turned on. The input voltage Vref of the amplifier 20 assumes a constant value which differs from the supply voltage.

When the p-channel transistor Qp9, which functions as a capacitor, is charged, lowering the input potential of the inverter I3 from high level to low level, the output signal Vout rises from low level to high level. The n-channel transistor Qn9 is thereby turned on, and the n-channel transistor Qn4 and the p-channel transistor Qp5 are thereby turned off. Hence, no through current flows in the storage circuit 10 or the amplifier 20 after the output signal Vout has risen to high level. The inverter I3 and the n-channel transistors Qn8 and Qn9 latch the input and output potentials at low and high level, respectively, and latch the output signal Vout at high level, until the input signal Vin falls to low level.

The current accumulated in the p-channel transistor Qp9 by means of the p-channel transistor Qp10 is proportional to the current flowing through the resistor R3. The proportional coefficient involved is the ratio of the conductance of the p-channel transistor Qp10 to the conductance of the p-channel transistor Qp3. The current flowing through the resistor R3 is proportional to the input voltage Vref of the amplifier 20, provided that the drain voltage of the n-channel transistor Qn3 is held at the ground level, regardless of the gate voltage.

Thus, the transistor Qp9 can be charged with the current proportional to the input voltage Vref of the amplifier 20 even if the input voltage Vref changes due to the fluctuation of either the supply voltage or the conductances of the p-channel transistors. As a result, the delay circuit has a delay time which is constant, not influenced by changes in the supply voltage or the conductances of the p-channel transistors.

In order to reduce the area the delay circuit occupies, it is necessary to decrease the area occupied by the major components (i.e., the resistor R3, the p-channel transistors Qp3 and Qp10, and the p-channel transistor Qp9). The total area the resistor R3 and the transistor Qp9 occupy can be reduced merely by selecting a sufficiently small value for the ratio of the conductance of p-channel transistor Qp10 to that of the p-channel transistor Qp3.

The p-channel transistor Qp9 is connected at one end to the power source so that it may not make an error even if the supply voltage has noise. Since the conductance of the p-channel Qp3 is sufficiently greater than the conductance of the resistor R3, the input voltage Vref of the amplifier 20 and the gate voltage Vcap of the transistor Qp9 are synchronously amplified by the same magnitude as the noise in the supply voltage. Hence, the delay circuit makes no errors in operation. The delay circuit does not make an error even if the ground voltage contains noise. This is because neither the input voltage of the amplifier 20 nor the gate voltage Vcap of the transistor Qp9 is influenced by the noise in the ground voltage.

FIG. 12 shows a delay circuit according to which is the fifth embodiment of the invention. As depicted in FIG. 12, the delay circuit comprises a storage circuit 10 and an amplifier 20. Of these components, the storage circuit 10 is illustrated in detail in FIG. 12.

The delay circuit remains in standby state while the input signal Vin is at low level. In this condition, a signal at high level is supplied to the inverting input signal terminal of the amplifier 20, and a signal at low level to the non-inverting input terminal of the amplifier 20. The output signal Vout of the amplifier 20, i.e., the output of the delay circuit, is therefore at low level. When the input signal Vin rises from low level to high level, a constant voltage Vref is applied to the non-inverting input terminal of the amplifier 20. The constant voltage Vref is determined by the current-drivability of an n-channel transistor Qn80 and the resistance of the resistor R80. The current-drivability of the n-channel transistor Qn80 is set at a sufficiently great value.

A voltage Vcap is applied to the inverting input terminal of the amplifier 20. The voltage vcap is the drain voltage of an n-channel transistor Qn81. Until the voltage Vcap becomes equal to the gate voltage of the n-channel transistor Qn81, the n-channel transistor Qn81 operates in saturated region. The current flowing in the n-channel transistor Qn81 becomes constant, and the voltage Vcap applied to the inverting input terminal of the amplifier 20 decrease with time. When the voltage vcap decreases to a value less than the constant voltage Vref, the output voltage Vout of the amplifier 20 rises from low level to high level.

The current Iref flowing in the n-channel transistor Qn80 and the current flowing in the n-channel transistor Qn81 are represented as follows:

$$Iref = (Vcc - Vref)/r80 \quad (7)$$

$$Icap = Iref \times gm81/gm80 \quad (8)$$

where Vcc is the supply voltage, r80 is the resistance of the resistor 80, gm80 is the conductance of the transistor Qn80, and gm81 is the conductance of the transistor Qn81.

The delay time T which lapses, namely the period between the time the input signal Vin rises to high level and the time the output signal Vout falls to low level, is:

$$T = c80 \times (Vcc - Vref)/Icap \quad (9)$$

$$= \beta \times r80 \times c80$$

$$\beta = gm80/gm81 \quad (10)$$

where c80 is the capacitance of the capacitor C80.

Hence, the delay time T depends on neither the supply voltage nor the threshold voltages of the p-channel transistors. Generally, the longer the delay time of a delay circuit, the larger the area which the delay circuit occupies. In Equation (9), $$\beta > 1 \quad (11)$$

Figure 13A:
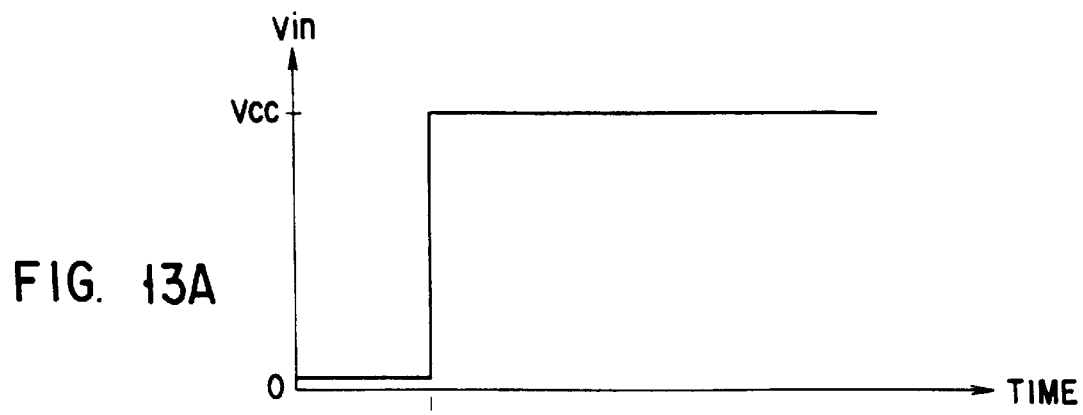
FIG. 13A is a timing chart representing the waveform of the input voltage Vin of the delay circuit shown in FIG. 12.
Figure 13B:
FIG. 13B is a timing chart showing the waveform of the output voltage Vout of the input voltage Vout of the delay circuit shown in FIG. 12.
Figure 13C:
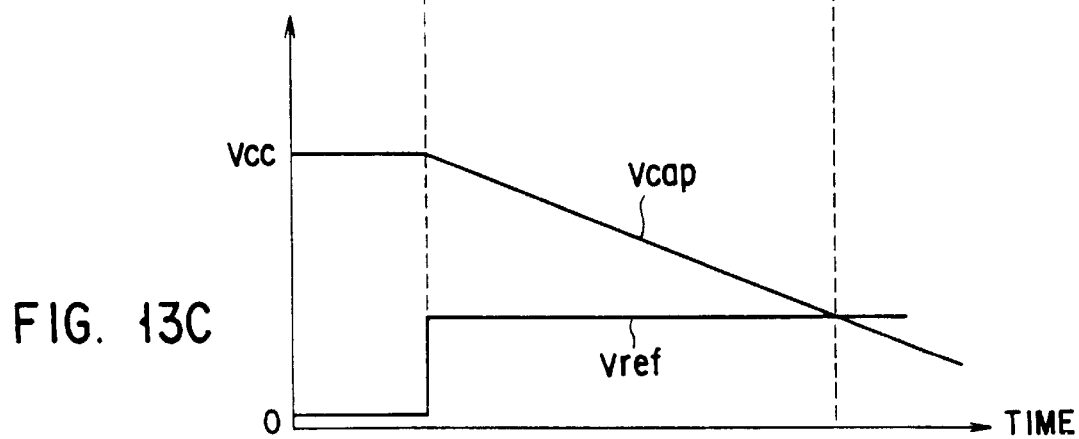
FIG. 13C is a timing chart showing the waveforms of the constant voltage Vref and voltage Vcap applied to the inverting and non-inverting input terminals of the amplifier incorporated in the delay circuit of FIG. 12.

Therefore, the area the delay circuit of the present invention occupies is smaller than the area occupied by the delay circuit which comprises a resistor and a capacitor and whose delay time is the product of the resistance of the resistance and the capacitance of the capacitor. The delay circuit according to the invention is advantageous, particularly when it is designed to provide a delay time longer than several microseconds. The waveform of the input voltage Vin is shown in FIG. 13B. The waveform of the output voltage Vout of the input voltage Vout is represented in FIG. 13B. The waveforms of the constant voltage Vref and the voltage Vcap are illustrated in FIG. 13C.

FIG. 14 shows a delay circuit which is the sixth embodiment of the present invention. As illustrated in FIG. 14, the delay circuit comprises a storage circuit 10 and an amplifier 20. Of these components, the storage circuit 10 is shown in detail in FIG. 14.

The storage circuit 10 comprises p-channel transistors Qp90, Qp91 and Qp92, a resistor R90, and n-channel transistors Qp90, Qn91, Qn92 and Qn93. The amplifier 20 comprises p-channel transistors Qp93, Qp94, Qp95, Qp96, Qp97 and Qp98, n-channel transistors Qn94, Qn95, Qn96 and Qn97, and inverters I91 and I92.

The delay circuit remains in standby state while the input signal Vin is at low level. The n-channel transistor Qn92 is therefore conducting, whereas the n-channel transistors Qn90 and Qn91 are in off state. Since the p-channel transistor Qp90 is in off state, no through current flows in the storage circuit 10. Since the n-channel transistor Qn96 and the p-channel transistor Qp97 are in off state and the n-channel transistor Qn97 fixes the input voltage of the inverter I91 at the ground voltage, no through current flows in the amplifier 20.

The p-channel transistor Qp91 and the p-channel transistor Qp96 are in on state, while the p-channel transistor Qp95 and the p-channel transistor Qp97 are in off state. The n-channel transistor Qn93 functions as a capacitor while the delay circuit stays in standby state. The p-channel transistor Qp92 is used to set the gate of the n-channel transistor Qn93 at the ground voltage.

When the input signal Vin rises from low level to high level, the n-channel transistors Qn92 and Qn97 and the p-channel transistors Qp90, Qp91, Qp95 and Qp97 are turned off, whereas the n-channel transistors Qn96 is turned on. The input voltage Vref of the amplifier 20 assumes a constant value which differs from the supply voltage.

when the n-channel transistor Qn93, which functions as a capacitor, is discharged, raising the input voltage of the inverter I91 from low level to high level, the output signal Vout rises from low level to high level. The p-channel transistor Qp98 is thereby turned on, and the p-channel transistors Qp91 and Qp96 are thereby turned off. Hence, no through cur rent flows in the storage circuit 10 or the amplifier 20 after the output signal Vout has risen to high level. The inverter I91 and the p-channel transistors Qp97 and Qp98 latch the input and output voltages at high and low level, respectively, and latch the output signal Vout at high level, until the input signal Vin falls to low level.

The current discharged from the n-channel transistor Qn93 by means of the n-channel transistor Qn91 is proportional to the current flowing through the resistor R90. The proportional coefficient involved is the ratio of the conductance of the n-channel transistor Qn91 to the conductance of the n-channel transistor Qn90. The current flowing through the resistor R90 is proportional to the difference between the voltage Vref of the amplifier 20 and the supply voltage Vcc, provided that the p-channel transistors Qp90 and Qp91 have such a size as to hold the drain voltage of the p-channel transistor Qp90 at the supply voltage.

Thus, the transistor Qn93 can be discharged with the current proportional to the input voltage Vref of the amplifier 20 even if the input voltage Vref changes due to the fluctuation of either the supply voltage or the conductances of the n-channel transistors. As a result, the delay circuit has a delay time which is constant, not influenced by changes in the supply voltage or the conductances of the n-channel transistors.

In order to reduce the area the delay circuit occupies, it is necessary to decrease the area occupied by the major components (i.e., the resistor R90, the n-channel transistors Qn90 and Qn91, and the n-channel transistor Qn93). The total area the resistor R90 and the transistor Qn90 and Qn91 occupy can be reduced only by selecting a sufficiently small value for the ratio of the conductance of n-channel transistor Qn91 to that of the n-channel transistor Qn90.

The n-channel transistor Qn90 is connected at one end to the power source so that it may not make an error even if the supply voltage has noise. Since the conductance of the n-channel Qn90 is sufficiently greater than the conductance of the resistor R90, the input voltage Vref of the amplifier 20 and the gate voltage Vcap of the transistor Qn90 are synchronously amplified by the same magnitude as the noise in the supply voltage. Hence, the delay circuit makes no errors in operation. The delay circuit does not make an error even if the ground voltage contains noise. This is because neither the input voltage of the amplifier 20 nor the gate voltage Vcap of the transistor Qn90 is influenced by the noise in the ground voltage.

Figure 15:
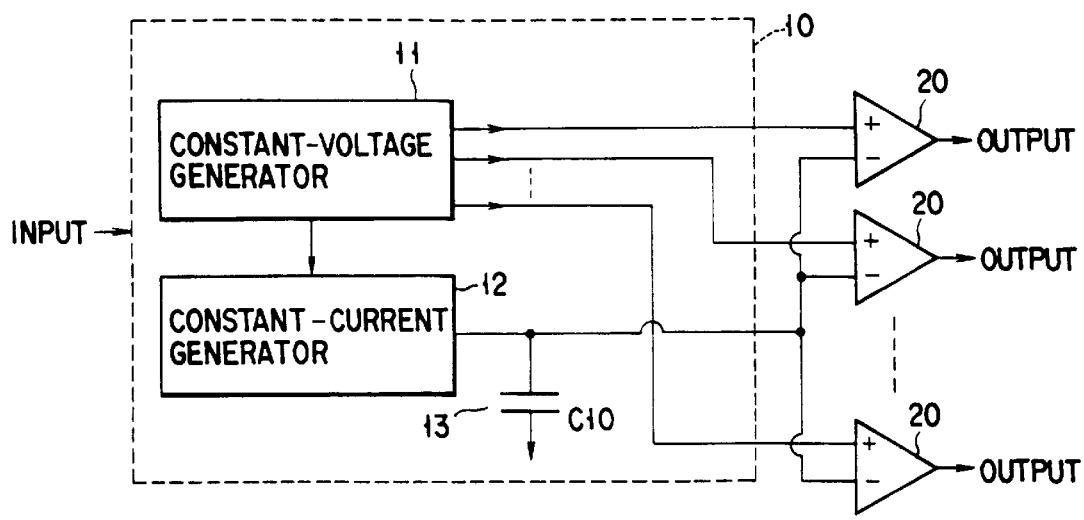
FIG. 15 is a block diagram depicting the basic structure of a delay circuit according to a seventh embodiment of the invention.

FIG. 15 shows the basic structure of a delay circuit according to a seventh embodiment of the invention. This delay circuit comprises a storage circuit 10 and a plurality of amplifiers 20.

The storage circuit 10 has a constant-voltage generator 11, a constant constant-current generator 12 and a capacitor 13 (C10). The constant-voltage generator 11 generates a plurality of constant voltages which are proportional to one another. One of the constant voltages is applied to the constant-current generator 12. The constant-current generator 12 generates a current which is proportional to the difference between the input constant voltage and a first supply voltage. The capacitor C10 accumulates the current the generator 12 has generated. Each of the amplifiers 20 amplifies the difference between one output of the constant-voltage generator 11 and the node voltage of the capacitor C10. The number of all elements constituting the delay circuit is not proportional to the number of delay times the circuit needs to provide. This is because one additional amplifier is sufficient for each additional delay time. Hence, the seventh embodiment can be comprised of a comparatively small number of elements.

Figure 16:
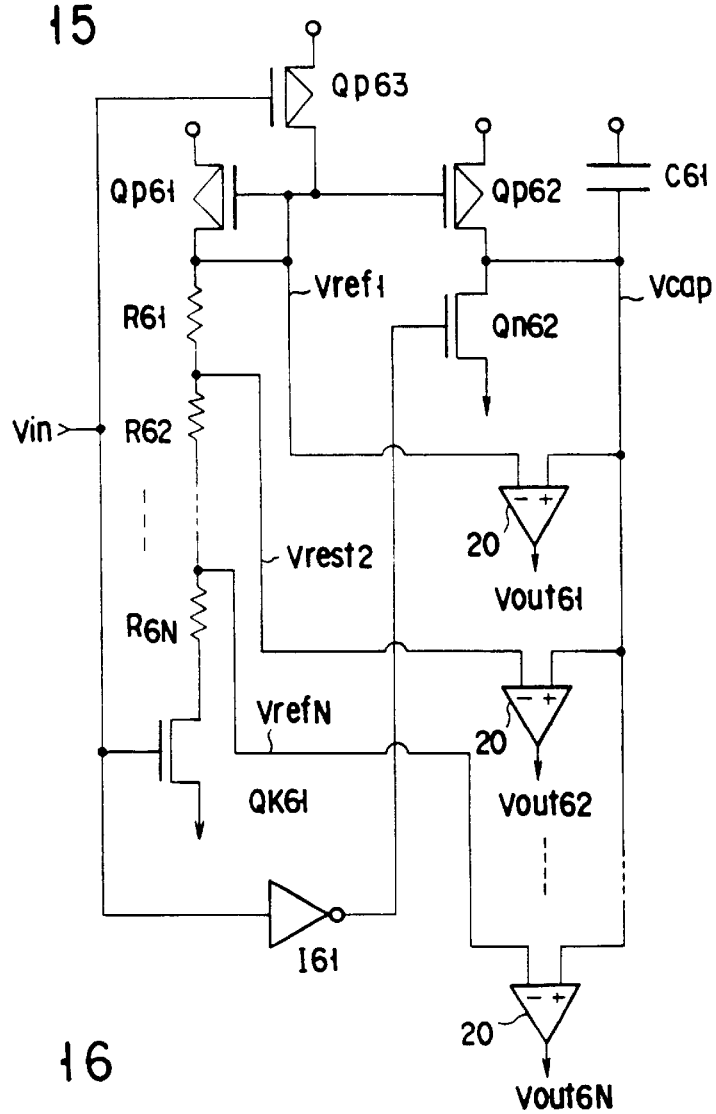
FIG. 16 is a circuit diagram showing the delay circuit according to the seventh embodiment.
Figure 17:
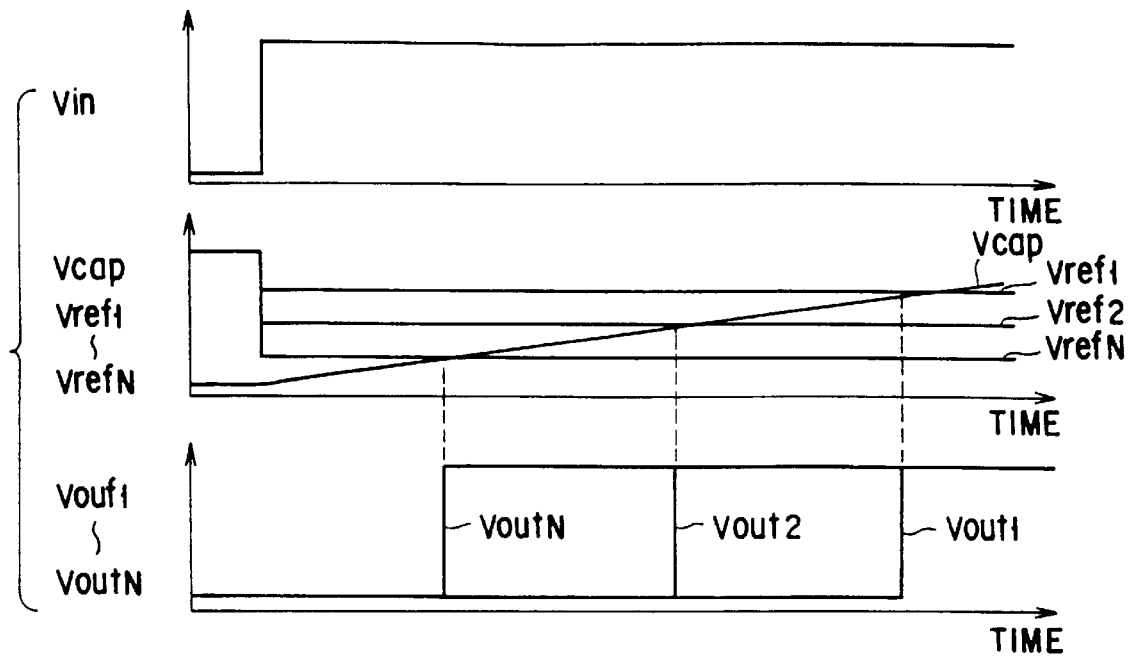
FIG. 17 is a timing chart explaining how the delay circuit of FIG. 16 performs its function.

FIG. 16 shows, in detail, the delay circuit of FIG. 16, and FIG. 17 is a timing chart explaining how the delay circuit of performs its function.

As shown in FIG. 16, the constant-voltage generator 11 has p-channel transistor Qp61, resistors R61 to R6N, and an n-channel transistor Qn61. The constant-current generator 12 comprises a p-channel transistor Qp62 which is a major component. The delay circuit remains in standby state while the input signal Vin is at low level. The p-channel transistor Qp63 is turned on, the p-channel transistor Qp62 and the n-channel transistor Qn61 are turned off, and the n-channel transistor Qn62 is turned on. The voltage Vcap at one end of the capacitor C61 is thereby set at ground level.

When the input signal Vin rises from low level to high level, the n-channel transistor Qn62 and the p-channel transistor Qp63 is turned off, whereas the p-channel transistor Qp61 and Qp62 and the n-channel transistor Qn61 are turned on. The input voltages Vref1, Vref2, . . . , VrefN of the amplifiers 20 have specific values which depend on the supply voltage. The voltage Vcap at the one end of the capacitor C61 increases with time at a constant rate. When the voltage Vcap increases to or above a value Vrefn ($1 \leq n \leq N$), the output signal Vout6N, i.e., the output voltage of the last amplifier 20, is inverted in polarity.

As may be understood from the above, with the seventh embodiment it is only necessary to add one amplifier 20 for each additional delay time. Hence, the delay circuit according to the seventh embodiment can be made of a relatively small number of elements.

Figure 18:
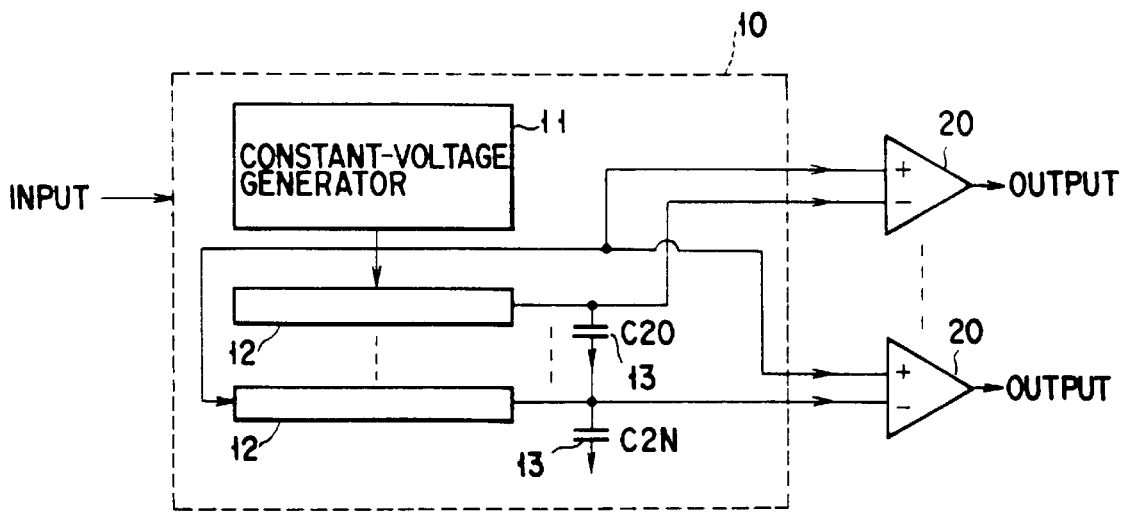
FIG. 18 is a block diagram depicting the basic structure of a delay circuit according to an eighth embodiment of the invention.

FIG. 18 shows the basic structure of a delay circuit according to the eighth embodiment of the present invention. Like the seventh embodiment, the eighth embodiment comprises a storage circuit 10 and a plurality of amplifiers 20.

The storage circuit 10 comprises a constant-voltage generator 11, a constant constant-current generator 12 and a plurality of capacitors 13 (C20 to C2N). The constant-voltage generator 11 generates a constant voltage, which is supplied to the constant-current generator 12. The constant-current generator 12 generates a plurality of constant currents which are proportional to the difference between the input constant voltage and a first supply voltage. The capacitors C20 to C2N accumulate the currents the generator 12 has generated. Each of the amplifiers 20 amplifies the difference between the output of the constant-voltage generator 11 and the node voltage of one capacitor. The number of all elements constituting the delay circuit is not proportional to the number of delay times the circuit needs to provide. This is because one amplifier, one additional constant-current generator and one additional capacitor are sufficient for each additional delay time. The eighth embodiment can therefore be comprised of a comparatively small number of elements.

FIG. 19 illustrates, in detail, the delay circuit shown in FIG. 18, and FIG. 20 is a timing chart which explains how the delay circuit performs its function.

As seen from FIG. 19, the constant-voltage generator 11 comprises a p-channel transistor Qp71, a resistor R71 and an n-channel transistor Qn71. Each of the constant-current generators 12 has p-channel transistors Qp73, Qp74, . . . , Qp7M. The delay circuit remains in standby state while the input signal Vin is at low level. The p-channel transistor Qp72 is turned on, the p-channel transistors Qp73, Qp74, . . . , Qp7M are turned off, the n-channel transistor Qn71 is turned off, and the n-channel transistors Qn73, Qn74, . . . , Qn7M are turned on. The voltages Vcap1, Vcap2, VcapN at one end of the capacitors C71, C74, . . . , C7M is thereby set at ground level.

When the input signal Vin rises from low level to high level, the n-channel transistors Qn73, Qn74, . . . , Qn7M and p-channel transistor Qp72 are turned off, whereas the p-channel transistors Qp73, Qp74, . . . , Qp7M and the n-channel transistor Qn71 are turned on. The input voltage Vref of each amplifier 20 therefore has a specific value which depends on the supply voltage. The voltage Vcap1, Vcap2, . . . , VcapN at the one end of the capacitors C73, C74, . . . , C7M increases with time at a constant rate. When the voltage Vcapn ($1 \leq n \leq N$) becomes equal to or more than a Vref, the output signal voutn is inverted in polarity.

As may be understood from the above, in the eighth embodiment it is only necessary, as in the seventh embodiment, to add one amplifier 20, one p-channel transistor and one capacitor, for each additional delay time. Thus, the delay circuit according to the eighth embodiment can be made of a relatively small number of elements.

FIG. 21 shows the basic structure of a delay circuit which is the ninth embodiment of the present invention.

As shown in FIG. 21, this delay circuit comprises a storage circuit 10 and a plurality of amplifiers 20. The storage circuit 10 has a constant-voltage generator 11, a plurality of constant current-current generators 12 and a plurality of capacitors 13 (C30 to C3M). The constant-voltage generator 11 generates a plurality of constant voltages which are proportional to one another. The constant voltages are applied to the constant-current generators 12, respectively. Each of the constant-current generators 12 generates a constant current which is proportional to the input constant voltage. The capacitors C30 to C3M are charged by the currents that the generators 12 have generated. Each of the amplifiers 20 amplifies the difference between the output of the constant-voltage generator 11 and the node voltage of one capacitor. The number of all elements constituting the delay circuit is not proportional to the number of delay times the circuit needs to provide. This is because one amplifier, one additional constant-current generator and one additional capacitor for charging the current generated by the constant-current generator are sufficient for each additional delay time. The ninth embodiment can therefore be comprised of a comparatively small number of elements.

Figure 22:
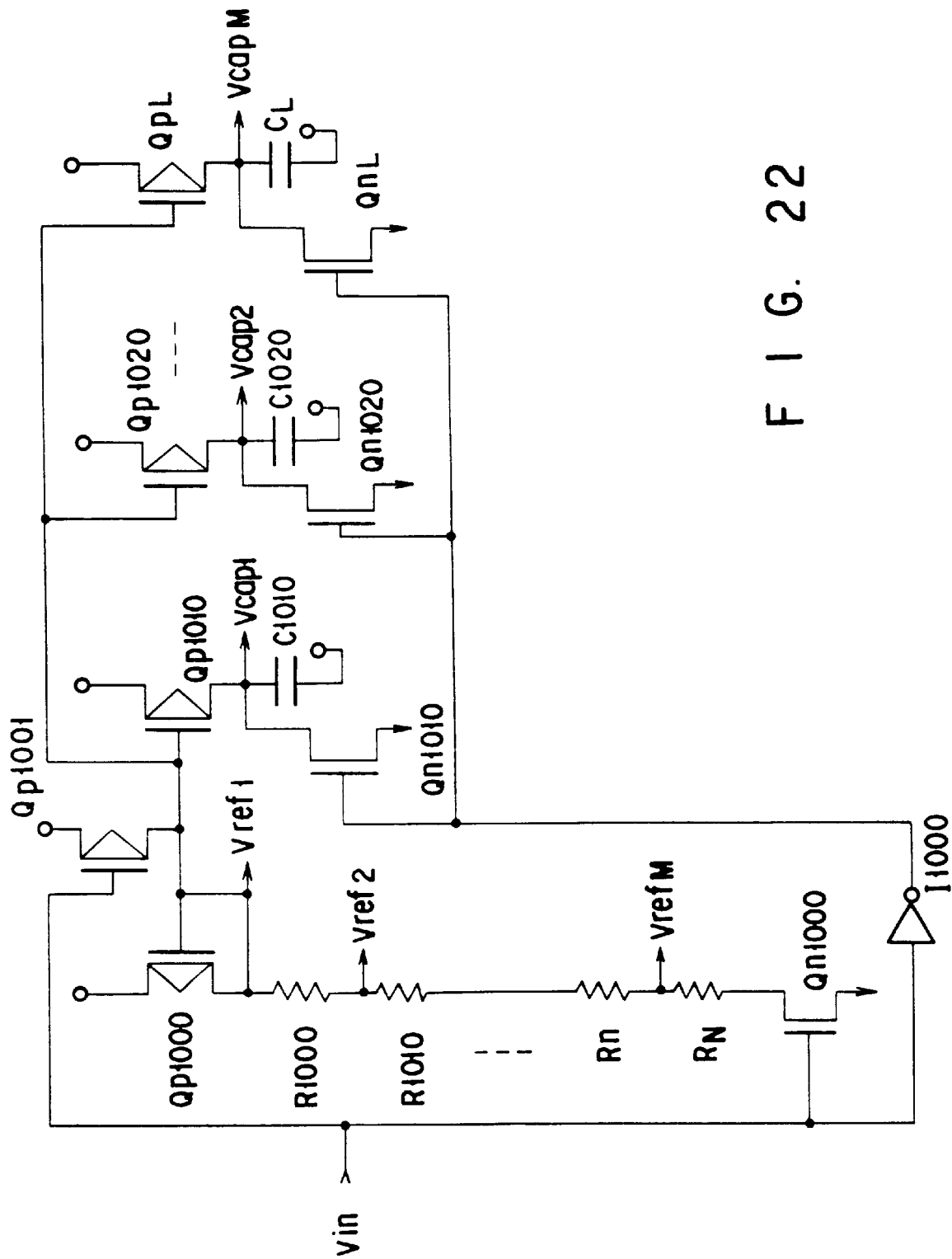
FIG. 22 is a circuit diagram of the delay circuit shown in FIG. 21.

FIGS. 22 and 23 show, in detail, the delay circuit shown in FIG. 21. FIG. 24 is a timing chart explaining the operation of the delay circuit of FIG. 21.

As shown in FIG. 22, the storage circuit 10 has p-channel transistor Qp1001, resistors R1000, R1010, . . . , RN, and an n-channel transistor Qn1001. The constant-current generators 12 has p-channel transistors Qp1010, Qp1020, . . . , QpL. The delay circuit remains in standby state while the input signal Vin is at low level. The p-channel transistor Qp1001 is turned on, the p-channel transistors Qp1010, Qp1020, . . . , QpL are turned off, the n-channel transistor Qn1000 is turned off, and the n-channel transistors Qn1010, Qn1020, . . . , QnL are turned on. The voltages Vcap1, Vcap2, . . . , VcapM at one end of the capacitors C1010, C1020, . . . , CL is thereby set at ground level.

When the input signal Vin rises from low level to high level, the n-channel transistors Qn1010, Qn1020, ..., QnL and p-channel transistor Qp1001 are turned off, whereas the p-channel transistors Qp1000, Qp1010, ..., QpL and the n-channel transistor Qn1000 are turned on. The input voltages Vref1, Vref2, ..., VrefN of the amplifiers 20 therefore have specific values which depend on the supply voltage. The voltages Vacp1, Vcap2, ..., VcapM at the one end of the capacitors C1010, C1020, ..., CL increase with time at a constant rate. When the voltage Vcapm ($1 \leq m \leq M$) becomes equal to or more than a Vrefn ($1 \leq n \leq N$), the output signal Voutnm is inverted in polarity. The ratio of time Tnm for arbitrary n, i.e., Tn1: Tn2: ... :TnM, is constant which is not depend on n, and the ratio of time Tnm for arbitrary m, i.e., T1m: T2m: ... :TnM, is constant which is not depend on m.

As can be understood from the above, in the ninth embodiment it is only necessary to add one amplifier 20, one p-channel transistor for generating a constant current, and one capacitor for accumulating this constant current, for each additional delay time. Thus, the delay circuit according to the ninth embodiment can be constituted by a relatively small number of elements.

FIG. 25 illustrates the basic structure of a delay circuit according to the tenth embodiment of this invention.

As shown in FIG. 25, this delay circuit comprises a storage circuit 10 and an amplifier 20. The storage circuit 10 has a constant-voltage generator 11, an input signal switch 15, a constant-current generator 12, and a capacitor 13 (C40). The constant-voltage generator 11 generates a plurality of constant voltages which are proportional to one another. The input signal switch 15 selects one of the constant voltages generated by the constant-voltage generators 11 in accordance with a command externally supplied. The constant-current generator 12 generates a constant current which is proportional to the difference between the input voltage and a first supply voltage. The capacitor C40 accumulates the constant current the generator 12 has generated. The amplifier 20 amplifies the difference between one of the output voltages of the generator 11 and the voltage at one node of the capacitor C40. Thus, the delay circuit outputs a signal with a delay time which depends on the command supplied to the generated and the input signal switch 15.

To provide more delay times, the delay circuit only needs to incorporate more input signal switches, each for selecting one of the constant voltages generated by the constant-voltage generator 11 in accordance with the command. Obviously, the tenth embodiment can be constituted by a relatively small number of elements.

FIG. 26 illustrates, in detail, the delay circuit shown in FIG. 25. FIGS. 27A and 27B are timing charts which explain the operation of the delay circuit of FIG. 25.

As shown in FIG. 26, the constant-voltage generator 11 comprises p-channel transistor Qn91, resistors R91 and R92, and an n-channel transistor Qn91. The constant-current generator 12 comprises a p-channel transistor Qp95. The input signal switch 15 comprises n-channel transistors Qn92 and Qn93, p-channel transistors Qp92 and Qp93, and an The delay circuit remains in standby state while the input signal Vin is at low level. Hence, the p-channel transistor Qp94 is in on state, the p-channel transistors Qp91 and Qp95 are in off state, and the n-channel transistor Qn94 is in on state. The voltage Vcap at one end of the capacitor C91 is therefore set at ground level.

When the input signal Vin rises from low level to high level, the n-channel transistor Qn94 and the p-channel transistor Qp94 are turned off, whereas the p-channel transistors Qp91 and Qp95 and the n-channel transistor Qn91 are turned on. The input voltage Vref of the amplifier 20 has value VA when the command CMD is at low level, and value VB when the command CMD is at high level. The voltage Vcap at one end of the capacitor C91 increases with time at a specific rate, regardless of the level of the command CMD. The ratio between the delay time TA the delay circuit has when the command CMD is at high level and the delay time TB the delay circuit has when the command CMD is at low level is equal to the ratio between the voltages VA and VB, i.e., the ratio between the resistance of r92 and (r91+r92), where r91 is the resistance of the resistor R91 and r92 is the resistance of the resistor 92.

With the tenth embodiment whose delay time is changed in accordance with the command CMD, it suffices to add one input signal switch 15 for each additional delay time. The tenth embodiment can be constituted by a relatively small number of elements.

FIG. 28 shows the basic structure of a delay circuit according to the eleventh embodiment of the present invention.

As illustrated in FIG. 28, the delay circuit comprises a storage circuit 10 and an amplifier 20. The storage circuit 10 has a constant-voltage generator 11, a constant-current generator 12, an input signal switch 15, and a capacitor 13 (C50). The constant-voltage generator 11 generates a constant voltage. The constant-current generator 12 generates a plurality of constant current which are proportional to the constant voltage generated by the constant-voltage generator 11. The input signal switch 15 selects one of the constant currents generated by the constant-current generators 12 in accordance with a command externally supplied. The capacitor C50 charges the constant current the switch 15 has selected. The amplifier 20 amplifies the difference between the output voltage of the generator 11 and the voltage at one node of the capacitor C50. Thus, the delay circuit outputs a signal with a delay time which depends on the command supplied to the input signal switch 15. The eleventh embodiment, whose delay time is changed in accordance with the command CMD, needs only to have one additional input signal switch for each additional delay time. The eleventh embodiment can be constituted by a comparatively small number of elements.

Figure 29:
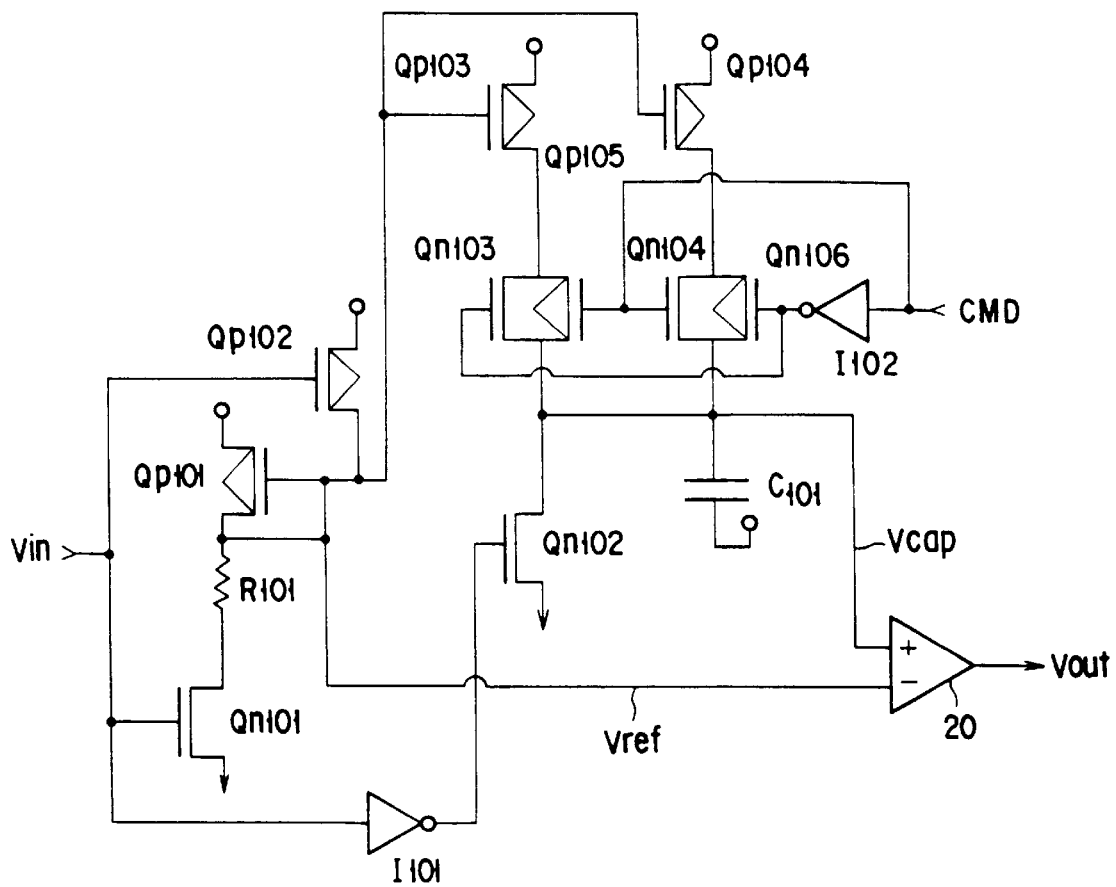
FIG. 29 is a circuit diagram of the delay circuit shown in FIG. 23.

FIG. 29 shows, in detail, the delay circuit of FIG. 28. FIGS. 30A and 30B are timing charts explaining the operation of the delay circuit.

As shown in FIG. 29, the constant-voltage generator 11 comprises a p-channel transistor Qp101, a resistor R101, and an n-channel transistor Qn101. The constant-current generator 12 has p-channel transistors Qp103 and Qp104. The input signal switch 15 comprises n-channel transistors Qn103 and Qn104, p-channel transistors Qp105 and Qp106, and an inverter I102.

The delay circuit remains in standby state while the input signal Vin is at low level. The p-channel transistor Qp102 is in on state. Therefore, the p-channel transistors Qp101, Qp103 and Qp104 are in off state, the n-channel transistor Qn101 is in off state, and the n-channel transistor Qn102 is in on state. The voltage Vcap at one end of the capacitor C101 is set at ground level.

When the input signal Vin rises from low level to high level, the n-channel transistor Qn102 and the p-channel transistor Qp102 are turned off, while the p-channel transistors Qp101, Qp102 and Qp103 and the n-channel transistor Qn101 are turned on. The capacitor C50 is charged by the p-channel transistor Qp103 when the command CMD supplied to the switch 15 is at low level, and by the p-channel transistor Qp104 when the command CMD is at high level.

The input voltage Vref of the amplifier 20 is constant, not depending on the level of the command CMD. The voltage Vcap at one end of the capacitor C101 increases with time at a specific rate, and is inversely proportional to the conductance of the p-channel transistor which charges the capacitor C101. The ratio between the delay time TA which the delay circuit has when the command CMD is at high level and the delay time TB which the delay circuit has when the command CMD is at low level is equal to a reciprocal of the gradient of the voltage Vcap for time, i.e., the ratio between the reciprocal of the conductance of the p-channel transistor Qp103 and the reciprocal of the conductance of the p-channel transistor Qp104.

The delay circuit according to the eleventh embodiment, whose delay time is changed in accordance with the command CMD, needs only to have one additional input signal switch for each additional delay time. The delay circuit can be constituted by a comparatively small number of elements.

Figure 31:
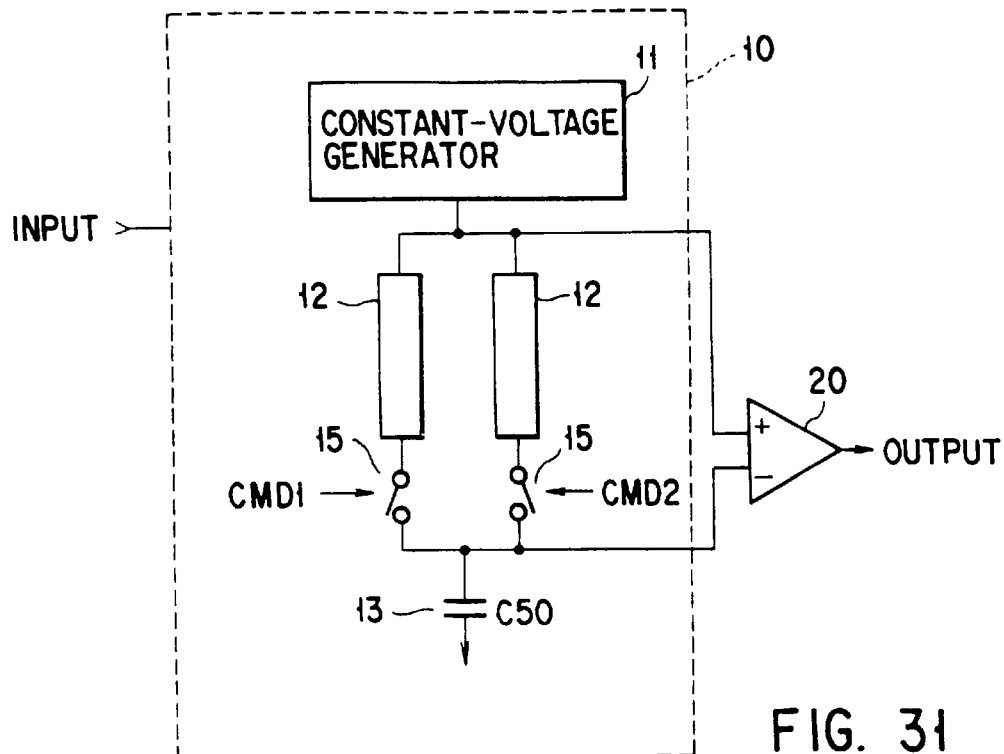
FIG. 31 is a block diagram depicting the basic structure of a delay circuit which is a twelfth embodiment of the present invention.

FIG. 31 shows the basic structure of a delay circuit which is the twelfth embodiment of the present invention. The twelfth embodiment is a modification of the eleventh embodiment. Like the eleventh embodiment, it comprises a storage circuit 10 and an amplifier 20. The storage circuit 10 has a constant-voltage generator 11, two constant-current generators 12, two input signal switches 15, and a capacitor 13 (C50). The constant-voltage generator 11 generates a constant voltage, which is applied to both constant-current generators 12. The constant-current generators 12 generate different constant currents, either being proportional to the input voltage. The first switch 15 selects the constant current generated by the first generator 12 in response to a command CMD1, and the second switch 15 selects the constant current generated by the second generator 12 in response to a command CMD2. The capacitor C50 accumulates the current supplied from the first input signal switch 15 or the current supplied from the second input signal switch 15, or both currents. The amplifier 20 is designed to amplify the difference between the output voltage of the constant-voltage generator 11 and the voltage at one node of the capacitor C50.

The input signal switches 15 are so controlled that one or both of them are closed. Thus, if the constant-current generators 12 generate the same current, two different constant currents can be supplied to the amplifier 20, thereby to provide two different delay times. If the constant-current generators 12 generate different currents, three different constant currents can be supplied to the amplifier 20. In this case, the delay circuit can provide three different delay times.

The twelfth embodiment, which outputs a signal with a delay time which depends on the commands supplied to the input signal switches 15, needs only to have one additional input signal switch and one constant-current generator, for each additional delay time. The twelfth embodiment can, therefore, be constituted by a relatively small number of elements.

Figure 32:
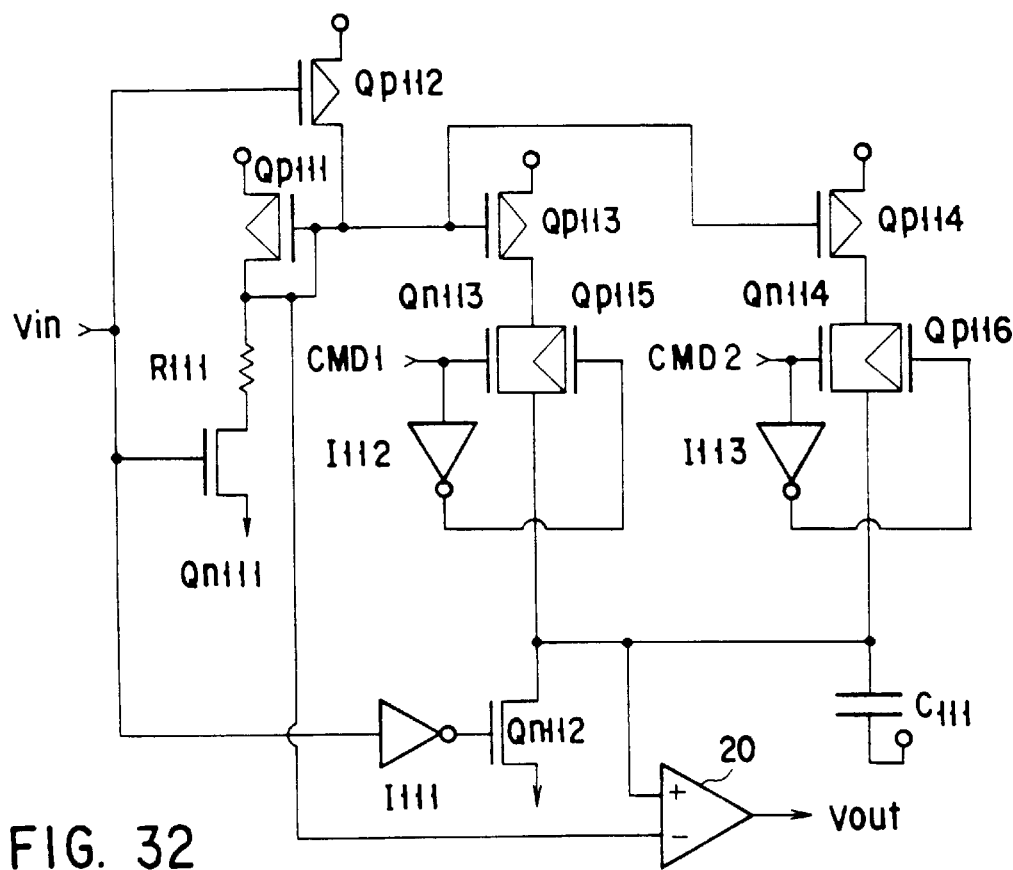
FIG. 32 is a circuit diagram of the delay circuit shown in FIG. 31.

FIG. 32 shows, in detail, the delay circuit shown in FIG. 31. FIGS. 33A, 33B and 33C are timing charts which explain the operation of the delay circuit. As shown in FIG. 32, the constant-voltage generator 11 comprises a p-channel transistor Qp111, a resistor R, and an n-channel transistor Qn111. Each of the constant-current generators 12 has p-channel transistors Qp113 and Qp114. The input signal switches 15 comprises n-channel transistors Qn113 and Qn114, p-channel transistors Qp115 and Qp116, and inverters I112 and I113.

The delay circuit remains in standby state while the input signal Vin is at low level. The p-channel transistor Qp112 is in on state. Therefore, the p-channel transistors Qp111, Qp113 and Qp114 are in off state, the n-channel transistor Qn111 is in off state, and the n-channel transistor Qn112 is in on state. The voltage vcap at one end of the capacitor C111 is set at ground level.

When the input signal Vin rises from low level to high level, the n-channel transistor Qn112 and the p-channel transistor Qp112 are turned off, while the p-channel transistors Qp111, Qp113 and Qp114 and the n-channel transistor Qn111 are turned on. The capacitor C111 is charged by the p-channel transistor Qp113 when the command CMD2 is at low level, and by the p-channel transistor Qp114 when the command CMD1 is at low level and the command CMD2 is at high level. Further, the capacitor C111 is charged by the p-channel transistors Qp113 and Qp114 when the commands CMD1 and CMD1 are at high level.

The input voltage Vref of the amplifier 20 is constant, not depending on the level of the command CMD1 or the level of the command CMD2. The voltage Vcap at one end of the capacitor C111 increases with time at a specific rate, and is inversely proportional to the conductance of the p-channel transistor which charges the capacitor C111. The ratio between the delay time TA which the delay circuit has when the commands CMD1 and CMD2 are at high and low levels, respectively, and the delay time TB which the delay circuit has when the commands CMD1 and CMD2 are at low and high levels, respectively, is equal to a reciprocal of the rate at which the voltage Vcap increases with time, i.e., the ratio between the reciprocal of the conductance of the p-channel transistor Qp113 and the reciprocal of the conductance of the p-channel transistor Qp114.

The delay circuit according to the twelfth embodiment, whose delay time is changed in accordance with the commands CMD1 and CMD2, needs only to have one additional constant-current generator 12 and only one additional input signal switch, for each additional delay time. The delay circuit can, therefore, be constituted by a comparatively small number of elements.

FIG. 34 illustrates the basic structure of a delay circuit according to the thirteenth embodiment of the present invention. The thirteenth embodiment is a modification of the eighth embodiment. It comprises a storage circuit 10 and two amplifiers 20 and 20'.

As shown in FIG. 34, the storage circuit 10 comprises a constant-voltage generator 11, two constant constant-current generators 12 and 12', and two capacitors 13 and 13' (C10 and C20). The constant-voltage generator 11 generates a constant voltage, which is supplied to the constant-current generators 12 and 12'. The first constant-current generator 12 generates a constant current which is proportional to the input voltage. Similarly, the second constant-current generator 12' generates a constant current which is proportional to the input voltage. The capacitors C10 and C20 accumulate the currents the generators 12 and 12' have generated. The first amplifier 20 amplifies the difference between the output of the constant-voltage generator 11 and the voltage at one node of the first capacitor C10. The second amplifier 20' amplifies the difference between the output of the constant-voltage generator 11 and the voltage at one node of the second capacitor C20. The first constant-current generator 12 is activated by an input signal Vin, whereas the second constant-current generator 12' is activated by the output of the first amplifier 20.

The number of all elements constituting this delay circuit is not proportional to the number of delay times the circuit needs to provide. This is because one additional constant-current generator, one additional capacitor and one additional amplifier are sufficient for each additional delay time. It follows that the thirteenth embodiment can be comprised of a comparatively small number of elements.

FIG. 35 shows the delay circuit shown in FIG. 34. FIG. 36 is a timing chart for explaining how the delay circuit operates.

As shown in FIG. 35, the constant-voltage generator 11 comprises a p-channel transistor Qp201, an n-channel transistor Qn200, and a resistor R200. The delay circuit remains in standby state while the input signal Vin is at low level. As long as the circuit stays in the standby state, the voltage Vref is charged to the supply voltage by the p-channel transistor Qp200. When the input signal Vin rises from low level to high level, the voltage Vref changes to a constant voltage which is determined by the ratio between the transconductance of the p-channel transistor Qp201 and the conductance of the resistor R200. The transconductance of the n-channel transistor Qn200 is sufficiently greater than the conductance of the resistor R200. The current flowing through the resistor R200 is therefore proportional to the constant voltage Vref.

Each of the constant-current generators 12 and 12' comprises p-channel transistors Qp202 and Qp204. Both p-channel transistors Qp202 and Qp204 are in off state while the delay circuit is in the standby state, since the p-channel transistor Qp200 sets the voltage Vref at the power-source level. The p-channel transistors Qp202 and Qp204 of either constant-current generator charge capacitors C200 and C201, respectively while the input signal Vin and the first output signal Vout1 are at high level. The capacitors c200 and C201 are set at ground level by the n-channel transistors Qn201 and Qn202, respectively, while the delay circuit remains in the standby state.

In the thirteenth embodiment, the capacitor C200 which serve to produce the first output signal Vout1 is activated by the input signal vin, whereas the capacitor C201 which serves to produce the second output signal Vout2 is activated by the first output signal Vout1. Since it suffices to add one constant-current generator, one capacitor and one amplifier are sufficient, for each additional delay time, the thirteenth embodiment can be constituted by a comparatively small number of elements.

FIG. 37 illustrates an oscillator according to the fourteenth embodiment of the invention. The oscillator incorporates any one of the delay circuits which are the first to thirteenth embodiment, and therefore can provide an oscillating frequency not affected by the supply voltage, like the other oscillators according to the invention which will be described later.

The oscillator has a constant-voltage/current generator 16, which generates two different constant voltages VrefH and VrefL and two different constant currents IrefH and IrefL. The constant currents IrefH and IrefL are represented as follows:

$$IrefH = (VrefH - VrefL)/r1 \tag{12}$$

$$IrefL = (VrefH - VrefL)/r2 \tag{13}$$

where VrefH>VrefL, and r1 and r2 are respectively proportional coefficients.

The constant-voltage/current generator 16 is connected to an amplifier 20 and a selector 30. The constant-voltage terminals (VrefH and VrefL) of the generator 16 are connected to the non-inverting and inverting input terminals of an amplifier 20H, respectively, and to the non-inverting and inverting input terminals of an amplifier 20L, respectively. The constant-current terminals (IrefH and IrefL) of the generator 16 are connected to the switches S1 and S2, both provided in the selector 30. The inverting input terminal of the amplifier 20H and the non-inverting input terminal of the amplifier 20L are connected together and to the node of the switches S1 and S2 and to a Vcap terminal. Two capacitors C1 and C2 are connected in series between supply voltage terminals 31 and 32. The Vcap terminal is connected to the node of the capacitors C1 and C2.

The amplifiers 20H and 20L constitute an amplifier 20. The amplifier 20 compares the voltage Vcap with the constant voltages VrefH and VrefL. The selector 30 opens the switch S1 and closes the switch S2 when the voltage Vcap becomes equal to the constant voltage VrefH. The switches S1 and S2 remain opened and closed until the voltage Vcap becomes equal to the constant voltage VrefL. The capacitors C1 and C2 are thereby charged with the constant current IrefH. The following equation (14) holds:

$$c1(VrefH - VrefL) = IrefH \times TR = IrefL \times TF \tag{14}$$

where c1 is the total capacitance of the capacitors C1 and C2, TF is the time lapsing while the voltage Vcap is falling from VrefH to VrefL, and TR is the time lapsing while the voltage Vcap is rising from VrefL to VrefH.

From Equations (12), (13) and (14), TR and TF are given as follows:

$$TR = r1 \times c1 \tag{15}$$

$$TF = r2 \times c1 \tag{16}$$

Therefore, the one-cycle period T1 of the oscillator is represented by:

$$T1 = TR + TF \tag{17}$$

Namely, the oscillating frequency of the oscillator is determined by the charging time TR and discharging time TF of the capacitors C1 and C2. Hence, the oscillating frequency is not affected by the fluctuation of the supply voltage or the changes in the characteristics of the transistors used in the oscillator.

FIG. 38 shows an oscillator which is a fifteenth embodiment of the present invention.

As shown in FIG. 38, capacitors C1 and C2 are connected at one end to supply voltage terminals 31 and 32, respectively, and at the other end to one end of a resistor R1. The node of the capacitor C1 and the resistor R1 serves as a Vcap terminal. Three resistors R2, R3 and R4 are connected in series between the supply voltage terminals 31 and 32. An amplifier 20, which comprises two amplifiers 20H and 20L, compares the voltage Vcap with the voltage VrefH at the node of the resistors R2 and R3 and the voltage VrefL at the node between the resistors R3 and R4. Switches S1 and S2, both provided in a selector 30, are closed and opened, respectively, when the voltage Vcap becomes equal to the voltage VrefL. The switches S1 and S2 remain closed and opened, thus disconnecting the other end of the resistor R1 from the power-source terminal 32, until the voltage Vcap becomes equal to the voltage VrefH. The following equation (18) holds while the voltage vcap is falling from VrefH to VrefL:

$$Vcap/dt = -Vcap/RR1/CC \tag{18}$$

where RR1 is the resistance of the resistor R1 and CC is the total capacitance of the capacitors C1 and C2. The initial condition which the voltage Vcap has upon lapse of time t from the moment the voltage Vcap becomes equal to potential VrefH=a×VCC (a=(RR3+RR4)/(RR2+RR3+RR4)) is represented as follows:

$$Vcap(0)=a\times VCC \tag{19}$$

where VCC is the voltage at the supply voltage terminal 31, RR2 is the resistance of the resistor R2, RR3 is the resistance of the resistor R3, and RR4 is the resistance of the resistor R4.

Therefore:

$$Vcap(t)=a\times VCC\times exp(-t/RR1/CC) \tag{20}$$

Hence, time TF lapsing while the voltage Vcap is falling from VrefH to VrefL=b×VCC (b=RR4/(RR2+RR3+RR4)) is given as:

$$TF=RR1\times CC\times log_e(a/b) \tag{21}$$

where a=(RR3+RR4)/(RR2+RR3+RR4), and b=RR4/(RR2+RR3+RR4).

Time TR lapsing while the voltage Vcap is rising from VrefL to VrefH is defined as:

$$TR=RR1\times CC\times log_e((1-b)/(1-a)) \tag{22}$$

From Equations (21) and (22), the one-cycle (constant) period T2 of the oscillator is represented by:

$$T2=TR+TF \tag{23}$$

Namely, the oscillating frequency of the oscillator is determined by the charging time TR and discharging time TF of the capacitors C1 and C2. Hence, the oscillating frequency is not affected by the fluctuation of the supply voltage or the changes in the characteristics of the transistors used in the oscillator.

Figure 40:
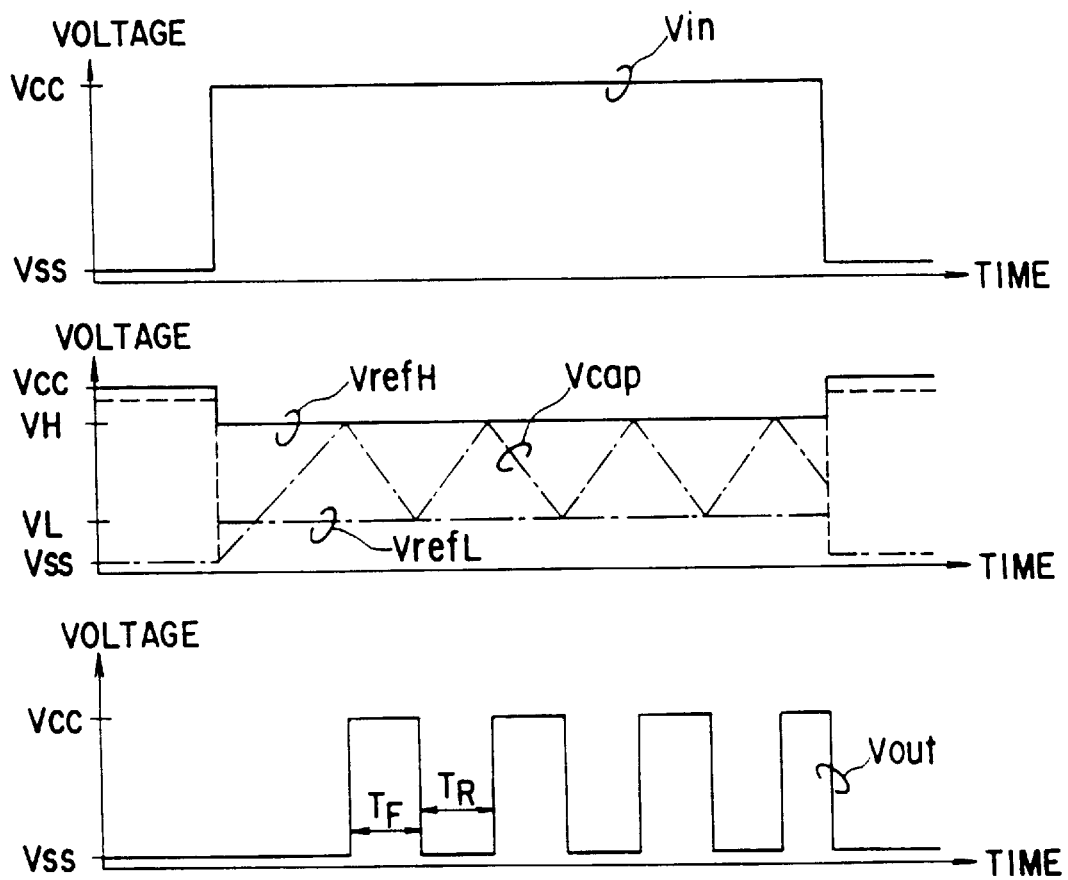
FIG. 40 is a timing explaining the operation of the oscillator circuit shown in FIG. 39.

With reference to FIGS. 39 and 40, an oscillator according to the fifteenth embodiment of the invention will be described. The oscillator incorporates a delay circuit which is a modification of the delay circuit shown in FIG. 9 and which is designed to provide two different delay times.

As illustrated in FIG. 39, the oscillator comprises a constant-current generator 16, an amplifier 20 and a selector 30. The constant-voltage/current generator 16 has p-channel transistors Qp11, Qp12 and Qp14, n-channel transistors Qn11, Qn12 and Qn14, a resistor R11 and an inverter I11. The selector 30 has NAND gates G11 and G12, a p-channel transistor Qp13 and an n-channel transistor Qn15.

The oscillator remains in standby state while the input signal Vin is at low level. The voltages VrefH and VrefL, both applied to the amplifier 20, are at high level, and the voltage is at low level. The output Vout is therefore at low level.

When the input signal Vin rises from low level to high level, the oscillator is set into active state and starts operating as illustrated in FIG. 40. While the oscillator stays in active state, the following equations hold:

$$Iref=(VrefH-VrefL)/r11 \tag{24}$$

$$Iin=\beta2/\beta1\times Iref \tag{25}$$

$$Iout=\beta4/\beta3\times Iref \tag{26}$$

where 1, 2, 3 and 4 are the transconductances of the transistors Qp11, Qp14, Qn11 and Qn14, r11 is the resistance of the resistor R11, Iref is the current flowing through the resistor R11, Iin is the current flowing through the transistor Qp14 while the transistor Qp13 is in on state, and Iout is the current flowing through the transistor Qn14 while the transistor Qn15 is in on state.

The output signal Vout remains at high level while the voltage Vcap is falling from the constant voltage VrefH to the constant voltage VrefL. Capacitors C11 and C12 are discharged through the n-channel transistors Qn14 and Qn15. While the voltage Vcap is rising from VrefL to VrefH, the output signal Vout stays at low level, and the capacitors C11 and C12 are charged through the p-channel transistors Qp13 and Qp14. Thus, the following equations hold:

$$c11\times(VrefH-VrefL)=Iin\times TR=Iout\times TF \tag{27}$$

$$TR=r11\times c11\times\beta1/\beta2 \tag{28}$$

$$TF=r11\times c11\times\beta3/\beta4 \tag{29}$$

where TF is the time which lapses while the voltage Vcap is falling from VrefH to VrefL, TR is the time which lapses while the voltage Vcap is rising from VrefL to VrefH, and c11 is the total capacitance of the capacitors C11 and C12.

The p-channel transistor Qp13 and the n-channel transistor Qn15 have transconductances which are much greater than those of the p-channel transistor Qp14 and the n-channel transistor Qn14, so that both Equation (24) and Equation (25) may hold.

From Equations (28) and (29), the one-cycle period T3 of the oscillator is obtained as follows:

$$T3=TR+TF \tag{30}$$

Hence, the oscillating frequency of the oscillator which is the sixteenth embodiment of the invention is determined by only the charging time TR and discharging time TF of the capacitors C1 and C2. It follows that the oscillating frequency is not influenced by the fluctuation of the supply voltage or the changes in the characteristics of the transistors used in the oscillator.

With reference to FIGS. 41 and 42, an oscillator according to the seventeenth embodiment of the invention will be described.

As illustrated in FIG. 41, a selector 30 comprises NOR gates G31 and G32, p-channel transistors Qp32 and Qp33, n-channel transistors Qn31 and Qn32, and an inverter I31.

The oscillator shown in FIG. 41 remains in standby state while the input signal Vin is at low level. Both amplifiers 20H and 20L stay in inactive state. In other words, the voltages VrefH and VrefL are at low level, the output signal Vout at high level, and the voltage Vcap at low level.

When the input signal Vin rises from low level to high level, the oscillator is set into active state and starts operating as illustrated in FIG. 42. While the input signal Vin remains at high level, the amplifiers 20H and 20L are activated. The p-channel transistor Qp31 has an on-resistance which is far lower than the total resistance of resistors R31 to R33, and the p-channel transistor Qp33 and the n-channel transistor Qn32 have an on-resistance which is much lower than the resistance of the resistor R34. Thus, the following equations hold true for the oscillator:

$$VrefH=(r32+r33)/(r31+r32+r33)\times VCC \tag{31}$$

$$VrefL=r33/(r31+r32+r33)\times VCC \tag{32}$$

where r31, r32, r33 and r34 are the resistances of the resistors R31 to R34 and VCC is the supply voltage.

The output signal Vout remains at high level while the voltage Vcap is lowering from the constant voltage VrefH to the constant voltage VrefL. As long as the output signal Vout is at high level, the capacitor C31 is discharged through the p-channel transistor Qp33. Hence, the time TF lapsing while the voltage Vcap is falling from VrefH to VrefL, the time TR lapsing while the voltage vcap is rising from VrefL to VrefH are given as follows:

$$TF = r34 \times c31 \times \log_e(a/b) \quad (33)$$

$$TR = r34 \times c31 \times \log_e((1-b)/(1-a)) \quad (34)$$

where c31 is the capacitance of the capacitor C31, and a and b are constants which are:

$$a = (r32 + r33)/(r31 + r32 + r33) \quad (35)$$

$$b = r33/(r31 + r32 + r33) \quad (36)$$

From Equations (33) and (36), the one-cycle period T4 of the oscillator is obtained as follows:

$$T4 = TR + TF \quad (37)$$

Namely, the oscillating frequency of the oscillator according to the seventeenth embodiment is determined by only the charging time TR and discharging time TF of the capacitor C31. The oscillating frequency is influenced neither by the fluctuation of the supply voltage nor by the changes in the characteristics of the transistors incorporated in the oscillator.

With reference to FIGS. 43 and 44, an oscillator which is the eighteenth embodiment of this invention will be describe.

As seen from FIG. 43, the oscillator comprises a constant-voltage/current generator 16, an amplifier 20, and a selector 30. The constant-voltage/current generator 16 comprises p-channel transistors Qp101, Qp102, Qp103 and Qp105, an n-channel transistor Qn101 and a resistor R101, and generates one constant voltage and two constant currents. The amplifier 20 comprises p-channel transistors Qp108, Qp109, Qp110, Qp112, Qp113 and Qp114, n-channel transistors Qn104, Qn105, Qn106, Qn107, Qn108 and Qn109, and an inverter 1101. The selector 30 comprises NAND gates G101 and G102, p-channel transistors Qp105 and Qp106, and n-channel transistors Qn102 and Qn103.

The oscillator shown in FIG. 43 is in standby state as long as the input signal Vin is at low level. While the oscillator remains in the standby state, the voltages Vref and Vacp1 are at high level, the voltage Vcap2 at low level, and the output signal Vout at low level.

When the input signal Vin rises from low level to high level, the oscillator is set into active state and starts operating as illustrated in FIG. 44. A current Iref flows through the resistor R101. A current Iin flows through the p-channel transistor Qp103 or Qp105 while the p-channel transistor Qp104 or Qp106 remains conducting are represented as follows:

$$Iref = Vref/r101 \quad (38)$$

$$Iin = \beta 2/\beta 1 \times Iref \quad (39)$$

where r101 is the resistance of the resistor R101, β1 is the transconductance of the p-channel transistor Qp102, and β2 is the transconductance of the p-channel transistors Qp103 and Qp105.

The output signal Vout stays at high level until the voltage Vcap2 becomes equal to the constant voltage Vref. While the output signal Vout stays at high level, the capacitor C101 is discharged through the n-channel transistor Qn102 and eventually connected to the ground. When the voltage Vcap2 becomes equal to the constant voltage Vref, the output Vout falls to low level. At the same time, the n-channel transistor Qn102 is turned off, and the p-channel transistor Qp104 is turned on. As a result, the capacitor C101 is charged through the p-channel transistor Qp104. Then, the n-channel transistor Qn103 is turned on, and the p-channel transistor Qp106 is turned off. The capacitor C102 is therefore discharged through the n-channel transistor Qn103 and connected to the ground. The capacitors C101 and C102 are alternately charged and discharged, whereby oscillation is accomplished. The one-cycle period T5 of the oscillator is expressed as follows:

$$c101 \times Vref = Iin \times T5/2 \quad (40)$$

$$T5 = 2 \times r101 \times c101 \times \beta 1/\beta 2 \quad (41)$$

where c101 is the capacitance of the capacitors C101 and C102.

As can be understood from Equation (41), the period T5 is twice the time which lapses while the voltage Vacp1 or Vcap2 is increasing from the ground level to the constant voltage Vref. The n-channel transistor Qn101 has a transconductance large enough to satisfy Equation (38), so that the on-resistance of the n-channel transistor Qn101 is negligible as compared with the resistance of the resistor R101. The transconductance of the p-channel transistors Qp104 and Qp106 is much greater than that of the p-channel transistors Qp103 and Qp105, so that Equation (39) is satisfied. Furthermore, the transconductance of the n-channel transistors Qn102 and Qn103 is set at such a value as to discharge the capacitor C101 thoroughly within half the one-cycle period T5 of the oscillator. The oscillating frequency of the oscillator is not influenced by the fluctuation of the supply voltage.

With reference to FIGS. 45 and 46, an oscillator according to the nineteenth embodiment of the invention will be described.

As shown in FIG. 45, the oscillator comprises a constant-voltage/current generator 16, an amplifier 20, and a selector 30. The constant-voltage/current generator 16 comprises an n-channel transistor Qp114, n-channel transistors Qn112, Qn113, Qn115 and Qn125, and a resistor R, for generating one constant voltage Vref and two constant currents. The amplifier 20 comprises n-channel transistors Qp113, Qp115, Qp116, Qp118, Qp119, Qp120 and Qp121 and inverters I111, I112 and I113. The selector 30 comprises NOR gates G111 and G112, p-channel transistors Qp112 and Qp117, and n-channel transistors Qn114 and Qn124.

The oscillator shown in FIG. 45 is in standby state as long as the input signal Vin is at low level. While the oscillator remains in standby state, the voltages Vref and Vacp1 are at low level, the voltage Vcap2 at high level, and the output signal Vout at high level.

When the input signal Vin rises from low level to high level, the oscillator is set into active state and starts operating as illustrated in FIG. 46. A current Iref flows through the resistor R. A current Iout flows through the n-channel transistor Qn115 or Qn125 while the p-channel transistor Qp114 or Qp124 remains conducting are represented as follows:

$$Iref = (VCC - Vref)/r111 \quad (42)$$

$$Iout = \beta 4/\beta 3 \times Iref \quad (43)$$

where β3 is the transconductance of the n-channel transistor Qn113, β3 is the transconductance of n-channel transistors Qn115 and Qn125, and r111 is the resistance of the resistor R.

The output signal Vout stays at low level until the voltage Vcap2 becomes equal to the constant voltage Vref. The capacitor C111 is therefore charged to the supply voltage VCC through the p-channel transistor Qp112. When the voltage Vcap2 becomes equal to the constant voltage Vref, the output signal Vout rises to high level. Simultaneously, the p-channel transistor Qp112 is turned off, whereas the n-channel transistor Qn114 is turned on. The capacitor C111 is discharged through the n-channel transistor Qn114. Since the p-channel transistor Qp117 is turned on and the n-channel transistor Qn124 is turned off, the capacitor C112 is charged to the supply voltage VCC through the p-channel transistor Qp117.

The capacitors C111 and C112 are alternately charged and discharged, whereby oscillation is accomplished. The one-cycle period T6 of the oscillator is expressed as follows:

$$c111 \times (VCC-Vref) = Iout \times T2/2 \quad (44)$$

$$T6 = 2 \times r111 \times c111 \times \beta 3/\beta 4 \quad (45)$$

where c111 is the capacitance of the capacitors C111 and C112. As can be understood from Equations (44) and (45), the period T6 is twice the time which lapses while the voltage Vacp1 or Vcap2 is changing from the ground level to the constant voltage Vref.

The p-channel transistor Qn114 has a trans-conductance large enough to satisfy Equation (42), so that the on-resistance of the n-channel transistor Qn114 is negligible as compared with the resistance of the resistor R. The transconductance of the n-channel transistors Qn115 and Qn125 is much greater than that of the n-channel transistors Qn114 and Qn124, so that Equation (43) is satisfied. Moreover, the trans-conductance of the p-channel transistors Qp112 and Qp117 is set at such a value as to charge the capacitor C111 thoroughly to the supply voltage VCC within half the one-cycle period T6 of the oscillator. The oscillating frequency of the oscillator according to the nineteenth embodiment is influenced neither by the fluctuation of the supply voltage nor by the changes in the characteristics of the transistors incorporated in the oscillator.

With reference to FIGS. 47 and 48, an oscillator according to the twentieth embodiment of the invention will be described.

As can be understood from FIG. 47, the amplifier 30 incorporated in the oscillator remains not activated while the oscillator assumes standby state in which the p-channel transistors Qp133 and Qp136 and the n-channel transistors Qn132 and Qn134 are turned off. The selector 30 provided in the oscillator comprises NOR gates G131 and G132, p-channel transistors Qp132 and Qp135, and n-channel transistors Qn131 and Qn133.

The oscillator shown in FIG. 47 is in standby state as long as the input signal Vin is at high level. While the oscillator remains in standby state, the voltages Vref is at low level, the output signal Vout at high level, and the voltage Vacp1 at low level, and the voltage Vcap2 at high level. When the input signal Vin rises from low level to high level, the oscillator is set into active state and starts operating as illustrated in FIG. 48.

The p-channel transistor Qp131 has an on-resistance much lower than that of resistors R131 and R132. The p-channel Qp131 and Qp133 have such a great transconductance that the p-channel transistors Qp132 and Qp135 may have an on-resistance sufficiently lower than that of resistors R133 and R134. Further, the n-channel transistors Qn131 and Qn133 have a transconductance which is large enough to discharge capacitors C131 and C132 within half the one-cycle period of the oscillator, thereby to set the voltages Vacp1 and Vcap2 at the ground level. Therefore, the following Equation (46) holds true for the oscillator shown in FIG. 47:

$$Vref = r132/(r131+r132) \times VCC \quad (46)$$

where r131 and r132 are the resistance of the resistors R131 and R132, respectively.

The output signal Vout remains at high level until the voltage vcap2 becomes equal to the constant voltage Vref after the voltage Vacp1 has become equal to the constant voltage Vref. Thus, the capacitor C131 is discharged through the n-channel transistor Qn131. On the other hand, until the voltage Vacp1 becomes equal to the constant voltage Vref after the voltage Vcap2 has become equal to the constant voltage Vref, the output signal Vout stays at low level, and the capacitor C132 is discharged through the p-channel transistor Qn133. The time which lapses while the voltage Vacp1 or Vcap2 is rising from the ground level to the constant voltage Vref is half the one-cycle period T7 of the oscillator. Hence, the one-cycle period T7 is given as:

$$T7 = 2 \times r133 \times c131 \times \log_e(1/(131\ a)) \quad (47)$$

where r133 is the resistance of the resistors R133 and R134, c131 is the capacitance of the capacitors C131 and C132, and a is a constant represented as follows:

$$a = r132/(r131+r132) \quad (48).$$

As can be seen from Equations (47) and (48), the oscillating frequency of the oscillator according to the twentieth embodiment is influenced neither by the fluctuation of the supply voltage nor by the changes in the characteristics of the transistors incorporated in the oscillator.

With reference to FIGS. 49 and 50, an oscillator which is the twenty-first embodiment of the invention will be described.

As illustrated in FIG. 49, the amplifier 20 incorporated in this oscillator is deactivated by p-channel transistors Qp143 and Qp145 and n-channel transistors Qn144 and Qn145 being in off state. The selector 30 provided in the oscillator comprises NAND gates G141 and G142, p-channel transistors Qp141 and Qp142, and n-channel transistors Qn142 and Qn143.

The oscillator shown in FIG. 49 remains in standby state as long as the input signal Vin is at low level. While the oscillator remains in standby state, the voltages Vref is at high level, the output signal Vout at high level, and the voltage Vacp1 at low level, and the voltage Vcap2 at high level. When the input signal Vin rises from low level to high level, the oscillator is set into active state and starts operating as illustrated in FIG. 50.

The n-channel transistor Qn141 has an on-resistance much lower than that of resistors R141 and R142. The n-channel Qn142 and Qn143 have such a great transconductance that the n-channel transistors Qn142 and Qn143 may have an on-resistance sufficiently lower than that of resistors R143 and 144.Further, the p-channel transistors Qp141 and Qp142 have a transconductance which is large enough to charge capacitors C141 and C142 within half the one-cycle period of the oscillator, thereby to set the voltages Vacp1 and Vcap2 at the power-source level VCC. Therefore, the following Equation (49) holds true for the oscillator shown in FIG. 49:

$$Vref = r142/(r141+r142) \times VCC \quad (49)$$

where r141 and r142 are the resistances of the resistors R141 and R142, respectively.

The output signal Vout remains at low level until the voltage Vcap2 becomes equal to the constant voltage Vref after the voltage Vacp1 has become equal to the constant voltage Vref. Thus, the capacitor C141 is charged to the supply voltage VCC through the p-channel transistor Qp141. On the other hand, until the voltage Vacp1 becomes equal to the constant voltage Vref after the voltage Vcap2 has become equal to the constant voltage Vref, the output signal Vout stays at high level, and the capacitor C142 is charged to the supply voltage VCC through the p-channel transistor Qn142. The time which lapses while the voltage Vacp1 or Vcap2 is rising from the ground voltage VCC to the constant voltage Vref is half the one-cycle period T8 of the oscillator. Thus, the one-cycle period T8 is given as:

$$T8 = 2 \times r143 \times c141 \times \log_e(1/b) \tag{50}$$

where r143 is the resistance of the resistors R143 and c141 is the capacitance of the capacitors C141, and b is a constant represented as follows:

$$b = r142/(r141 + r142) \tag{51}$$

As can be seen from Equations (50) and (51), the oscillating frequency of the oscillator according to the twenty-first embodiment is influenced neither by the fluctuation of the supply voltage nor by the changes in the characteristics of the transistors incorporated in the oscillator.

FIG. 51 is a block diagram of a nonvolatile semiconductor memory according to the present invention, which comprises an NAND-type EEPROM.

As shown in FIG. 51, the memory comprises an oscillator 45, a charge pump circuit 58, and a memory unit 60. The memory unit 60 is constituted by a memory-cell array 51, a bit-line control circuit 52, a column decoder 53, an address buffer 54, a row decoder 55, a data I/O circuit 56, and a substrate-potential control circuit 57.

The column decoder 53 receives the address signals supplied from the address buffer 54 and generate an output, which is supplied to the bit-line control circuit 52. In accordance with the output of the decoder 53, the circuit 52 controls the bit lines (not shown) to write data into and read data from the memory-cell array 51. The row decoder 55 outputs control signals for the control and selection gates (not shown) of the memory-cell array 51. The substrate-potential control circuit 57 controls the potential of the p-type substrate (or p-type well) in which the memory-cell array 51 is provided.

The oscillator 45 supplies a drive signal to the charge pump circuit 58. Driven by this signal, the charge pump circuit 58 increases the power-supply voltage to a high voltage. The high voltage is supplied to the bit-line control circuit 52, the row decoder 55 and the substrate-potential control circuit 57, in order to write data into and erase data from the memory-cell array 51.

Figure 52A:
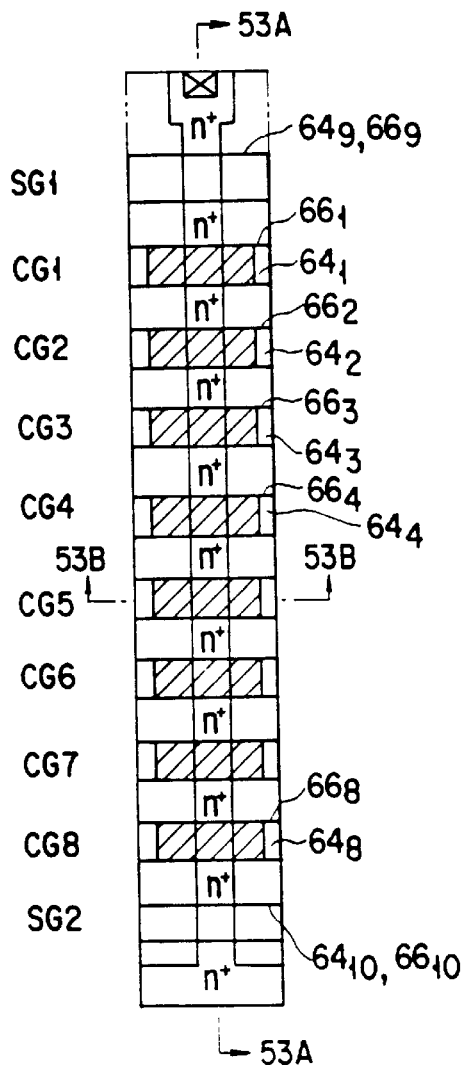
FIGS. 52A and 52B are a plan view and equivalent circuit diagram of the NAND cell incorporated in the memory illustrated in FIG. 51.
Figure 52B:
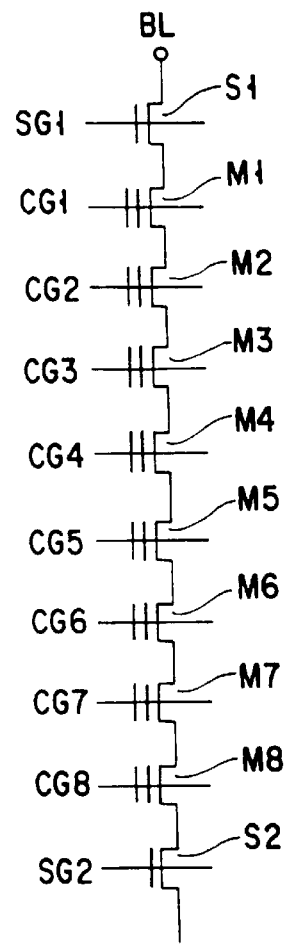
Figure 53A:
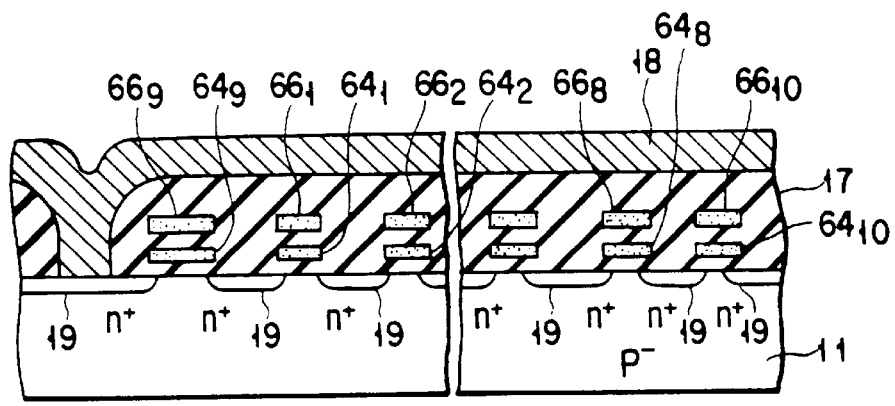
FIG. 53A and 53B are sectional views, taken along line 53A—53A and line 53B—53B shown in FIG. 52A, respectively.
Figure 53B:
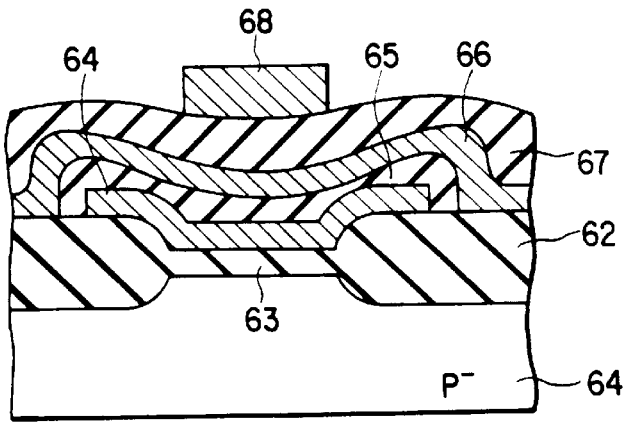

The memory-cell array 51 has a plurality of NAND cells which are identical. One of the NAND cells will be described with reference to FIGS. 52A and 52B and FIGS. 53A and 53B. FIGS. 52A and 52B are a plan view and equivalent circuit diagram of the NAND cell incorporated in the memory-cell array 51. FIG. 53A and 53B are sectional views, taken along line 53A—53A and line 53B—53B shown in FIG. 52A. As shown in FIGS. 52A, 52B, 53A and 53B, the NAND cell is provided in a p-type well which is surrounded by an element-isolating oxide film 62 or a p-type silicon substrate 61, . The NAND cell comprises eight memory cells M1 to M8 which are connected in series.

Each of the memory cells M1 to M8 has a floating gate 64 ($64_1$, $64_2$..., or $64_8$), a gate insulating film 65, and a control gate 66 ($66_1$, $66_2$, ..., $66_8$). The floating gate 64 is provided on a tunnel insulating film 63 which in turn is provided on the p-type silicon substrate 61. The gate insulating film 65 is provided on the floating gate 64. The control gate 66 is mounted on the gate insulating film 65. The source and drain of the memory cell are formed of n-type diffusion layers provided in the surface of the p-type silicon substrate 61. The source serves as the drain of one adjacent memory cell, and the drain serves as the source of the other adjacent memory cell.

The NAND cell further has four selection gates $64_9$, $66_9$, $64_{10}$ and $66_{10}$. The selection gates $64_9$ and $66_9$ are provide on the drain side of the NAND cell, and the selection gates $64_{10}$ and $66_{10}$ on the source side of the NAND cell. The substrate 61 with the NAND cells formed on it is covered with a CVD oxide film 67. Provided on the CVD oxide film 67 are bit lines 68 which contact the drain diffusion layer 69 of the NAND cell. The control gates $66_1$, $66_2$, ..., $66_8$ of the NAND cell extend in the row direction and serve as control gate lines CG1, CG2, ..., CG8, respectively. These control gate lines function as word lines. The selection gates $64_9$ and $66_9$ extend in the row direction and function as a selection gate SG1. Similarly, the selection gates $64_{10}$ and $66_{10}$ extend in the row direction and function as a selection gate SG2.

Figure 54:
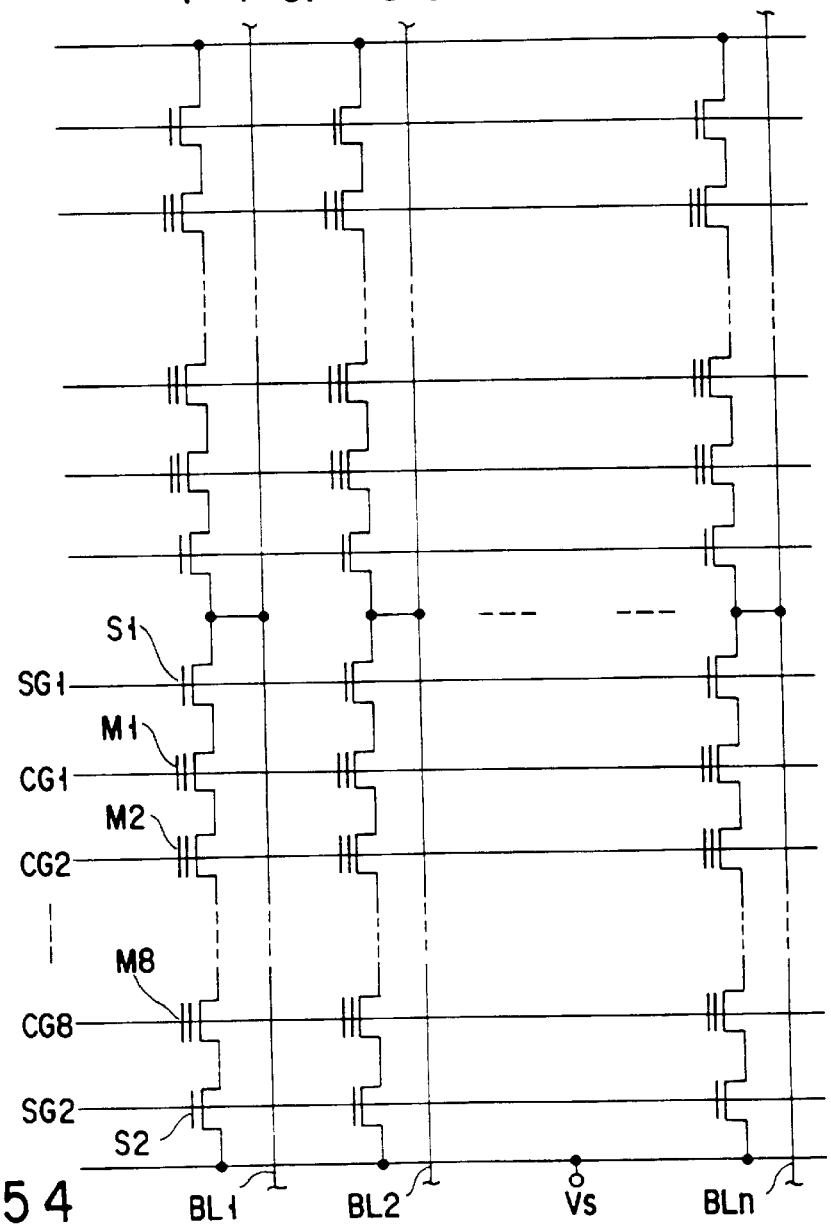
FIG. 54 is an equivalent circuit diagram of the NAND-type cell array provided in the memory shown in FIG. 51.

FIG. 54 is an equivalent circuit diagram of the memory-cell array 51 comprising the above-described NAND-type cells which are arranged in row and columns.

Figure 55A:
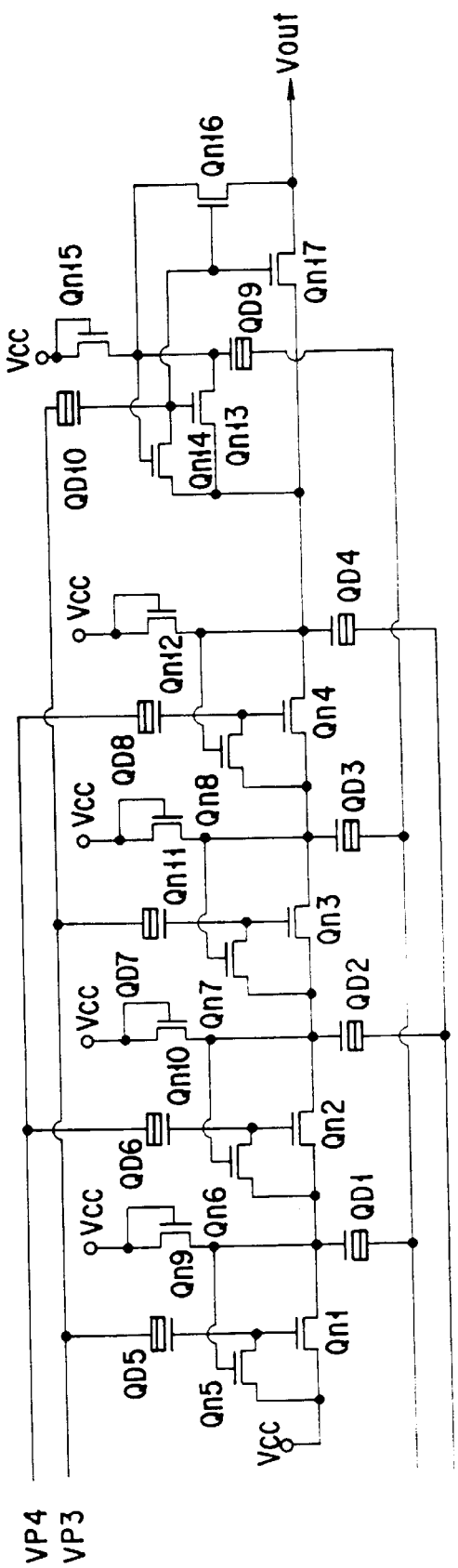
FIGS. 55A and 55B are circuit diagrams showing a charge pump circuit according to a twenty-second embodiment of the present invention.
Figure 56:
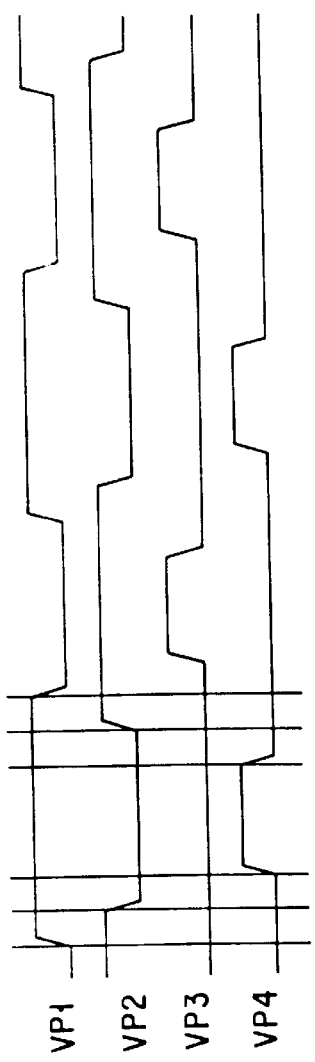
FIG. 56 is a timing chart showing the waveforms of the signals for driving the charge pump circuits shown in FIGS. 57A and 57B.
Figure 55B:
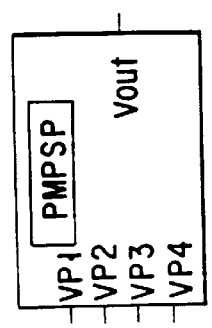

With reference to FIGS. 55A and 55B, a charge pump circuit 58 according which is the twenty-second embodiment of the invention will be described. FIG. 56 is a timing chart showing the waveforms of the signals VP1, VP2, VP3 and VP4 output by an oscillator 45 for driving the charge pump circuit 58.

The charge pump circuit 58 comprises D-type n-channel MOS transistors QD1 to QD4 and E-type n-channel MOS transistors Qn1 to Qn4 and Qn17. The D-type n-channel transistors QD1 to QD4 are used as capacitors, and the E-type n-channel MOS transistors Qn1 to Qn4 and Qn17 are used as transfer gates. The charge pump circuit 58 further comprises D-type n-channel MOS transistors QD5 to QD8 and E-type n-channel MOS transistors Qn5 to Qn8. The D-type n-channel MOS transistors QD5 to QD8 are used as capacitors, and the E-type n-channel MOS transistors Qn5 to Qn8 are used as transfer gates, for raising the gate voltages of the E-type n-channel MOS transistors Qn1 to Qn4 (used as transfer gates) to prevent a voltage drop due to the threshold voltages of the transistors Qn1 to Qn4.

The charge pump circuit 58 further comprises E-type n-channel MOS transistors Qn13, Qn14 and Qn15, D-type n-channel MOS transistors QD9 and QD10, and an E-type n-channel MOS transistor Qn16. The transistors Qn13, Qn14 and Qn15, QD9 and QD10 are provided for increasing the gate voltage of the E-type n-channel MOS transistor Qn17 (used as a transfer gate) to prevent a voltage drop due to the threshold voltage of the transistor Qn17. The transistor Qn16 is used to equalizing the gate voltage of the E-type n-channel MOS transistor Qn14 and the output voltage vpp. The MOS transistors Qn13, Qn14, Qn15, QD9 and QD10 constitute a dummy set-up stage.

The twenty-second embodiment and the embodiments to be described below have four charge pump stages. Nevertheless, more or less charge pump stages may be used instead, if necessary.

While the signal VP1 remains "L", the transistors QD1 and AD3 (capacitors) are charged with the supply voltage VCC. While the signal VP1 remains "H", the charges in the transistors QD1 and QD3 are transferred via the transistors Qn6 and Qn8 (transfer gates) to the transistors QD1 and QD3 (capacitors), thereby raising the gate voltages of the transistors Qn2 and Qn4 (transfer gates). When the signals VP2 and VP4 change to "L" and "H", respectively, the charges in the transistors QD1 and QD3 are transferred through the transistors Qn2 and Qn4 to the transistors QD2 and QD4, which are thereby charged.

The sequence of the operations indicated in the preceding paragraph is repeated, whereby the charge pump circuit 58 outputs a high voltage Vout. The ability of the circuit 58 gradually decreases as the supply voltage VCC falls. This decrease in the charge pump ability is compensated the frequencies of the drive signals VP1, VP2, VP3 and VP4, which gradually increase.

With reference to FIGS. 57A and 57B, a charge pump circuit 58 according to the twenty-third embodiment of the invention will be described. FIG. 58 is a timing chart showing the waveforms of the signals V1 and V2 output by an oscillator 45 for driving the charge pump circuit 58.

The charge pump circuit 58 comprises D-type n-channel MOS transistors QD5 to QD8 and E-type n-channel MOS transistors Qn18 to Qn21. The D-type n-channel transistors QD5 to QD8 are used as capacitors, and the E-type n-channel MOS transistors Qn18 to Qn21 are used as transfer gates, for increasing the input voltage to generate a high voltage. When the drive signal vi falls from "H" to "L" and the drive signal V2 simultaneously rises from "L" to "H", the E-type n-channel transistors MOS transistors Qn18 and Qn20 are turned on, and the E-type n-channel transistors Qn19 and Qn21 are turned off. As a result, the charges in the transistors QD5 and QD7 (capacitors) are transferred to the transistors QD5 and QD8 (capacitors), respectively.

When the drive signals V1 rises from "L" to "H" and the drive signal V2 falls from high level to low level, the E-type n-channel transistors MOS transistors Qn18 and Qn20 are turned off, and the E-type n-channel transistors Qn19 and Qn21 are turned on. Hence, the charges in the transistors QD6 and QD8 are transferred to the transistors QD7 and the output terminal Vout, respectively. The sequence of the operations indicated in the preceding paragraph is repeated, whereby the charge pump circuit 58 outputs a high voltage Vout. The ability of the circuit 58 gradually decreases as the supply voltage VCC falls. This decrease in the charge pump ability is compensated the frequencies of the drive signals V1 and V2, which gradually increase.

With reference to FIGS. 59A and 59B, a ring oscillator according to the present invention will be described. While the input signal Vin is at "L", the ring oscillator does not operate, and the output signal VRNG remains at "H". When the input signal Vin rises to "H", the ring oscillator starts operating.

The oscillators according to the fourteenth to twenty-first embodiments of the invention may be used to drive the charge pump circuit according to the present invention. The charge pump circuit can be driven by oscillators of other types, which will be described below. These oscillators are similar in circuit structure to the fourteenth to twenty-first embodiments. Therefore, the following description may overlap in part the description of the fourteenth to twenty-first embodiments.

FIGS. 60A and 60B show in detail a first example of an oscillator.

As illustrated in FIG. 60A, one end of a capacitor C1 is selectively connected to either the supply voltage VCC terminal or the drain of an n-channel MOS transistor Qn34, depending on the voltage applied to the common gate of an n-channel MOS transistor Qn36 and a p-channel MOS transistor Qp9. Similarly, one end of a capacitor C2 is selectively connected to either the supply voltage VCC terminal or the drain of an n-channel MOS transistor Qn35, depending on the voltage applied to the common gate of an n-channel MOS transistor Qn37 and a p-channel MOS transistor Qp10.

As can be seen from FIG. 60A, n-channel MOS transistors Qn27 and Qn28 and p-channel MOS transistors Qp1, Qp2 and Qp3 constitute a first amplifier which compares the voltage Vref at the gate and drain of an n-channel MOS transistor Qn33 with the voltage Vacp1 at one end of the capacitor C1. Further, n-channel MOS transistors Qn29 and Qn30 and p-channel MOS transistors Qp4, Qp5 and Qp6 constitute a second amplifier which compares the voltage Vref with the voltage Vcap2 at one end of the capacitor C2. NOR gates G2 and G3 form a sequential logic circuit which outputs output sequential logic data for the first and second amplifiers.

The voltage at the common gate of the p-channel MOS transistor Qp36 and the n-channel MOS transistor Qp9 and the voltage at the common gate of the p-channel MOS transistor Q37 and the n-channel MOS transistor Qp10 are alternately set at high or low level ("H/L"), in accordance with the output of the sequential logic circuit.

The oscillator shown in FIG. 60B is in standby state as long as the input signal Vin is at "H". While the oscillator remains in standby state, n-channel MOS transistors Qn26, Qn100 and Qn101 are on, and the p-channel MOS transistors Qp1 and Qp4 are in off state. Voltages Vref, Vcap2 and Vosc1 are at "L", and voltages Vacp1 and Vosc2 are at "H".

When the input signal Vin rises from "L" to "H", the n-channel MOS transistor Qn30 is in off state, and its drain voltage changes to "H". At this time, the output voltages Vosci and Vosc2 are inverted, turning on the n-channel MOS transistor Qn36 and the p-channel MOS transistor Qp10. Now that the p-channel MOS transistor Qp10 is closed, the voltage Vcap2 fast increases. The sequential logic circuit is thereby reset. The voltage Vcap 1 linearly falls with time from the power-source level VCC because a constant current flows through the n-channel MOS transistor Qn34. The moment the voltage Vacp1 falls below the voltage Vref, the output of the amplifier is inverted. As a result, the sequential logic circuit inverts the output voltages Vosc1 and Vosc2. The output voltages Vosc1 and Vosc2 are repeatedly inverted in level, each time as described above. Namely, the oscillator performs its function.

It will be explained how the oscillating frequency f of the oscillator shown in FIG. 60B decreases as the supply voltage VCC rises.

As shown in FIG. 60B, a constant voltage Vst is applied to the gate of an n-channel MOS transistor Qn31. A constant voltage Vd, which is independent of the supply voltage, is applied to the source of the n-channel MOS transistor Qn31. The voltage Vref is determined by only the resistance R of a resistor R1 and the conductance g1 of the n-channel MOS transistor Qn33; it does not depend upon the supply voltage VCC. For simplicity, it is assumed that the n-channel MOS transistors Qn34 and Qn35 have the same conductance g2 and that the capacitors C1 and C2 have the same capacitance C. Then, the current Iref flowing through the n-channel MOS transistor Qn33 and the current Icap flowing through the n-channel MOS transistor Qn34 (or Qn35) are expressed as follows:

$$Iref = (Vd - Vref)/R \quad (52)$$

$$Icap = Iref \times (g2/g1) \quad (53)$$

The one-cycle oscillation period T of the oscillator is twice the time lapsing while the voltage Vacp1 is changing from VCC to Vref. Namely:

$$T=2\times C\times(Vcc-Vref)/Icap=2\times R\times C\times(g2/g1)\times(Vcc-Vref)/(Vd-Vref) \quad (54)$$

From Equation (54) is obvious that the oscillating frequency f (=1/T) of the oscillator is inversely proportional to (Vcc–Vref).

In Equation (54), the conductances g1 and g2 are inserted in a form of (g1/g2). The conductance g1 of the n-channel MOS transistor Qn33 and the conductance g2 of n-channel MOS transistors Qn34 and Qn35 may differ from the respective design values. This is because the existing technology fails to manufacture MOS transistors under the very conditions prescribed. Nonetheless, if the conductances g1 and g2 differ from the design values, they deviate by the same degree. The ratio of g2 to g1, i.e., (g2/g1) in Equation (54), does not change at all. In addition, Equation (54) includes no term involving the threshold voltage Vt of any transistor, which changes with temperature. Thus, the oscillating frequency of the oscillator shown in FIG. 60B depends upon neither the changes in the characteristics of the transistors nor the changes in temperature.

The oscillating frequency of the oscillator is represented by an equation which includes a distinct term of the conductance of the MOS transistor used and another distinct term of the threshold voltage thereof. Inevitably, the oscillating frequency is influenced by the changes in the characteristics of the transistors and by the changes in temperature.

Figure 61A:
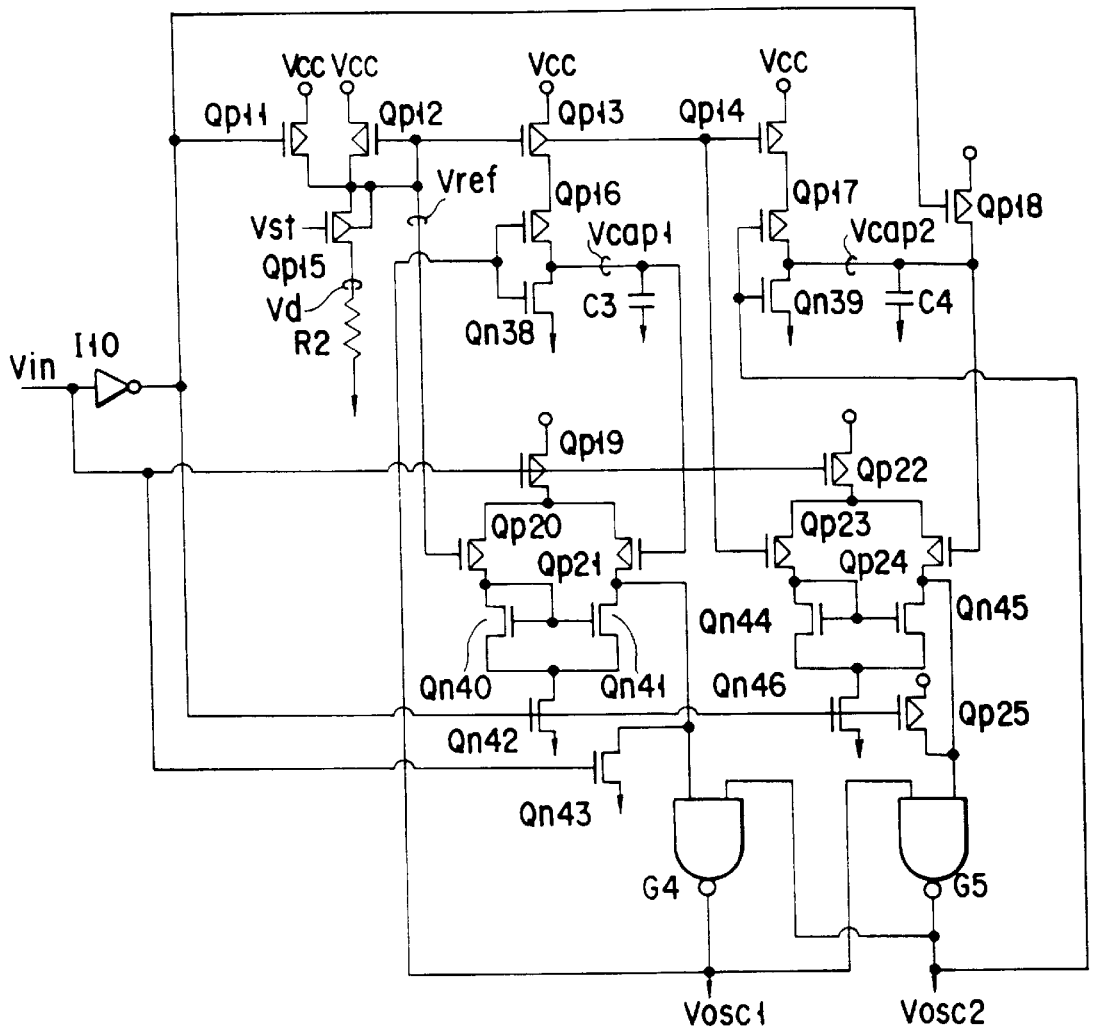
FIGS. 61A and 61B are circuit diagrams depicting a second example of the oscillator.
Figure 61B:
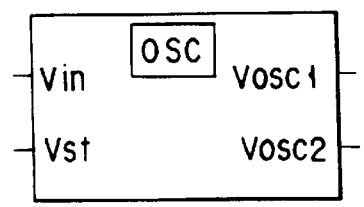

FIGS. 61A and 61B shows in detail a second example of the oscillator.

As shown in FIG. 61A, one end of a capacitor C3 is selectively connected to either the supply voltage Vss, which is equal to the ground level, or the drain of a p-channel MOS transistor Qp13, depending on the voltage applied to the common gate of an n-channel MOS transistor Qn38 and a p-channel MOS transistor Qp16. One end of a capacitor C4 is selectively connected to either the supply voltage VSS terminal or the drain of a p-channel MOS transistor Qp14, depending on the voltage applied to the common gate of an n-channel MOS transistor Qn39 and a p-channel MOS transistor Qp17.

As can be understood from FIG. 61A, n-channel MOS transistors Qn40, Qn41 and Qn42 and p-channel MOS transistors Qp19, Qp20 and Qp21 constitute a first amplifier which compares the voltage Vref at the gate and drain of a p-channel MOS transistor Qp12 with the voltage Vacp1 at one end of the capacitor C3. Further, n-channel MOS transistors Qn44, Qn45 and Qn46 and p-channel MOS transistors Qp22, Qp23 and Qp24 constitute a second amplifier which compares the voltage Vref with the voltage Vcap2 at one end of the capacitor C4. NAND gates G4 and G5 form a sequential logic circuit which outputs output sequential logic data for the first and second amplifiers.

The voltage at the common gate of the n-channel MOS transistor Qn38 and the p-channel MOS transistor Qp16 and the voltage at the common gate of the n-channel MOS transistor Q39 and the p-channel MOS transistor Qp17 are alternately set at high or low level ("H/L"), in accordance with the output of the sequential logic circuit.

The oscillator shown in FIG. 61B is in standby state as long as the input signal Vin is at high level. While the oscillator remains in standby state, n-channel MOS transistors Qn43, p-channel transistors Qp11, Qp18 and Qp25 are in on state, and the n-channel MOS transistors Qn42 and Qn46 and the p-channel MOS transistors Qp19 and Qp20 are in off state. Voltages Vref, Vcap2 and Vosc1 are at "H", and voltages Vacp1 and Vosc2 are at "L".

When the input signal Vin falls from "H" to "L", the p-channel MOS transistor Qp24 is in off state, and its drain voltage changes to "H". At this time, the output voltages Vosc1 and Vosc2 are inverted, turning on the n-channel MOS transistor Qn39 and the p-channel MOS transistor Qp16. Now that the n-channel MOS transistor Qn39 is conducting, the voltage Vcap2 fast decreases. The sequential logic circuit is thereby reset. The voltage Vcap 1 linearly falls with time from the power-source level VSS because a constant current flows through the p-channel MOS transistor Qp13. The moment the voltage Vacp1 rises above the voltage Vref, the output of the amplifier is inverted. As a result, the sequential logic circuit inverts the output voltages Vosc1 and Vosc2. The output voltages Vosc1 and Vosc2 are repeatedly inverted in level, each time as described above. In other words, the oscillator performs its function.

It will be explained how the oscillating frequency f of the oscillator shown in FIG. 60B decreases as the supply voltage VCC rises.

As shown in FIG. 61B, a constant voltage Vst is applied to the gate of a p-channel MOS transistor Qp15. A constant voltage Vd, which is independent of the supply voltage, is applied to the drain of the p-channel MOS transistor Qp15. The voltage Vref is determined by only the resistance R of a resistor R2, the conductance g1 of the p-channel MOS transistor Qp12 and the conductance g2 of the p-channel MOS transistor Qp15; it increases as the supply voltage VCC rises. For simplicity, it is assumed that the p-channel MOS transistors Qp13 and Qp14 have the same conductance g2 and that the capacitors C3 and C4 have the same capacitance C. Then, the current Iref flowing through the n-channel MOS transistor Qn33 and the current Icap flowing through the n-channel MOS transistor Qn34 (or Qn35) are expressed as follows:

$$Iref=Vd/R \quad (55)$$

$$Icap=Iref\times(g2/g1) \quad (56)$$

The one-cycle oscillation period T of the oscillator is twice the time lapsing while the voltage Vacp1 is changing from VCC to Vref. Namely:

$$T=2\times C\times Vref/Icap=2\times R\times C\times(g2/g1)\times Vref/Vd \quad (57)$$

From Equation (57) it is apparent that the oscillating frequency f (=1/T) of the oscillator is inversely proportional to (Vcc–Vref).

Equation (57) does not include a distinct term of g1 or a distinct term of g2, though having a term of (g2/g1). Further, it includes no term involving the threshold voltage Vt of any transistor, which changes with temperature. Thus, the oscillating frequency of the oscillator shown in FIG. 61B depends upon neither the changes in the characteristics of the transistors nor the changes in temperature, as the oscillating frequency of the oscillator illustrated in FIG. 60B.

FIGS. 62A and 62B show a circuit for generating drive signals VP1 to VP4 of the charge pump circuit of FIGS. 55A and 55B. As illustrated in FIG. 62A, a constant voltage Vst is applied to the gate of a p-channel MOS transistor Qp29, and a constant voltage, which is dependent of the supply voltage, is applied to the drain of the transistor Qp29. Thus, the inverter comprised of an n-channel MOS transistor Qn51 and a p-channel MOS transistor Qp30 has a delay time which does not depend on the supply voltage VCC.

FIGS. 63A and 63B show a constant voltage generating section of a first type. This circuit is characterized in that the output signal Vout is equal to the difference between the threshold voltages of an n-channel MOS transistors Qn48 and Qn11. FIG. 64 is a block diagram of a charge pump circuit incorporating the constant-voltage generator of the first type (FIGS. 63A and 63B). The charge pump circuit is driven by the output of an oscillator whose oscillating frequency increases as the supply voltage falls. The charge pump circuit comprises a constant-voltage generator 11, an oscillator 45, a charge pump section 58. Its charge pump ability depends on the supply voltage VCC but only a little.

FIG. 65 is a block diagram of a charge pump circuit incorporating a constant-voltage generator of the second type. This charge pump circuit includes an oscillator 45 and two charge pump sections 58A and 58B. The first charge pump section 58A is provided for generating a constant voltage, and the second charge pump section 58B for charging a load capacitor to generate a high voltage required in writing and erasing data. Both charge pump sections 58A and 58B are driven when the input signal Von rises from "L" to "H". The p-channel MOS transistor Qp36 remains on until the delay time Td elapses, and the drain voltage Vm of the transistor Qp36 is equal to the supply voltage VCC. Hence, the oscillating frequency of the oscillator 45 decreases as the supply voltage falls.

The first charge pump section 58A has a small load capacitance. Its output voltage is immediately set at the breakdown voltage Vz of a zener diode ZD1. Thereafter, the p-channel MOS transistor Qp36 is turned off upon lapse of the delay time Td. The drain voltage Vm changes to a value of the resistance division of the breakdown voltage Vz. Needless to say, this value does not depend on the supply voltage VCC. The oscillating frequency of the oscillator 45 therefore increases as the supply voltage falls. The charge pump ability of the second charge pump section 58B is therefore less dependent on the supply voltage than otherwise.

FIG. 66 is a block diagram of a charge pump circuit incorporating a constant-voltage generator of the third type.

As shown in FIG. 66, the constant-current generator comprises a ring oscillator 46 of the type shown in FIG. 59A and 59B, a charge pump circuit 58A driven by the output signal RNG of the oscillator 46, a zener diode ZD2, and resistors R5 and R6 for resistance-dividing the breakdown voltage Vz. Before the delay time Td elapses, a constant voltage is applied to the oscillator 45, a charge pump circuit 58C of the type shown in FIGS. 55A and 55B, and a signal generator 59 of the type shown in FIG. 62A and 62B, but the oscillator 45, the circuit 58C and the generator 59 do begin to operate. Upon lapse of the delay time Td, the oscillator 45, the circuit 58C and the generator 59 start operating. The charge pump circuit 58C is driven, charging a load capacitor to generate a high voltage for writing or erasing data. Thus, the charge pump ability of the charge pump circuit is rendered less dependent on the supply voltage.

Figure 67:
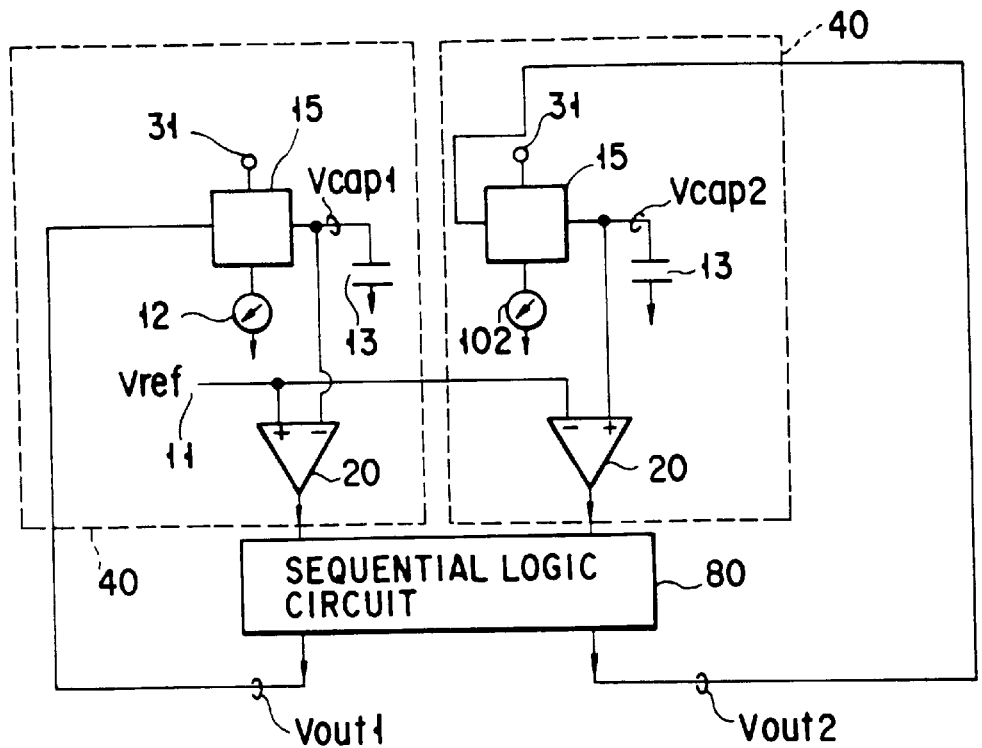
FIG. 67 is a circuit diagrams depicting a third example of the oscillator.
Figure 68:
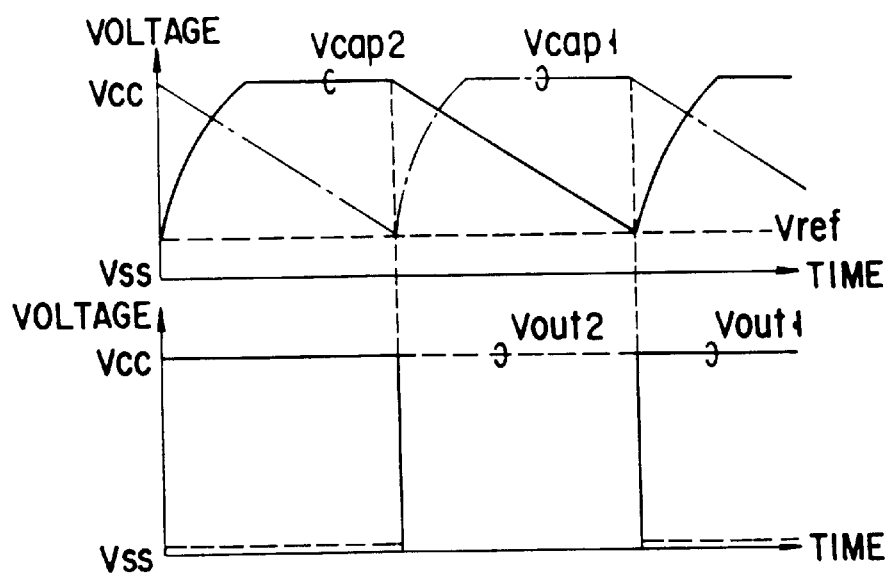
FIG. 68 is a timing chart representing the waveforms of the voltages at the major nodes in the oscillator of FIG. 67.

FIG. 67 is a circuit diagrams depicting a third example of the oscillator, and FIG. 68 shows the waveforms of the voltages at the major nodes in the oscillator.

As shown FIG. 67, the oscillator comprises two delay circuits 40 and a sequential logic circuit 80. The outputs of both delay circuits 40 are supplied to the sequential logic circuit 80. The outputs Vout1 and Vout 2 of the sequential logic circuit 80 are fed back to the delay circuits 40. Voltage Vacp1 linearly falls with time from the power-source level VCC due to discharging by a constant current. When the voltage Vacp1 falls below the voltage Vref, the outputs of the amplifiers 20 provided in the delay circuits 40 is inverted. As a result, the outputs Vout1 and Vout 2 of the sequential logic circuit 80 are inverted. Then, the voltage Vacp1 fast increases to the power-source level VCC, while the voltage Vcap2 linearly falls with time from the power-source level VCC, due to discharging by the constant voltage. When the voltage Vcap2 falls below the voltage Vref, the output of the amplifiers 20 are inverted, whereby the outputs Vout1 and Vout 2 of the sequential logic circuit 80 are inverted.

The sequence of operations, which is described in the preceding paragraph, is repeated. Namely, the oscillator shown in FIG. 67 performs its function. The amplitudes of the voltages Vacp1 and Vcap2 increase with the supply voltage VCC, whereas the oscillating frequency of the oscillator decreases in inverse proportion to the voltage VCC since the drive current is constant.

FIG. 69 shows a fourth example of the oscillator, and FIG. 70 represents the waveforms of the voltages at the major nodes in the oscillator.

As shown in FIG. 70, constant voltage Vref increases with the supply voltage VCC. The outputs of two delay circuits 40 are input to a sequential logic circuit 80. The outputs Vout1 and Vout 2 of the circuit 80 are fed back to the delay circuits 40. Voltage Vacp1 linearly increases with time from the ground level, due to a constant current. When the voltage Vcap 1 rises above the constant voltage Vref, the outputs of the amplifiers 20 incorporated in the delay circuits 40 are inverted. The outputs Vouti and Vout2 of the sequential logic circuit 80 are thereby inverted. Then, the voltage Vacp1 falls fast to the ground level, whereas the voltage Vcap2 linearly rises with time from the ground level. When the voltage Vcap2 rises above the constant voltage Vref, the outputs of the amplifiers 20 are inverted, whereby the outputs Vout1 and Vout2 of the circuit 80 are inverted.

The sequence of operations, described in the preceding paragraph, is repeated. In other words, the oscillator shown in FIG. 69 performs its function. The amplitudes of the voltages Vacp1 and Vcap2 increase with the supply voltage VCC, whereas the oscillating frequency of the oscillator decreases in inverse proportion to the voltage VCC since the drive current is constant.

Figure 71:
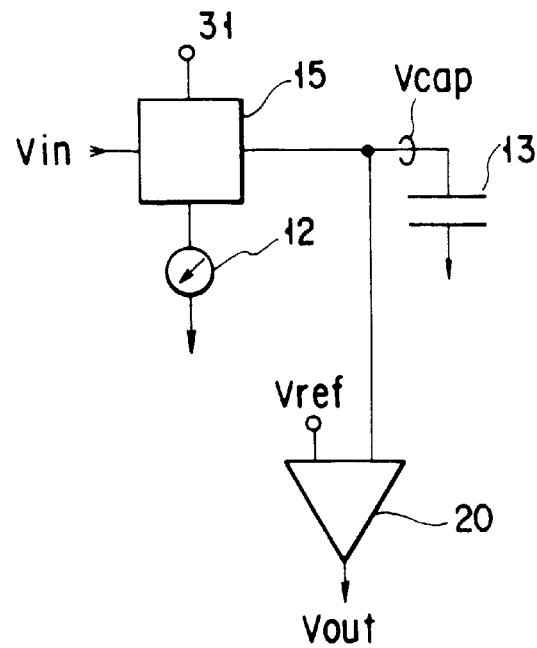
FIG. 71 is a diagram illustrating the delay circuit provided in an oscillation circuit.
Figure 72:
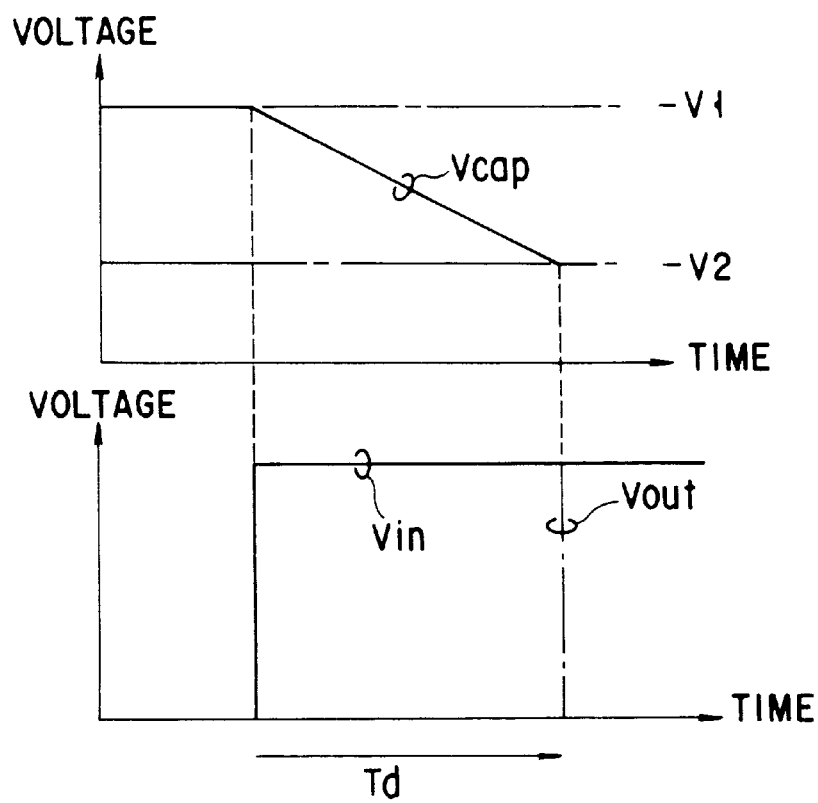
FIG. 72 is a timing chart representing the waveforms of the voltages at the major nodes in the delay circuit of FIG. 71.

FIG. 71 illustrates one of the delay circuits 40 provided in an oscillation circuit, and FIG. 72 represents the waveforms of the voltages at the major nodes in the delay circuit 40.

In the delay circuit, one end of the capacitor 30 is connected to the power-source current terminal 31 until the input signal Vin is inverted. When the input signal Vin is inverted, the voltage Vcap at that end of the capacitor 13 changes with time at a constant rate, due to the constant-current source 12. The amplifier 20 compares the voltage Vcap with reference voltage Vref and amplifies the difference between the voltages Vcap and Vref. Thus, the output of the amplifier 20 is inverted when the voltages Vcap and Vref become equal.

When the power-source current terminal 31 is at the supply voltage VCC, voltages V1 and V2 are equal to VCC and Vref, respectively, and the voltage Vcap decreases with time. The reference voltage Vref falls in inverse proportion to the supply voltage VCC or remains unchanged even if the supply voltage VCC changes. The delay time Td lapsing until the output is inverted after the inversion of the input is given:

$$Td = C \times (VCC - Vref)/Iconst$$

where C is the capacitance of the capacitor 13 and Iconst is the current generated by the constant-current source 12.

Obviously, the delay time Td is proportional to the supply voltage VCC.

When the power-source current terminal 31 is at the supply voltage VSS (=0 V), voltages V1 and V2 are equal to VSS and Vref, respectively, and the voltage Vcap increases with time. The reference voltage Vref rises in proportion to the supply voltage VCC. The delay time Td lapsing until the output is inverted after the inversion of the input is given:

$$Td = C \times Vref/Iconst$$

Therefore, the delay time Td increases with the supply voltage VCC.

The present invention is not limited to the embodiments described above.

The memory-cell array is not limited to a NAND-type one. Rather, it may be a NOR-type cell array (either an AND type comprising a cell unit having a plurality of memory cells connected in parallel and select gates connected to the ends of the cell unit, or a DINOR type comprising a cell unit and a select gate connected to one end of the cell unit). Further, it may be a DRAM cell array.

Moreover, the memory cells are not limited to FETMOS-type ones, each having two gate layers. They may instead be of any other type that needs a raised voltage to store or erase data.

Furthermore, various changes and modifications can be made without departing the scope and spirit of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An oscillator circuit comprising:
   a voltage-generating circuit for generating a first voltage and a second voltage;
   a capacitor having one end connected to one of a first power supply and a second power supply;
   a first amplifier for receiving the first voltage and a voltage of another end of said capacitor and for amplifying and outputting a first difference voltage which is a difference between the first voltage and the voltage of another end of said capacitor;
   a second amplifier for receiving the second voltage and the voltage of another end of said capacitor and for amplifying and outputting a second difference voltage which is a difference between the second voltage and the voltage of another end of said capacitor; and
   a selection circuit for alternately charging and discharging said capacitor in accordance with the first and second difference voltages, wherein
      said voltage-generating circuit includes a circuit for generating first and second currents proportional to the difference between the first and second voltages, respectively, and
      said selection circuit selects the first and second currents alternately to said capacitor, in accordance with outputs of the first and second amplifiers.

2. The oscillator circuit according to claim 1, wherein said capacitor includes a MOS capacitor, and said capacitor is made of first and second conductive layers and an insulator formed therebetween.

3. An oscillator circuit comprising:
   a voltage-generating circuit for generating a first voltage and a second voltage;
   a capacitor having one end connected to a first power supply;
   a first amplifier for receiving the first voltage and a voltage of another end of said capacitor and for amplifying and outputting a first difference voltage which is a difference between the first voltage and the voltage of another end of said capacitor;
   a second amplifier for receiving the second voltage and the voltage of another end of said capacitor and for amplifying and outputting a second difference voltage which is a difference between the second voltage and the voltage of another end of said capacitor; and
   a selection circuit for alternately charging and discharging said capacitor in accordance with the first and second difference voltages, wherein
      said voltage-generating circuit is connected between first and second power supply terminals, and generates said first and second voltages corresponding to voltage of said first power supply and a second power supply, respectively,
      a first end of a resistor is connected to another end of said capacitor,
      said first and second amplifiers compare a voltage at another end of said capacitor with the first voltage and with the second voltage, respectively, thereby amplifying and outputting first and second difference voltages, and
      said selection circuit alternatively connects a second end of said resistor with said first power supply and said second power supply in accordance with outputs of the first and second amplifier.

4. The oscillator circuit according to claim 3, wherein:
   said capacitor includes a MOS capacitor, and said capacitor is made of first and second conductive layers and an insulator formed therebetween, and
   said resistor includes one of a diffusion layer and a conductive material.

5. An oscillator circuit comprising:
   a voltage-generating circuit for generating a voltage;
   first and second capacitors to be charged and discharged; and
   a selection circuit for comparing the voltage with a first voltage at a storage node of said first capacitor and with a second voltage at a storage node of said second capacitor, thereby to charge and discharge said first capacitor and said second capacitor alternately, in accordance with a first difference voltage between the voltage and said first voltage and a second difference voltage between the voltage and said second voltage, wherein,
      said voltage-generating circuit includes a circuit for generating first and second currents in accordance with the voltage,
      said first and second currents are proportional to a difference between the voltage and a power supply voltage or a ground voltage, and
      said selection circuit selects the first and second currents alternately through said first and second capacitors, in accordance with said first and second difference voltages.

6. The oscillator circuit according to claim 5, wherein said first and second capacitors include MOS capacitors and each of said first and second capacitors is made of first and second conductive layers and an insulator formed therebetween.

7. An oscillator circuit comprising:
   a voltage-generating circuit for generating a voltage;
   first and second capacitors to be charged and discharged; and
   a selection circuit for comparing the voltage with a first voltage at a storage node of said first capacitor and with a second voltage at a storage node of said second capacitor, thereby to charge and discharge said first capacitor and said second capacitor alternately, in accordance with a first difference voltage between the voltage and said first voltage and a second difference voltage between the voltage and said second voltage, wherein;

said voltage is a divided voltage of a power supply voltage, and one end of said first and second capacitors are connected to one end of first and second resistors respectively.

8. The oscillator circuit according to claim 7, wherein said first and second capacitors including MOS capacitors and each of said first and second capacitors is made of first and second conductive layers and an insulator formed therebetween.

9. A semiconductor memory device comprising:

a memory unit for storing data;

an oscillator circuit having an oscillating frequency which depends on a power supply voltage; and a charge pump circuit having a charge pumping ability which depends on a driving frequency, for raising the power supply voltage when driven by said oscillator circuit, thereby to generate a voltage required to write into said memory unit and erase data from said memory unit, wherein said oscillator circuit includes a first delay circuit comprising:

a constant-current generating circuit for generating a substantially constant current, a first capacitor connected at one end to said constant-current generating circuit when an input signal is inverted, a reference-voltage generating circuit for generating a reference voltage, a difference voltage generating circuit for generating a difference voltage between said reference voltage and a voltage at said one end of said capacitor increasing with the power supply voltage until the input signal is inverted, and a first amplifier circuit for amplifying and outputting the difference voltage.

10. The semiconductor memory device according to claim 9, wherein said memory unit has a plurality of FETMOS nonvolatile memory cells.

11. The semiconductor memory device according to claim 10, wherein said memory unit has an EEPROM which comprises a plurality of NAND-type cells each having said plurality of memory cells connected in series.

12. The semiconductor memory device according to claim 11, wherein said capacitor includes a MOS capacitor, and said capacitor is made of first and second conductive layers and an insulator formed therebetween.

13. The semiconductor memory device according to claim 10, wherein said capacitor includes a MOS capacitor, and said capacitor is made of first and second conductive layers and an insulator formed therebetween.

14. The semiconductor memory device according to claim 9, wherein said oscillator circuit further includes a second delay circuit, said second delay circuit comprises a second constant-current generating circuit for generating a constant current, a second capacitor which is connected at one end to said second constant-current generating circuit when the input signal is inverted, and a second amplifier circuit for amplifying and outputting a difference between a voltage at said one end of the second capacitor and the reference voltage, and a sequential logic circuit outputs data representing an order in which the outputs of said first and second amplifier circuits are to be output, to said second delay circuit.

15. The semiconductor memory device according to claim 14, wherein said constant-current generating circuit comprises a first MOS transistor having a gate, a source and a drain connected to the gate, a resistor element connected in series to the first MOS transistor, and a second MOS transistor having a gate connected to an output of said reference-voltage generating circuit which outputs a voltage at the gate of the first MOS transistor, a drain selectively connected to said one end of said first capacitor, together with a power-supply terminal.

16. The semiconductor memory device according to claim 15, wherein:

said first and second capacitors include a MOS capacitor and each of said first and second capacitors is made of first and second conductive layers and an insulator formed therebetween; and said resistor includes one of a diffusion layer and a conductive material.

17. The semiconductor memory device according to claim 14, wherein said first and second capacitors include a MOS capacitor and each of said first and second capacitors is made of first and second conductive layers and an insulator formed therebetween.

18. The semiconductor memory device according to claim 9, wherein said capacitor includes a MOS capacitor, and said capacitor made of first and second conductive layers and an insulator formed therebetween.

19. An oscillator circuit comprising:

a capacitor having a first terminal connected to one of a power supply voltage terminal and a ground, and a second terminal;

a resistor having first and second terminals;

a first pMOSFET having a source connected to said power supply voltage terminal, a gate, and a drain connected to the gate of said first pMOSFET and said first terminal of said resistor;

a first nMOSFET having a source connected to the ground, a gate, and a drain connected to the gate of said first nMOSFET and said second terminal of said resistor;

a first comparator for inputting a first voltage at said second terminal of said capacitor and a second voltage at said first terminal of said resistor, and outputting a first logic which has one logic state when said first voltage is equal to or greater than said second voltage and the other logic state when said second voltage is greater than said first voltage;

a second comparator for inputting said first voltage at said second terminal of said capacitor and a third voltage at said second terminal of said resistor, and outputting a second logic according to relationship of largeness or smallness between said first and third voltages;

a second pMOSFET having a source, a gate connected to said gate of said first pMOSFET, and a drain;

a second nMOSFET having a source, a gate connected to said gate of said first nMOSFET, and a drain; and a sequential logic circuitry for inputting said first and second logics and outputting a third logic, wherein a drain current of said second pMOSFET flows to the second terminal of the capacitor in one logic state of said third logic and a drain current of said second nMOSFET flows to the second terminal of the capacitor in the other state of said third logic.

20. The oscillator circuit according to claim 19, wherein:

said capacitor includes a MOS capacitor, and said capacitor is made of first and second conductive layers and an insulator formed therebetween, and said resistor includes one of a diffusion layer and a conductive layer.

21. An oscillator circuit comprising:

a first resistor having a first terminal connected to a power supply voltage terminal and a second terminal;

a second resistor having a first terminal connected to said second terminal of said first resistor and a second terminal;

a third resistor having a first terminal connected to said second terminal of said second resistor and a second terminal connected to a ground;

a fourth resistor having a first and second terminals;

a capacitor having a first terminal connected to one of said power supply voltage terminal and the ground, and a second terminal connected to said second terminal of said fourth resistor;

a first comparator for inputting a first voltage at said second terminal of said first resistor and a second voltage at said second terminal of said capacitor, and outputting a first logic which has one logic state when said first voltage is equal to or greater than said second voltage and the other logic state when said second voltage is greater than said first voltage;

a second comparator for inputting a third voltage at said first terminal of said third resistor and said second voltage, and outputting a second logic according to a relative voltage magnitude relationship, of largeness or smallness, between said second and third voltages; and a sequential logic circuitry for inputting said first and second logic and outputting a third logic, wherein said first terminal of said fourth resistor is connected to the power supply voltage terminal in one logic state of said third logic, and said first terminal of said fourth resistor is connected to the ground in the other logic state of said third logic.

22. The oscillator circuit according to claim 21, wherein said capacitor includes a MOS capacitor, and said capacitor is made of first and second conductive layers and an insulator formed therebetween, and each of said first to fourth resistors includes one of a diffusion layer and a conductive material.

23. An oscillator circuit comprising:

a first capacitor having a first terminal connected to one of a power supply voltage terminal and a ground, and a second terminal;

a second capacitor having a first terminal connected to one of the power supply voltage terminal and the ground, and a second terminal;

a resistor having a first terminal and a second terminal connected to the ground;

a first pMOSFET having a source connected to the power supply voltage terminal, a gate, and a drain connected to the gate of said first pMOSFET and said first terminal of said resistor;

a second pMOSFET having a source, a gate connected to said gate of said first pMOSFET, and a drain;

a third pMOSFET having a source, a gate connected to said gate of said first pMOSFET, and a drain;

a first comparator for inputting a first voltage at said second terminal of said first capacitor and a second voltage at said first terminal of said resistor, and outputting a first logic which has one logic state when said first voltage is equal to or greater than said second voltage and the other logic state when said second voltage is greater than said first voltage;

a second comparator for inputting a third voltage at said second terminal of said second capacitor and said second voltage at said first terminal of said resistor, and outputting a second logic according to a relative voltage magnitude relationship, of largeness or smallness, between said second and third voltages; and a sequential logic circuitry for inputting said first and second logic and outputting a third logic, wherein said drain of said second pMOSFET is connected to said second termininal of said first capacitor, said second terminal of said second capacitor is connected to the ground in one logic state of said third logic, and said drain of said third pMOSFT is connected to said second terminal of said second capacitor, and said second terminal of said first capacitor is connected to the ground in the other logic state of said third logic.

24. The oscillator circuit according to claim 23, wherein:

said first and second capacitors include MOS capacitors, and each of said first and second capacitors is made of first and second conductive layers and an insulator formed therebetween; and said resistor includes one of a diffusion layer and a conductive material.

25. An oscillator circuit comprising:

a first capacitor having a first terminal connected to one of a power supply voltage terminal and a ground, and a second terminal;

a second capacitor having a first terminal connected to one of the power supply voltage terminal and the ground, and a second termninal;

a resistor having a first terminal and a second terminal connected to the power supply voltage terminal;

a first nMOSFET having a source connected to a ground, a gate, and a drain connected to the gate of said first nMOSFET an d said first terminal of said resistor;

a second nMOSFET having a source, a gate connected to said gate of said first nMOSFET, and a drain;

a third nMOSFET having a source, a gate connected to said gate of said first nMOSFET, and a drain;

a first comparator for inputting a first voltage at said second terminal of said first capacitor and a second voltage at said first terminal of said resistor, and outputting a first logic which has one logic state when said first voltage is equal to or greater than said second voltage and the other logic state when said second voltage is greater than said first voltage;

a second comparator for inputting a third voltage at said second terminal of said second capacitor and said second voltage at said first terminal of said resistor, and outputting a second logic according to a relative voltage magnitude relationship, of largeness or smallness, between said second and third voltages; and a sequential logic circuitry for inputting said first and second logic and outputting a third logic, wherein said drain of said second nMOSFET is connected to said second terminal of said first capacitor, said second terminal of said second capacitor is connected to the power supply voltage terminal in one logic state of said third logic, and said drain of said third nMOSFET is connected to said second terminal of said second capacitor, said second terminal of said first capacitor is connected to the power supply voltage terminal in the other logic state of said third logic.

26. The oscillator circuit according to claim 25, wherein:

said first and second capacitors include MOS capacitors, and each of said first and second capacitors is made of first and second conductive layers and an insulator formed therebetween; and said resistor includes one of a diffusion layer and a conductive material.

27. An oscillator circuit comprising:

a first resistor having a first terminal connected to a power supply voltage terminal and a second terminal;

a second resistor having a first terminal connected to said second terminal of said first resistor and a second terminal connected to a ground;

a third resistor having a first and second terminals;

a fourth resistor having a first and second terminals;

a first capacitor having a first terminal connected to one of the power supply voltage terminal and a ground and a second terminal;

a second capacitor having a first terminal connected to one of the power supply voltage terminal and a ground and a second terminal;

a first comparator for inputting a first voltage at said second terminal of said first capacitor and a second voltage at said second terminal of said first resistor, and outputting a first logic which has one logic state when said first voltage is equal to or greater than said second voltage and the other logic state when said second voltage is greater than said first voltage;

a second comparator for inputting a third voltage at said second terminal of said second capacitor and said second voltage at said second terminal of said first resistor, and outputting a second logic according to a relative voltage magnitude relationship, of largeness or smallness, between said second and third voltages; and a sequential logic circuitry for inputting said first and second logic and outputting a third logic, wherein said first and second terminals of said third resistor are respectively connected to the power supply voltage terminal and said second terminal of said first capacitor, said second terminal of said second capacitor is connected to a ground in one logic state of said third logic, and said first and second terminals of said fourth resistor are respectively connected to the power supply voltage terminal and said second terminal of said second capacitor, and said second terminal of said first capacitor is connected to a ground in the other logic state of said third logic.

28. The oscillator circuit according to claim 27, wherein:

said first and second capacitors include MOS capacitors, and each of first and second capacitors is made of first and second conductive layers and an insulator formed therebetween; and each of said first to fourth resistors includes one of a diffusion layer and a conductive material.

29. An oscillator circuit comprising:

a first resistor having a first terminal connected to a power supply voltage terminal and a second terminal;

a second resistor having a first terminal connected to said second terminal of said first resistor and a second terminal connected to a ground;

a third resistor having a first and second terminals;

a fourth resistor having a first and second terminals;

a first capacitor having a first terminal connected to one of the power supply voltage terminal and a ground and a second terminal;

a second capacitor having a first terminal connected to one of the power supply voltage terminal and a ground and a second terminal;

a first comparator for inputting a first voltage at said second terminal of said first capacitor and a second voltage at said second terminal of said first resistor, and outputting a first logic which has one logic state when said first voltage is equal to or greater than said second voltage and the other logic state when said second voltage is greater than said first voltage;

a second comparator for inputting a third voltage at said second terminal of said second capacitor and said second voltage at said second terminal of said first resistor, and outputting a second logic according to a relative voltage magnitude relationship, of largeness or smallness, between said second and third voltages; and a sequential logic circuitry for inputting said first and second logic and outputting a third logic, wherein said first and second terminals of said third resistor are respectively connected to a ground and said second terminal of said first capacitor, said second terminal of said second capacitor is connected to the power supply voltage terminal in one logic state of said third logic, and said first and second terminals of said fourth resistor are respectively connected to a ground and said second terminal of said second capacitor, said second terminal of said first capacitor is connected to the power supply voltage terminal in the other logic state of said third logic.

30. The oscillator circuit according to claim 29, wherein:

said first and second capacitors include one of MOS capacitors, and each of said first and second capacitors is made of first and second conductive layers and an insulator formed therebetween; and each of said first to fourth resistors includes one of a diffusion layer and a conductive material.

31. A semiconductor memory device comprising:

a memory cell array for storing data;

an oscillating device for outputting at least one oscillating clock; and a charge pump circuit for inputting said oscillating clock and outputting a predetermined voltage higher than a power supply voltage, said predetermined voltage being applied to memory cells to rewrite data stored in said memory cells, wherein said oscillating device includes:

a delay circuit comprising a current generating circuit for generating a current;

a capacitor having a first terminal connected to said current generating circuit when an input signal of the delay circuit is kept in one logic state and to a terminal whose voltage is a first voltage when the input signal of the delay circuit is kept in the other logic state, and a second terminal connected to one of a power supply voltage terminal and ground;

a reference voltage generating circuit for generating a reference voltage; and a comparator for inputting a capacitor voltage at said first terminal of said capacitor and said reference voltage, and outputting a logic in accordance with relationship of largeness or smallness between said capacitor voltage and said reference voltage, and the variation rate of said current due to a power supply voltage variation is less than that of the difference voltage between said first voltage and said reference voltage due to said power supply voltage variation.

32. The semiconductor memory device according to claim 31, wherein said capacitor includes a MOS capacitor, and said capacitor is made of first and second conductive layers and an insulator formed therebetween.

33. A semiconductor memory device comprising:

a memory cell array for storing data;

an oscillating device for outputting at least one oscillating clock;

a reference voltage generating circuit for generating a reference voltage; and a charge pump circuit for inputting said oscillating clock and outputting a predetermined voltage higher than a power supply voltage, said predetermined voltage being applied to memory cells to rewrite data stored in said memory cells, wherein said oscillating device includes:

a first delay circuit comprising a first current generating circuit for generating a first current, a first capacitor having a first terminal connected to said first current generating circuit when a first input signal of the first delay circuit is kept in one logic state and to a terminal whose voltage is a first voltage when the first input signal of the first delay circuit is kept in the other logic state and a second terminal connected to a power supply voltage terminal or ground and a first comparator for inputting a first capacitor voltage at said first terminal of said first capacitor and said reference voltage, and outputting a first logic in accordance with relationship of largeness or smallness between said first capacitor voltage and said reference voltage;

a second delay circuit comprising a second current generating circuit for generating a second current, a second capacitor having a first terminal connected to said second current generating circuit when a second input signal of the second delay circuit is kept in one logic state and to a terminal whose voltage is a second voltage when the second input signal of the second delay circuit is kept in the other logic state and a second terminal connected to the power supply voltage terminal or ground, and a second comparator for inputting a second capacitor voltage at said first terminal of said second capacitor and said reference voltage, and outputting a second logic in accordance with relationship of largeness or smallness between said second capacitor voltage and said reference voltage; and a sequential logic circuitry for inputting said first and second logic and outputting one of said first and second logic or inverted signals of said first and second logic, and wherein the variation rate of said first current due to a power supply voltage variation is less than that of the difference voltage between said first voltage and said reference voltage due to said power supply voltage variation, and the variation rate of said second current due to a power supply voltage variation is less than that of the difference voltage between said second voltage and said reference voltage due to said power supply voltage variation.

34. The semiconductor memory device according to claim 33, wherein said first and second capacitors include a MOS capacitor and each of said first and second capacitors is made of first and second conductive layers and an insulator formed therebetween.

35. A semiconductor memory device comprising:

a first capacitor having a first terminal connected to a power supply voltage terminal or ground, and a second terminal;

a second capacitor having a first terminal connected to said power supply voltage terminal or ground, and a second terminal;

a resistor having a first and second terminals;

a first pMOSFET having a source connected to said power supply voltage terminal, a gate, and a drain connected in series with said resistor;

a second pMOSFET having a source, a gate connected to said gate of said first pMOSFET, and a drain;

a third pMOSFET having a source, a gate connected to said gate of said first pMOSFET, and a drain;

a reference voltage generating circuit for generating a reference voltage;

a first comparator for inputting a first capacitor voltage at said second terminal of said first capacitor and said reference voltage, and outputting a first logic according to relationship of largeness or smallness between said first capacitor voltage and reference voltage;

a second comparator for inputting a second capacitor voltage at said second terminal of said second capacitor and said reference voltage, and outputting a second logic according to relationship of largeness or smallness between said second capacitor voltage and reference voltage; and a sequential, logic circuitry for inputting said first and second logic and outputting a third logic, wherein said drain of said second pMOSFET is connected to said second terminal of said first capacitor, said second terminal of said second capacitor is connected to a terminal whose voltage is a first voltage in one logic state of said third logic, and said drain of said third pMOSFET is connected to said second terminal of said second capacitor, said second terminal of said first capacitor is connected to a terminal whose voltage is a second voltage in the other logic state of said third logic, and the variation rate of a current flowing through said resistor due to a power supply voltage variation is less than that of the difference voltage between one of said first and second voltages and said reference voltage due to said power supply voltage variation.

36. The semiconductor memory device according to claim 35, wherein:

said first and second capacitors include MOS capacitors and each of said first and second capacitors is made of first and second conductive layers and an insulator formed therebetween, and said resistor includes one of a diffusion layer and a conductive material.

37. The semiconductor memory device according to claim 35, wherein each of said first and second voltages is a voltage at a ground.

38. A semiconductor memory device comprising:
a first capacitor having a first terminal connected to a power supply voltage terminal or ground, and a second terminal;
a second capacitor having a first terminal connected to the power supply voltage terminal or ground, and a second terminal;
a resistor having a first and second terminals;
a first nMOSFET having a source connected to a ground, a gate, and a drain connected in series with said resistor;
a second nMOSFET having a source, a gate connected to said gate of said first nMOSFET, and a drain;
a third nMOSFET having a source, a gate connected to said gate of said first nMSFET, and a drain;
a reference voltage generating circuit for generating a reference voltage;
a first comparator for inputting a first capacitor voltage at said second terminal of said first capacitor and said reference voltage, and outputting a first logic according to relationship of largeness or smallness between said first capacitor voltage and reference voltage;
a second comparator for inputting a second capacitor voltage at said second terminal of said second capacitor and said reference voltage, and outputting a second logic according to relationship of largeness or smallness between said second capacitor voltage and reference voltage; and
a sequential logic circuitry for inputting said first and second logic and outputting a third logic, and
wherein said drain of said second nMOSFET is connected to said second terminal of said first capacitor,
said second terminal of said second capacitor is connected to a terminal whose voltage is a first voltage in one logic state of said third logic, and
said drain of said third nMOSFET is connected to said second terminal of said second capacitor,
said second terminal of said first capacitor is connected to a terminal whose voltage is a second voltage in the other logic state of said third logic, and
the variation rate of a current flowing through said resistor due to a power supply voltage variation is less than that of the difference voltage between one of said first and second voltage and said reference voltage due to said power supply voltage variation.

39. The semiconductor memory device according to claim 38, wherein:
said first and second capacitors include a MOS capacitor and each of first and second capacitors is made of first and second conductive layers and an insulator formed therebetween; and
said resistor includes one of a diffusion layer and a conductive material.

40. The semiconductor memory device according to claim 38, wherein each of said first and second voltages is a power supply voltage.

41. A semiconductor memory device comprising
a memory cell array for storing data;
an oscillating device for outputting at least one oscillating clock; and
a charge pump circuit for inputting said oscillating clock and outputting a predetermined voltage higher than a power supply voltage, said predetermined voltage being applied to memory cells to rewrite data stored in said memory cells,
wherein said oscillating device comprises:
a reference voltage generating circuit for generating a reference voltage;
a first resistor having a first and second terminals;
a second resistor having a first and second terminals;
a first capacitor having a first terminal connected to one of a power supply voltage terminal and a ground and a second terminal;
a second capacitor having a first terminal connected to one of the power supply voltage terminal and ground and a second terminal;
a first comparator for inputting a first capacitor voltage at said second terminal of said first capacitor and said reference voltage, and outputting a first logic according to relationship of largeness or smallness between said first capacitor voltage and reference voltage;
a second comparator for inputting a second capacitor voltage at said second terminal of said second capacitor and said reference voltage, and outputting a second logic according to relationship of largeness or smallness between said second capacitor voltage and reference voltage; and
a sequential logic circuitry for inputting said first and second logic outputting a third logic, and
wherein said first and second terminals of said first resistor are respectively connected to a first voltage terminal and said second terminal of said first capacitor,
said second terminal of said second capacitor is connected to a second voltage terminal in one logic state of said third logic, and
said first and second terminals of said second resistor are respectively connected to said first voltage terminal and said second terminal of said second capacitor,
said second terminal of said first capacitor is connected to said second voltage terminal in the other logic state of said third logic, and
the variation rate of the difference voltage between said reference voltage and a voltage at said second voltage terminal due to a power supply voltage variation is less than that of the difference voltage between a voltage at said first voltage terminal and said voltage at said second voltage terminal due to said power supply voltage variation.

42. The semiconductor memory device according to claim 41, wherein:
said first and second capacitors include MOS capacitors and each of first and second capacitors is made of first and second conductive layers and an insulator formed therebetween, and
each of said first and second resistors includes one of a diffusion layer and a conductive material.

* * * * *